(12) United States Patent
Oike

(10) Patent No.: US 8,934,036 B2
(45) Date of Patent: *Jan. 13, 2015

(54) SOLID STATE IMAGING DEVICE, DRIVING METHOD OF THE SOLID STATE IMAGING DEVICE AND ELECTRONIC EQUIPMENT

(71) Applicant: Sony Corporation, Tokyo (JP)

(72) Inventor: Yusuke Oike, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/027,708

(22) Filed: Sep. 16, 2013

(65) Prior Publication Data

US 2014/0015012 A1 Jan. 16, 2014

Related U.S. Application Data

(63) Continuation of application No. 13/603,633, filed on Sep. 5, 2012, now Pat. No. 8,570,410, which is a continuation of application No. 12/411,954, filed on Mar. 26, 2009, now Pat. No. 8,284,282.

(30) Foreign Application Priority Data

Apr. 3, 2008 (JP) ................................. 2008-096884
Mar. 25, 2009 (JP) ................................. 2009-075169

(51) Int. Cl.

| H04N 3/14 | (2006.01) |
|---|---|
| H01L 27/148 | (2006.01) |
| H01L 27/146 | (2006.01) |
| H04N 5/335 | (2011.01) |
| H04N 5/365 | (2011.01) |

(52) U.S. Cl.

CPC ........ *H01L 27/148* (2013.01); *H01L 27/14609* (2013.01); *H04N 3/155* (2013.01); *H04N 3/1568* (2013.01); *H04N 5/335* (2013.01); *H04N 5/3651* (2013.01); *H01L 27/14643* (2013.01); *H01L 27/14654* (2013.01)
USPC ........................................................ 348/294

(58) Field of Classification Search

CPC ............... C12Q 1/6837; C12Q 1/6886; C12Q 2600/112; H01L 27/14609; H01L 27/14643; H01L 27/14654; H01L 27/148; H04N 3/155; H04N 3/1568; H04N 5/335; H04N 5/3651
USPC .......... 348/222, 241, 248, 294, 308–311, 314
See application file for complete search history.

(56) References Cited

U.S. PATENT DOCUMENTS

| 5,867,212 A | 2/1999 | Toma et al. |
|---|---|---|
| 7,920,193 B2 | 4/2011 | Ladd et al. |

(Continued)

FOREIGN PATENT DOCUMENTS

EP     0 809 303     11/1997

(Continued)

OTHER PUBLICATIONS

Japanese Office Action in reference to Japanese counterpart JP Application No. JP 2009-075169 dated Mar. 5, 2013.

*Primary Examiner* — Scott J Sugarman
*Assistant Examiner* — Vipin Patel
(74) *Attorney, Agent, or Firm* — Dentons US LLP

(57) ABSTRACT

A solid state imaging device including multiple unit pixels including a photoelectric converter generating electrical charge in accordance with incident light quantity and accumulating the charge, a first transfer gate transferring the accumulated charge, a charge holding region holding the transferred charge, a second transfer gate transferring the held charge, and a floating diffusion region converting the transferred charge into voltage; an intermediate charge transfer unit transferring, to the charge holding region, a charge exceeding a predetermined charge amount as a first signal charge; and a pixel driving unit setting the first transfer gate to a non-conducting state, set the second transfer gate to a conducting state, transfer the first signal charge to the floating diffusion region, set the second transfer gate to a non-conducting state, set the first transfer gate to a conducting state, and transfer the accumulated charge to the charge holding region as a second signal charge.

6 Claims, 41 Drawing Sheets

(56) References Cited

U.S. PATENT DOCUMENTS

| | | |
|---|---|---|
| 2005/0110093 A1 | 5/2005 | Altice et al. |
| 2006/0044437 A1 | 3/2006 | Shah |
| 2006/0102938 A1 | 5/2006 | Park |
| 2006/0219868 A1 | 10/2006 | Morimoto et al. |
| 2006/0266922 A1 | 11/2006 | McGrath et al. |
| 2006/0284054 A1 | 12/2006 | Asaba |
| 2007/0235827 A1 | 10/2007 | Altice |
| 2008/0135896 A1 | 6/2008 | Fan |

FOREIGN PATENT DOCUMENTS

| | | |
|---|---|---|
| EP | 1 589 583 | 10/2005 |
| EP | 2 037 672 | 3/2009 |
| EP | 2 102 910 | 9/2009 |
| GB | 2 270 228 | 3/1994 |
| JP | 04-268764 | 9/1992 |
| JP | 2000-059688 | 2/2000 |
| JP | 2000-165754 | 6/2000 |
| JP | 2004-111590 | 4/2004 |
| JP | 2004-335882 | 11/2004 |
| JP | 2006-197382 | 7/2006 |
| JP | 2006-217421 | 8/2006 |
| JP | 2006-311515 | 11/2006 |
| JP | 2007-503722 | 2/2007 |
| JP | 2007-151069 | 6/2007 |
| JP | 2007-335978 | 12/2007 |
| WO | 2007/142171 | 12/2007 |

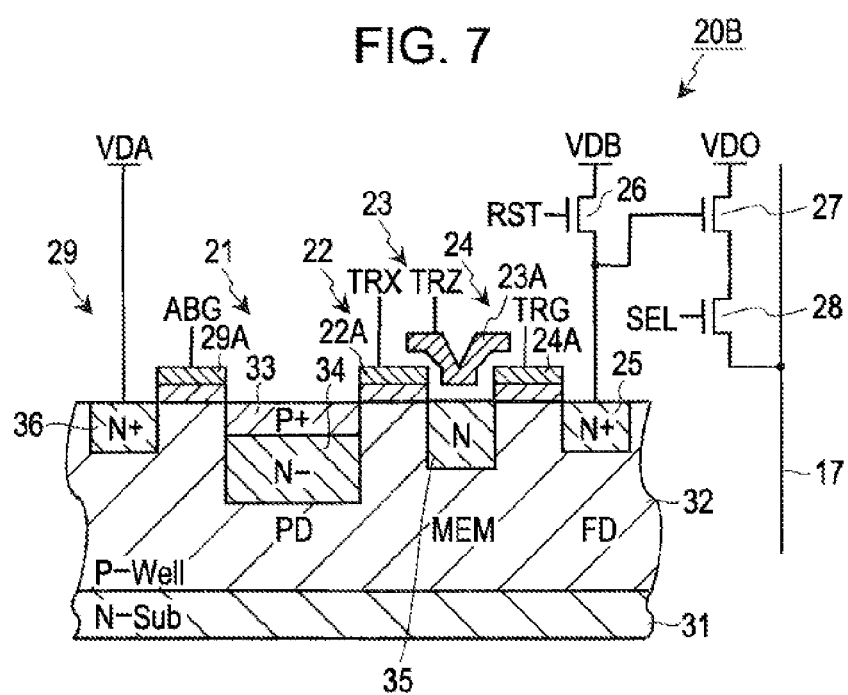
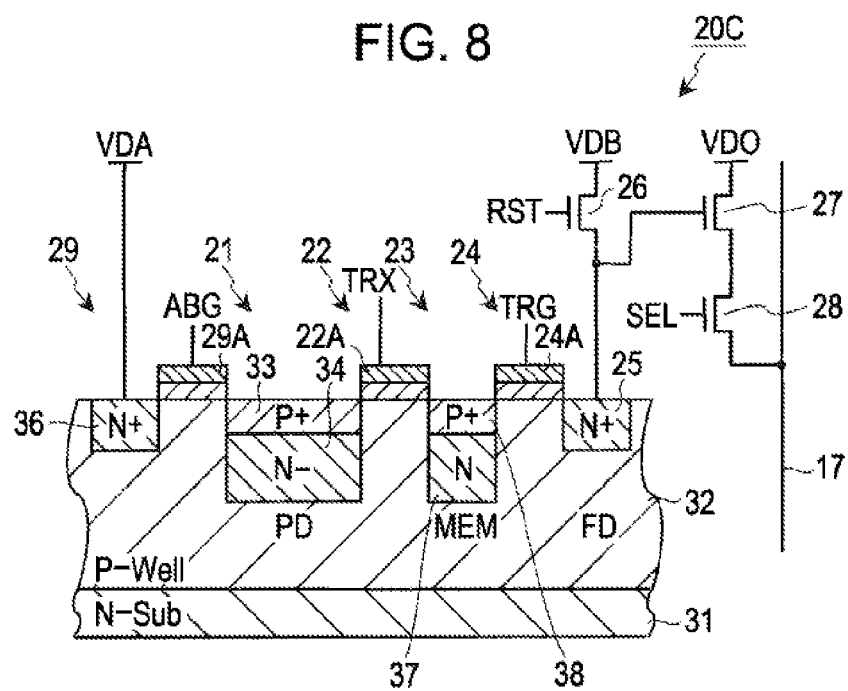

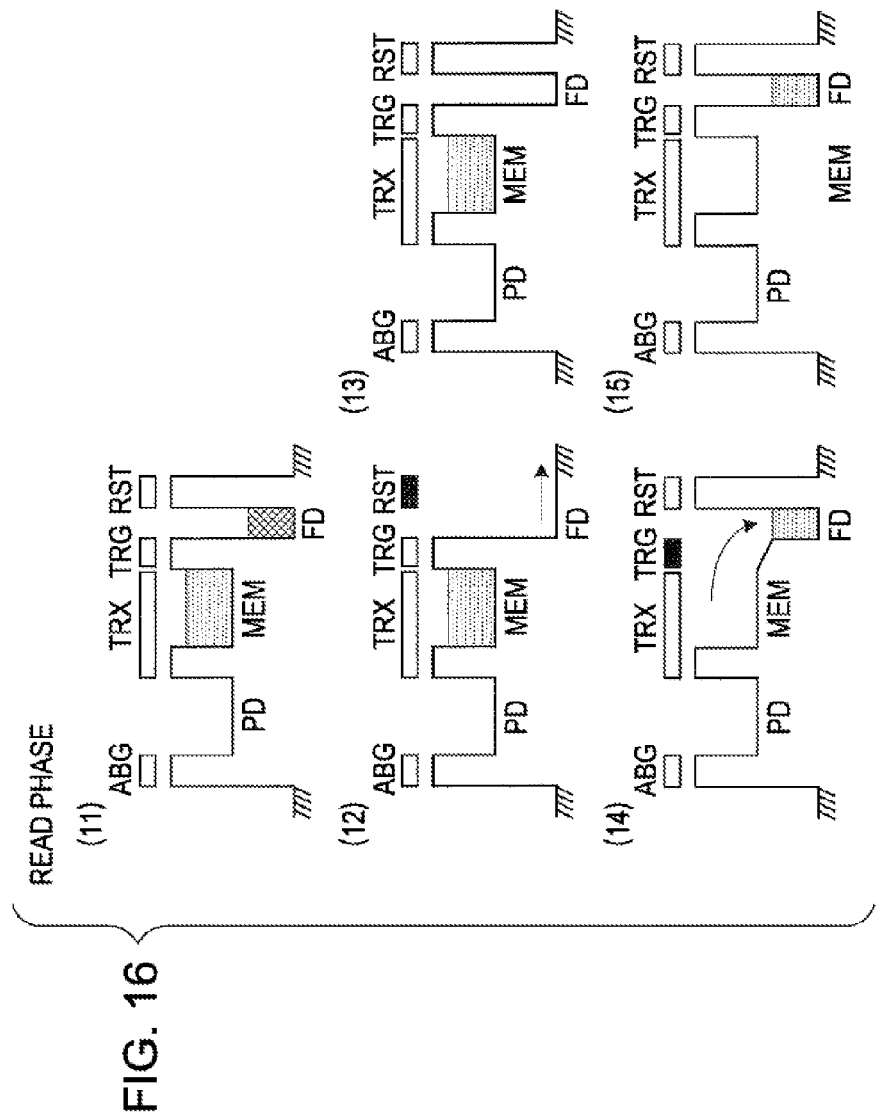

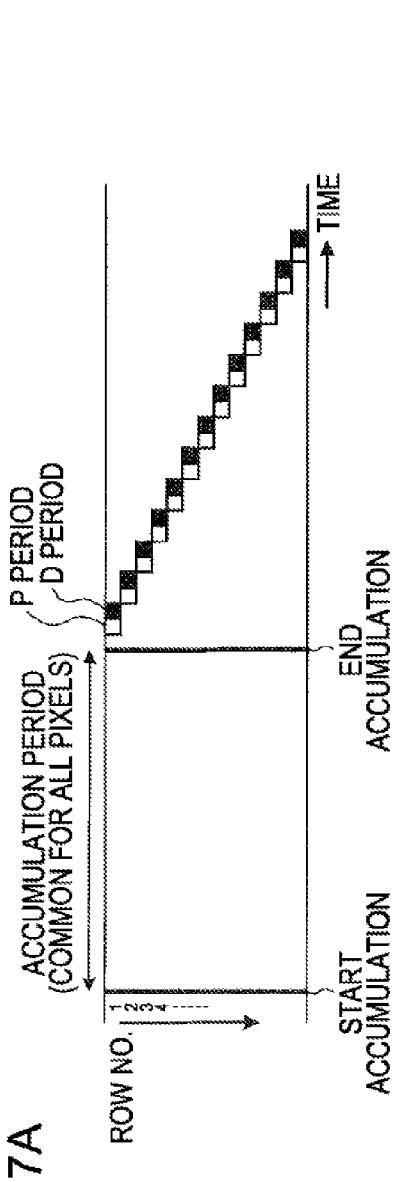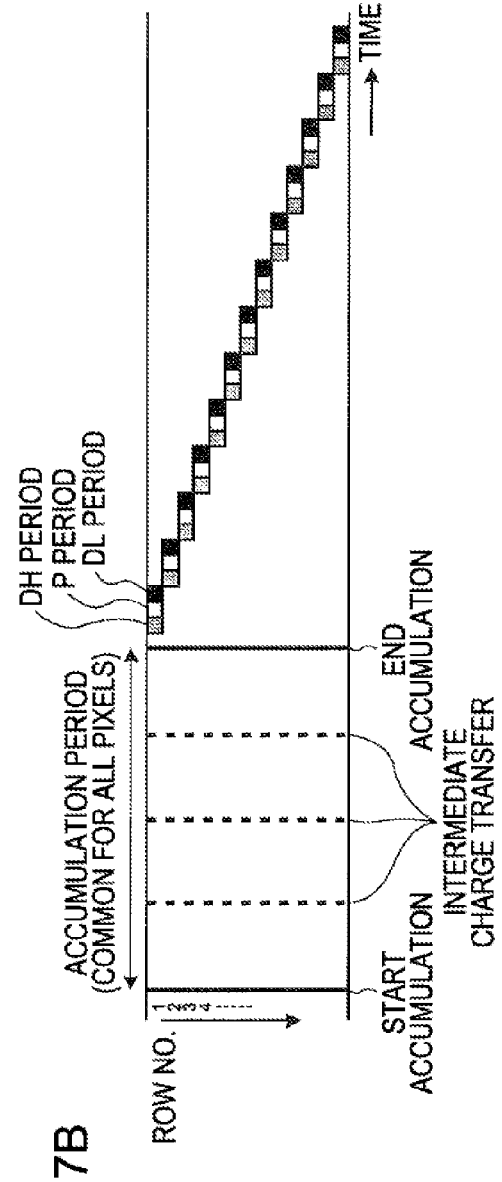
FIG. 17A
FIG. 17B

PD ACCUMULATION CHARGE

MEM ACCUMULATION CHARGE L1

MEM ACCUMULATION CHARGE L2

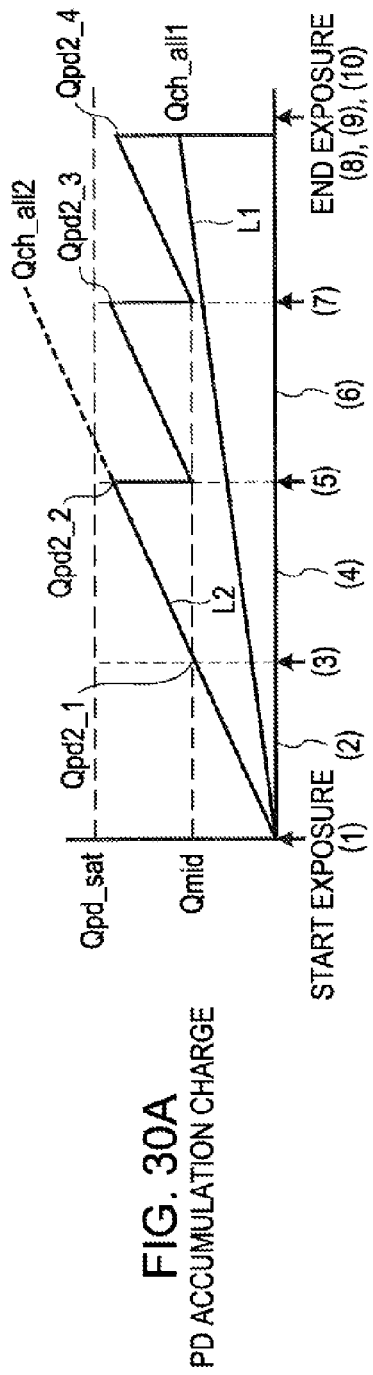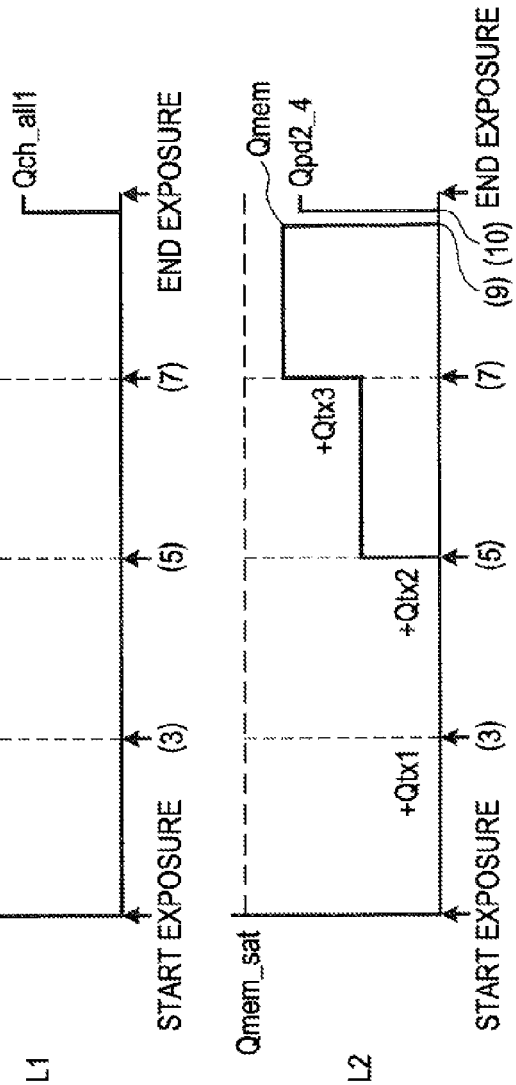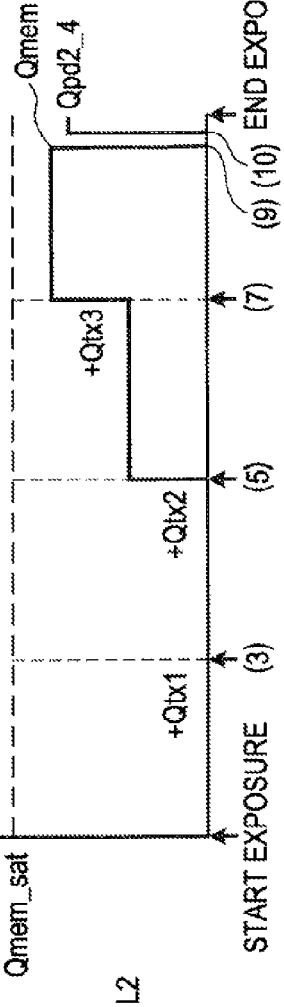
FIG. 30A
PD ACCUMULATION CHARGE
FIG. 30B
MEM ACCUMULATION CHARGE L1
FIG. 30C
MEM ACCUMULATION CHARGE L2

Qmem READOUT IN DH PERIOD

Qpd READOUT IN DL PERIOD

OUTPUT FROM Qpd + Qmem

OUTPUT WITH NORMAL GLOBAL EXPOSURE

Qmem READOUT IN DH PERIOD

Qpd READOUT IN DL PERIOD

OUTPUT FROM Qpd + Qmem

SOLID STATE IMAGING DEVICE, DRIVING METHOD OF THE SOLID STATE IMAGING DEVICE AND ELECTRONIC EQUIPMENT

RELATED APPLICATION DATA

This application is a continuation of U.S. patent application Ser. No. 13/603,633, filed Sep. 5, 2012, which is a continuation of U.S. patent application Ser. No. 12/411,954, filed Mar. 26, 2009, the entireties of which are incorporated herein by reference to the extent permitted by law. The present application claims the benefit of priority to Japanese Patent Application No. JP 2008-096884 filed in the Japan Patent Office on Apr. 3, 2008, and Japanese Patent Application No. JP 2009-075169 filed Mar. 25, 2009, the entireties of which are incorporated by reference herein to the extent permitted by law.

BACKGROUND OF THE INVENTION

1. Field of the Invention

The present invention relates to a solid state imaging device, a driving method of the solid state imaging device, and electronic equipment.

2. Description of the Related Art

An example of a solid-state imaging device is a CMOS image sensor which reads out photo-generated charges accumulated in the p-n junction capacitance of photodiodes, which are photoelectric conversion devices, by way of MOS transistors. With such a CMOS image sensor, actions for reading out photo-generated charges accumulated in photodiodes are executed for each pixel, each line, or the like. Accordingly, the exposure period for accumulating photo-generating charge does not match for all pixels, and distortion occurs in the image when the subject is moving, etc.

FIG. 38 illustrates a structural example of a unit pixel (hereinafter may be referred to simply as "pixel"). As shown in FIG. 38, the unit pixel 100 is of a configuration including, in addition to a photodiode 101, also a transfer gate 102, an n-type floating diffusion (FD) 103, a reset transistor 104, an amplifying transistor 105, and a selecting transistor 106.

With this unit pixel 100, the photodiode 101 is an embedded photodiode wherein a p-type layer 113 has been formed on a p-type well layer 112 formed on an n-type substrate 111 and an n-type embedded layer 114 embedded. The transfer gate 102 transfers charges accumulated at the p-n junction of the photodiode 101 to the floating diffusion 103.

Mechanical Shutter Method

One widely-used way of realizing global exposure, which is an arrangement wherein imaging is performed with all pixels exposed at the same exposure period, with the solid state device having the above-described unit pixel 100, is the mechanical shutter method which uses mechanical light shielding. Exposure is started for all pixels at the same time, and exposure is ended for all pixels at the same time, whereby global exposure is realized.

With the mechanical shutter method, the period during which light is input to the photodiode 101 and photo-generated charge is generated is the same for all pixels, due to mechanically controlling the exposure time. With this system, the mechanical shutter closes so substantially no more photo-generated charges are generated, and in this state signals are sequentially read out. However, reduction in size is difficult since a mechanical shielding mechanism is used, and also the mechanical shutter method is inferior to electrical methods with regard to simultaneity as well, due to limitation of the mechanical driving speed.

Global Exposure According to the Related Art

Operations for realizing imaging with the exposure period matched for all pixels and with no distortion using the unit pixel 100 shown in FIG. 38 will be described with reference to the operation explanatory diagram in FIG. 39 and the timing chart in FIG. 40.

First, a discharging operation for emptying the accumulated charges in the embedded photodiodes 101 of all pixels at the same time is executed, and exposure is started (1). Thus, a photo-generated charge is accumulated at the p-n junction of the photodiode 101 (2). At the point that the exposure period has ended, the transfer gate 102 is turned on for all pixels at the same time, so all of the accumulated charges are transferred to the floating diffusion (capacitance) 103 (3). Closing the transfer gate 102 holds the photo-generated charges accumulated over the same exposure period for all pixels in the respective floating diffusions 103. Subsequently, the signal levels are sequentially read out to a vertical signal line 200 (4), following which the floating diffusion 103 is reset (5), and after this the reset level is read out to the vertical signal line 200 (6).

After having read out the signal level and reset level to the vertical signal line 200, noise removal processing of the signal level is performed using the reset level, in downstream signal processing. With this noise removal processing, the reset level of the reset operation executed after reading out the signal level is read out, so kTC noise occurring in the reset operation is not removed, which can lead to image deterioration.

The kTC noise occurring in the reset operation is random noise generated by the switching operations of the reset transistor 104 at the time of the reset operation, so the signal level noise will not be precisely removed unless using the level before transfer of the charge to the floating diffusion 103. The charge is transferred to the floating diffusion 103 at the same time for all pixels, so the reset operation is performed again following reading out the signal level, and noise removal is performed. Accordingly, noise such as offset error and the like can be removed, but this is not the case with kTC noise.

Now, we will refer the readout period of the signal level as "D period", and the readout period of the reset level as "P period". There are many crystal flaws at the Si—SiO2 interface, and dark current readily occurs. In the event of holding that charge at the floating diffusion 103, there is difference which occurs in the dark current applied to the signal level, depending on the readout order. This also is not cancelable with noise removal using the reset level.

Pixel Structure Having Memory Unit

One proposal which has been made as a way to deal with the problem of the above-described kTC noise not being removable is a unit pixel 300 which has a memory unit (MEM) 107 separately from the floating diffusion 103 within the pixel (e.g., see Japanese Unexamined Patent Application Publication (Translation of PCT Application) No. 2007-502722 and Japanese Unexamined Patent Application Publication No. 2006-311515) as shown in FIG. 41. The memory unit 107 temporarily holds the photo-generated charge accumulated at the embedded photodiode 101. The unit pixel 300 further is provided with a transfer gate for transmitting the photo-generated charge accumulated at the photodiode 101 to the memory unit 107.

The operations for executing global exposure at the unit pixel 300 having the memory unit 107 will be described with reference to the operation explanatory diagram in FIG. 42.

First, a discharging operation is executed for all pixels at the same time, and exposure is started (1). A photo-generated charge is accumulated at the photodiode 101 (2). At the time of ending the exposure, the transfer gate 108 is driven for all pixels at the same time to transfer the photo-generated charge to the memory unit 107, where it is held (3). Following exposure, the reset level and signal level are read out in sequential operations.

First, the floating diffusion 103 is reset (4), and next the reset level is read out (5). Subsequently, the charge held at the memory unit 107 is transferred to the floating diffusion 103, and the signal level is read out (7). At this time, the reset noise included in the signal level matches the reset noise read out in the reset level readout, so noise reduction processing including the kTC noise as well can be performed.

As can be understood from the above description, a pixel structure having the memory unit 107 for temporarily holding the photo-generated charge accumulated at the embedded photodiode 101 can realize noise reduction processing including the kTC noise as well.

SUMMARY OF THE INVENTION

However, in the case of the pixel structure disclosed in Japanese Unexamined Patent Application Publication No. 2007-502722, when compared to a photoreceptor (photodiode) not having the memory unit 107, the area of the photoreceptor is reduced by an amount equivalent to that of the memory unit 107 if the pixel size is the same, so the saturation charge Qs_pd is lower. A lower saturation charge Qs_pd means a lower dynamic range. Even if global exposure is realized, reduction in the dynamic range, which is an important property of a camera set, will result in marked deterioration in photographed image quality.

On the other hand, the pixel structure described in Japanese Unexamined Patent Application Publication No. 2006-311515 prevents drop in dynamic range by widening by luminosity level which can be handled by way of logarithmic response. The details thereof are as follows.

In the pixel structure shown in FIG. 41, we will say that a voltage value which is conduced through the transistors is a first voltage value, a non-conducting voltage value is a second voltage value, and an intermediate voltage value is a third voltage value. At the time of performing an imaging operation at the photoelectric converter, the transfer gate 102 is in a conducting state, and the third voltage value is applied to the transfer gate 108. Accordingly, the transfer gate 108 operates at a sub-threshold region with regard to at least a partial luminosity range of the incident light to the embedded photodiode 101.

FIG. 43 illustrates the operating state of the above-described logarithmic response operation. As described above, in order to have a logarithmic response operation, the transfer gate 102 has to be in a conducting state, and further the reset transistor 104 also has to be in a conducting state, so as to form a path from the reset voltage VDB for the photocurrent Iph. FIG. 44 shows an equivalent circuit at the time of logarithmic response operation.

The photocurrent Iph proportionate to the incident light luminosity E flows to the transfer gate 108 to which the intermediate voltage (third voltage value) has been applied, so the transfer gate 108 operates at a sub-threshold region. Accordingly, the source/drain voltage Vdrop is $$V\text{drop} \propto \log(Iph)$$

as to the photocurrent Iph.

Consequently, the potential of the photodiode 101 is VDB−Vdrop. If we say that the potential of the photodiode 101 when there is no accumulation of photoelectric charge is VPD, the accumulated charge Q can be obtained by $$Q = Cpd \cdot \{VPD - (VDB - V\text{drop})\}$$

$$= Cpd \cdot \{VPD - (VDB - \alpha \cdot \log(Iph) + \beta)\}$$

where Cpd represents the parasitic capacitance of the photodiode 101, and $\alpha$ and $\beta$ are constants determined by the threshold of the transfer gate 108 and so forth.

That is to say, the accumulated charge Q is not accumulated proportionately to the incident light luminosity E; rather, a charge equivalent to a voltage value having a logarithmic relation remaining in the photodiode 101. FIG. 45 shows the relation between the incident light luminosity E and the pixel output. As can be clearly understood from FIG. 45, the response is linear up to the point of switching over to logarithmic response, and follows a logarithm function after exceeding a certain luminosity level E0.

Now, E0 is determined by the intermediate voltage (third voltage value) and the threshold value of the transfer gate 108. Accordingly, if there are irregularities in threshold values of the transfer gates 108, the switchover point E0 differs from one pixel to another as shown in FIG. 46, causing marked irregularity in the input/output properties of the pixels. This causes deterioration in image quality as fixed pattern noise. Also, the potential of the photodiode 101 is determined in the state with the current applied, leading to noise such as thermal noise.

There has been found demand to provide a solid state imaging device enabling reduction of noise owing to threshold irregularities in pixel transistors (transfer gates) among pixels with reduction in saturation charge amount suppressed, and to provide a driving method of the solid state imaging device and electronic equipment incorporating the solid state imaging device.

According to an embodiment of the present invention, a solid state imaging device includes: a plurality of unit pixels including a photoelectric converter configured to generate electrical charge in accordance with incident light quantity and accumulate the charge therein, a first transfer gate configured to transfer the charge accumulated in the photoelectric converter, a charge holding region configured to hold the charge transferred from the photoelectric converter by the first transfer gate, a second transfer gate configured to transfer the charge held in the charge holding region, and a floating diffusion region configured to hold the charge, transferred from the charge holding region by the second transfer gate, for being read out as a signal (convert into voltage); an intermediate charge transfer unit configured to transfer, to the charge holding region, a charge which exceeds a predetermined charge amount, generated at the photoelectric converter in an exposure period in which all of the plurality of unit pixels perform imaging operations at the same time, as a first signal charge; and a pixel driving unit configured to, in the exposure period in which all of the plurality of unit pixels perform imaging operations at the same time, set the first transfer gate to a non-conducting state, set the second transfer gate to a conducting state, transfer the first signal charge from the charge holding region to the floating diffusion region, set the second transfer gate to a non-conducting state, set the first transfer gate to a conducting state, and transfer the charge accumulated in the photoelectric converter to the charge holding region as a second signal charge; wherein the pixel driving unit reads out the first signal charge as a first output signal in increments of single pixels or increments of a plurality of pixels after the exposure period has ended, then resets the floating diffusion region and reads out the reset level of the floating diffusion region as a reset signal, then sets the second transfer gate to a conducting state and transfers the second signal charge to the floating diffusion region, and subsequently reads out the second signal charge as a second output signal.

The photo-generated charge generated by photoelectric conversion at the photoelectric converter is held in the photoelectric converter when the illuminance is low and the charge is at or below a predetermined charge. In the event that the illuminance is high and the charge exceeds the predetermined charge amount, the portion thereof which exceeds the predetermined charge amount is transferred to the charge holding region as a first signal charge. Accordingly, the photo-generated charge generated by photoelectric conversion is divided and accumulated as a first signal charge in the charge holding region and a second signal charge in the photoelectric converter. Now, while irregularities in the threshold value of the first transfer gate which is a pixel transistor does affect the charge being accumulated in the charge holding region, there is no effect on the final unit pixel input/output properties. For example, let us say that that the entire charge amount at a certain pixel is divided and accumulated as the first signal charge and second signal charge, while at another pixel there was no transfer to the first signal charge by $\Delta Q$th due to irregularities in threshold value. However, even in this case, the accumulation at the photoelectric converter is the second signal charge+$\Delta Q$th, which the accumulation at the charge holding region is the first signal charge−$\Delta Q$th. Here, the output of the unit pixel is the sum of the first signal charge and the second signal charge, so the deviation (increase/decrease) $\Delta Q$th of the accumulated charge due to irregularities in the threshold value of the first transfer gate is ultimately cancelled out. Consequently, noise due to irregularities in the threshold value of pixel transistors among the pixels can be reduced.

According to the above configuration, noise due to irregularities in the threshold value of pixel transistors among the pixels can be reduced, so image quality of imaged images can be improved.

BRIEF DESCRIPTION OF THE DRAWINGS

FIG. 7 is a diagram illustrating the configuration of a unit pixel according to a second structural example;

FIG. 8 is a diagram illustrating the configuration of a unit pixel according to a third structural example;

FIG. 16 is an operation explanatory diagram illustrating operations in the readout period;

FIGS. 17A and 17B are diagrams illustrating driving timing for global exposure, wherein FIG. 15A illustrates a case of normal global exposure, and FIG. 15B illustrates a case of global exposure according to the embodiment;

FIGS. 30A through 30C are diagrams illustrating charge accumulation in global exposure operations according to the embodiment;

DESCRIPTION OF THE PREFERRED EMBODIMENTS

The following is a detailed description of an embodiment according to the present invention, with reference to the drawings.

System Configuration

Figure 1:
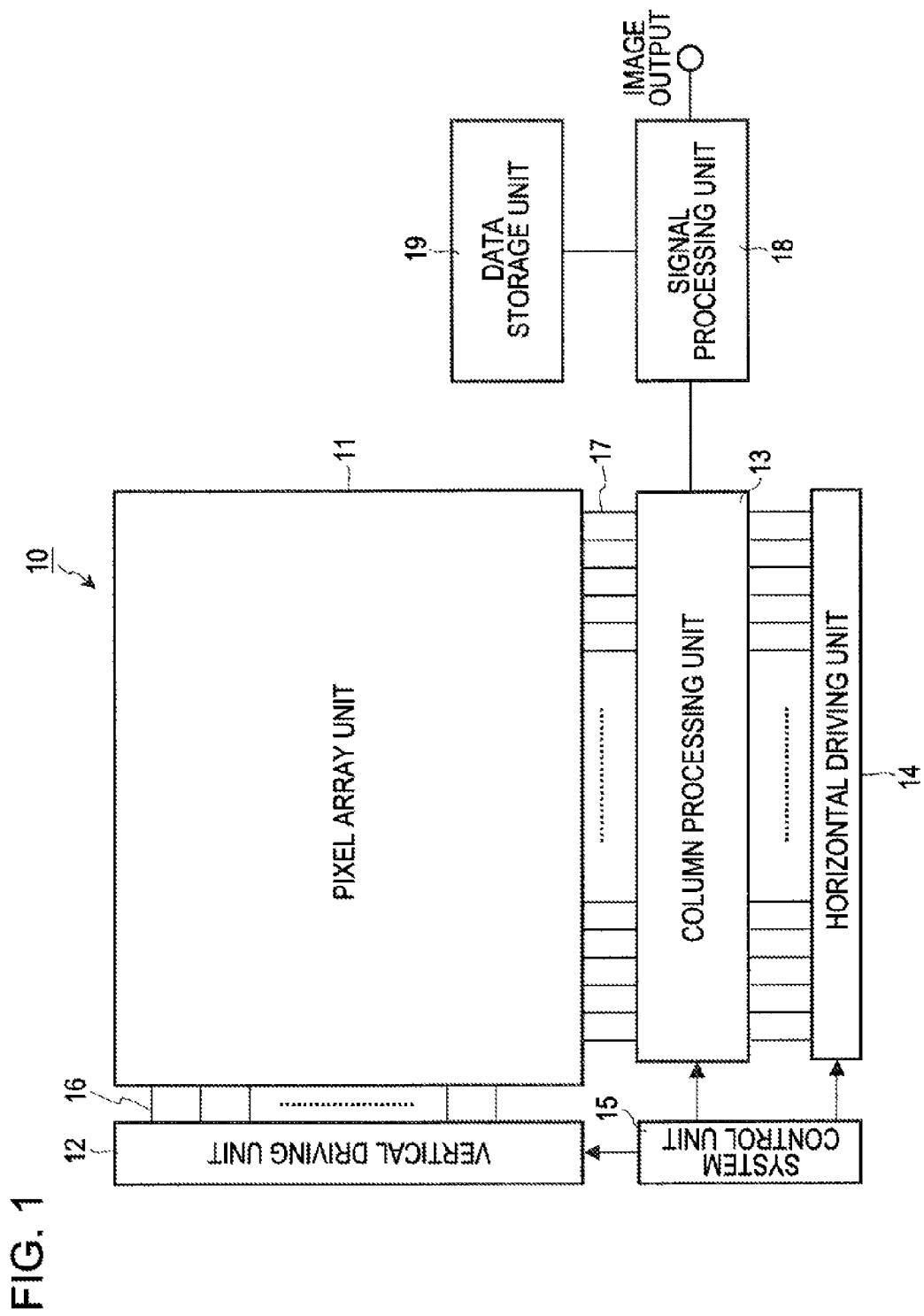
FIG. 1 is a system configuration diagram schematically illustrating the configuration of a CMOS image sensor to which an embodiment of the present invention is applied.

FIG. 1 is a system configuration diagram schematically illustrating the configuration of a solid-state imaging device to which an embodiment of the present invention is applied, such as a CMOS image sensor for example. As shown in FIG. 1, the CMOS image sensor 10 is of a configuration having a pixel array unit 11 formed on an unshown semiconductor substrate (chip), and peripheral circuit portions integrated on the same semiconductor substrate as the pixel array unit 11. The peripheral circuit portions include, for example, a vertical driving unit 12, a column processing unit 13, a horizontal driving unit 14, and a system control unit 15.

The CMOS image sensor 10 further has a signal processing unit 18 and a data storage unit 19. The signal processing unit 18 and data storage unit 19 may be realized by an external signal processing unit such as a DSP (Digital Signal Processor) provided on a substrate separate from the CMOS image sensor 10, or by software processing, and does not have to be mounted on the same substrate as the CMOS image sensor 10.

The pixel array unit 11 has unit pixels arrayed two-dimensionally in matrix form. The unit pixels have photoelectric converters which generate photo-generated charge (hereinafter may be referred to simply as "charge") of a charge amount corresponding to the amount of incident light, and accumulate the photo-generated charge internally. The specific configuration of unit pixels will be described later.

The pixel array unit 11 further has pixel driving lines 16 formed horizontally in the drawing (in the direction of array of pixel rows) for each row of the matrix-form pixel array, and vertical signal lines 17 formed vertically in the drawing (in the direction of array of pixel columns) for each column. While one pixel driving line 16 for each row is shown in FIG. 1, the arrangement is not restricted to one. The other end of the pixel driving lines 16 are connected to output terminals of the vertical driving unit 12 corresponding to each row.

The vertical driving unit 12 is configured of a shift register or address decoder or the like, and is a pixel driving unit for driving the pixels of the pixel array unit 11 either simultaneously for all pixels, or in increments of rows. The specific configuration of the vertical driving unit 12 will not be described here, but generally is of a configuration having the two systems of a readout scanning system and a sweep-out scanning system.

The readout scanning system selects and scans the unit pixels of the pixel array unit 11 in order of rows, to read out signals from the unit pixels. The sweep-out scanning system performs sweep-out scanning on the readout rows to be subjected to readout scanning by the readout scanning system, by a timing advanced as to the readout scanning by an amount of time equivalent to the shutter speed.

Due to the sweep-out scanning performed by the sweep-out scanning system, unnecessary charges are swept out from the photoelectric converters of the unit pixels of the readout row (i.e., reset). The sweeping out of the unnecessary charges (resetting) performed by the sweep-out scanning system realizes a so-called electronic shutter operation. Note that the term "electronic shutter operation" as used here refers to the operation of discarding the photo-generated charges in the photoelectric converters and starting a new exposure (starting accumulation of photo-generated charges).

Signals read out by the readout operation performed by the readout scanning system correspond to the amount of light input after the immediately previous readout operation or electronic shutter operation. The period between the readout timing at which the immediately previous readout operation was performed or the sweep-out timing at which the electronic shutter operation was performed, to the readout timing at which the readout operation is performed this time, is the accumulation time of photo-generated charges at the unit pixels (exposure time).

The signals output from each of the unit pixels in the pixel row selected and scanned by the vertical driving unit 12 are supplied to the column processing unit 13 via the vertical signal lines 17. The column processing unit 13 performs predetermined signal processing on signals output from each of the unit pixels of the selected row via the vertical signal lines 17, and temporarily holds the pixel signals after the signal processing, for each of the pixel rows of the pixel array unit 11.

Specifically, the column processing unit 13 performs at least noise removal processing, CDS (Correlated Double Sampling) processing for example, as signal processing. The fixed pattern noise unique to the pixels, such as reset noise, irregularities in the threshold values of amplifying transistors, and so forth, is removed by the CDS processing performed by the column processing unit 13. An arrangement may also be made where in the column processing unit 13 is further provided with an AD (analog/digital) conversion function, for example, in addition to the noise removal processing, so as to output the signal level in the form of digital signals.

The horizontal driving unit 14 is configured of a shift register or address decoder or the like, and selects unit pixels corresponding to the pixel columns of the column processing unit 13, in order. Due to the selection and scanning performed by the horizontal driving unit 14, pixel signals subjected to signal processing at the column processing unit 13 are output in order.

The system control unit 15 is configured of a timing generator or the like for generating various types of timing signals, and performs driving control of the vertical driving unit 12, column processing unit 13, horizontal driving unit 14, and so forth, based on the various types of timing signals generated at the timing generator.

The signal processing unit 18 has at least an adding processing function, and performs various types of signal processing, such as adding processing and so forth, on the pixel signals output from the column processing unit 13. The data storage unit 19 temporarily stores data used in the signal processing performed by the signal processing unit 18.

Structure of Unit Pixel

Next, description will be made regarding a specific structure of a unit pixel 20. The unit pixel 20 is of a structure having a charge holding region (hereafter described as "memory unit") for holding the photo-generated charge transferred from the photoelectric converter, separate from the floating diffusion (capacitance). First through third specific structural examples of the unit pixel 20 will now be described, with reference to FIGS. 2 through 7.

First Structural Example

Figure 2:
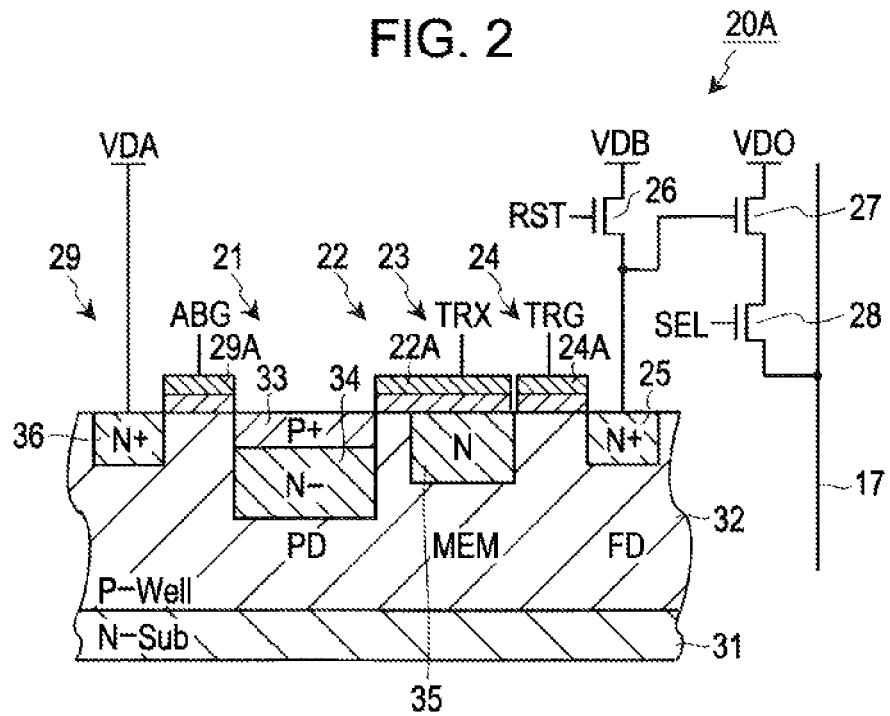
FIG. 2 is a diagram illustrating the configuration of a unit pixel according to a first structural example.

FIG. 2 is a diagram illustrating the configuration of a unit pixel 20A according to the first structural example. The unit pixel 20A according to the first structural example has a photodiode (PD) 21, for example, as a photoelectric converter. The photodiode 21 is an embedded photodiode formed by forming a p-type layer 33 on a p-type well layer 32 formed on an n-type substrate 31 and embedding an n-type embedded layer 34, for example.

The unit pixel 20A is of a configuration having a first transfer gate 22, memory unit (MEM) 23, second transfer gate 24, and floating diffusion (FD) region 25, in addition to the embedded photodiode 21. Note that the memory unit 23 and floating diffusion region 25 are shielded from light.

The first transfer gate 22 transfers charges subjected to photoelectric conversion at the embedded photodiode 21 and accumulated therein, by application of a transfer pulse TRX to a gate electrode 22A. The memory unit 23 is formed of an n-type embedded channel 35 formed below the gate electrode 22A, and accumulates charge transferred from the embedded photodiode 21 by the first transfer gate 22. Forming the memory unit 23 with the embedded channel 35 contributes to improved image quality, since occurrence of dark current at the Si—SiO2 interface can be suppressed.

The memory unit 23 can be modulated by disposing the gate electrode 22A above and applying the transfer pulse TRX to the gate electrode 22A. That is to say, applying the transfer pulse TRX to the gate electrode 22A makes for a deeper potential for the memory unit 23. Accordingly, the saturation charge amount of the memory unit 23 can be increased over a case with no modulation.

The second transfer gate 24 transfers the charge accumulated at the memory unit 23 due to a transfer pulse TRG being applied to a gate electrode 24A. The floating diffusion region 25 is an n-type charge-voltage converter, which converts charge transferred from the memory unit 23 by the second transfer gate 24 into voltage.

The unit pixel 20A further has a reset transistor 26, an amplifying transistor 27, and a selecting transistor 28. N-channel MOS transistors, for example, are used here as the transistors 26 through 28, but it should be noted that the combination of conductivity types of the reset transistor 26, amplifying transistor 27, and selecting transistor 28, illustrated here, is but one example, and that the invention is not restricted to combinations thereof.

The reset transistor 26 is connected between power source VDB and the floating diffusion region 25, and resets the floating diffusion region 25 by a reset pulse RST being applied to the gate electrode thereof. The amplifying transistor 27 has the drain electrode thereof connected to power source VDO, and the gate electrode connected to the floating diffusion region 25, so as to read out the voltage of the floating diffusion region 25.

The selecting transistor 28 has the drain electrode thereof connected to the source electrode of the amplifying transistor 27 and the source electrode thereof connected to the vertical signal line 17, for example, so as to select a unit pixel 20 regarding which the signal is to be ready, upon application of a selecting pulse SEL to the gate electrode thereof. Note that an arrangement may be made wherein the selecting transistor 28 is connected between the power source VDO and the drain electrode of the second transfer gate 24.

It should be noted the part or all of the transistors 26 through 28 may be omitted depending on the signal readout method, or may be shared among multiple pixels.

The unit pixel 20A further has a discharge portion 29 for discharging the accumulated charge in the embedded photodiode 21. The discharge portion 29 discharges the charge of the embedded photodiode 21 to a drain portion 36 upon a control pulse ABG being applied to a gate electrode 29A at the time of starting exposure. The discharge portion 29 further acts to prevent the embedded photodiode 21 from overflowing due to saturation during the readout period following exposure. A predetermined voltage VDA is applied to the drain portion 36.

Figure 3:
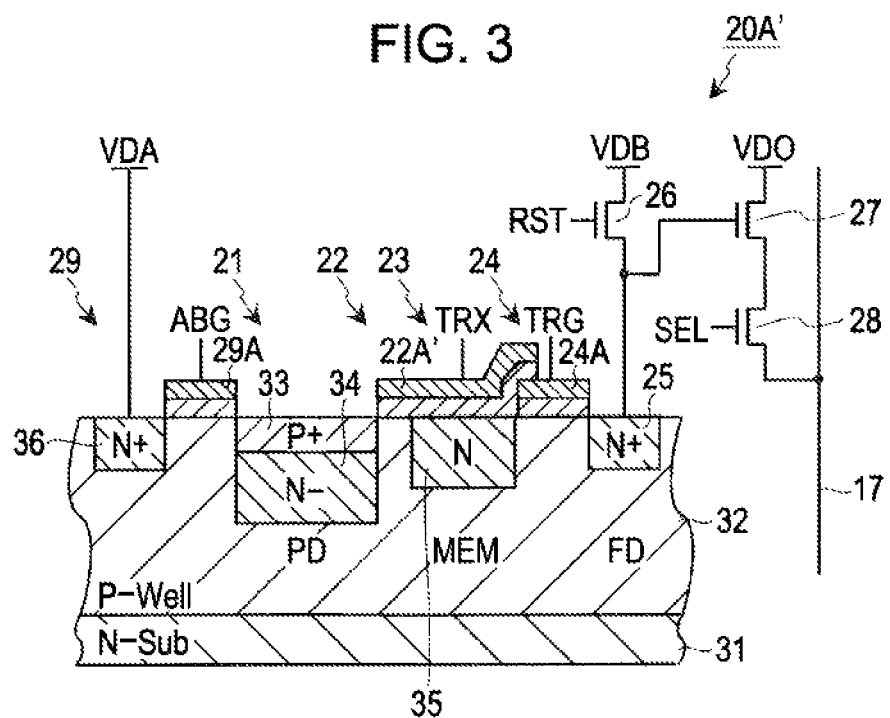
FIG. 3 is a diagram illustrating the configuration of a unit pixel according to a modification of the first structural example.

Note that with the unit pixel 20A according to the first structural example 1, a structure is employed wherein the gate electrode 22A of the first transfer gate 22 and memory unit 23 does not overlap the gate electrode 24A of the second transfer gate 24. On the other hand, an arrangement may be made as shown in FIG. 3, where a gate electrode 22A' partially overlaps the gate electrode 24A, as a unit pixel 20A' which is a modification of the first structural example.

Figure 4:
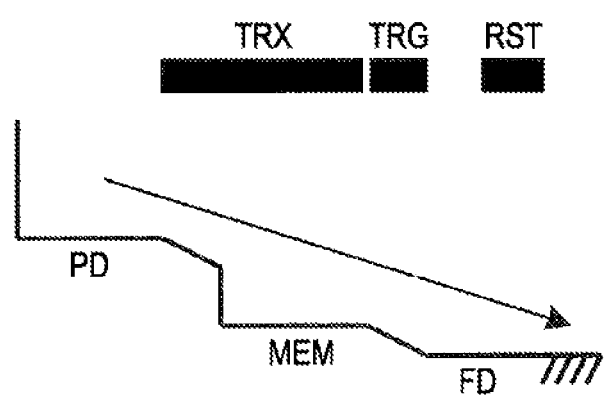
FIG. 4 is an operation explanatory diagram of a case wherein a discharging unit is not used.

Also, the first structural example employs a configuration wherein the discharge portion 29 is employed to discharge the accumulated charge of the embedded photodiode 21 and to prevent overflow of the charge at the embedded photodiode 21, but an arrangement may be made as shown in FIG. 4 wherein the transfer pulses TRX and TRS and the reset pulse RST are all in an active ("H" level in the present embodiment) state, thereby obtaining advantages equivalent to the discharge portion 29.

That is to say, having the first transfer gate 22, second transfer gate 24, and reset transistor 26 all in an on (conducting) state enables the charge of the embedded photodiode 21 to be discharged and also overflowing charge of the embedded photodiode 21 during the readout period to be shunted to the substrate side. This arrangement allows the discharge portion 29 to be omitted, which can contribute to reduced size of the unit pixel 20A.

Potential of Gate Electrode of Memory Unit 23

Now description will be made regarding the potential of the gate electrode of the memory unit 23, which is the potential of the gate electrode 22A of the first transfer gate 22 with this first structural example.

With the present embodiment, the potential of the gate electrode of the memory unit 23 serving as a charge holding region is set to a potential whereby at least one of the first transfer gate 22 and the second transfer gate 24, the first transfer gate 22 for example, is placed in a pinning state when in a non-conducting state. More specifically, at the time of placing one or both of the first transfer gate 22 and the second transfer gate 24 in a non-conducting state, the voltage applied to the gate electrodes 22A and 22B is set to a voltage such that a pinning state is realized where carriers can be accumulated at the Si face immediately below the gate electrode.

In the event that the transistor forming the transfer gate is an n-type transistor as with this example, at the time of placing the first transfer gate 22 in a non-conducting state, voltage is set such that the voltage applied to the gate electrode 22A is a more negative potential than the ground GND as to the p-type well layer 32. Though not shown in the drawings, in the event that the transistor forming the transfer gate is a p-type transistor, the p-type well layer becomes an n-type well layer, and a voltage higher than the power source voltage VDD is set as to this n-type well layer.

The reason for the voltage applied to the gate electrode 22A being set to a voltage such that a pinning state is realized where carriers can be accumulated at the Si face immediately below the gate electrode, at the time of placing the first transfer gate 22 in a non-conducting state, is as follows.

In the first structural example, if the potential of the gate electrode 22A of the first transfer gate 22 is set to the same potential as to the p-type well layer 32 (e.g., 0 V), there is the possibility that carriers generated from crystal flaws at the Si surface may be accumulated at the memory unit 23, which may become dark current and deteriorate image quality.

Accordingly, with the present embodiment, the OFF potential of the gate electrode 22A formed on the memory unit 23 is set to a negative potential, e.g., −2.0 V, as to the p-type well layer 32. Thus, with the present embodiment, holes are generated a the Si surface of the memory unit during the period of holding a charge, which can be recombined with the electrons generated at the Si surface, consequently allowing reduction in dark current.

Note that with the first structural example shown in FIG. 2, the gate electrode 24A of the second transfer gate 24 exists at the edge of the memory unit 23, so setting this gate electrode 24A to a negative potential as well enables dark current occurring at the edge of the memory unit 23 to be suppressed, in the same way.

Figure 5:
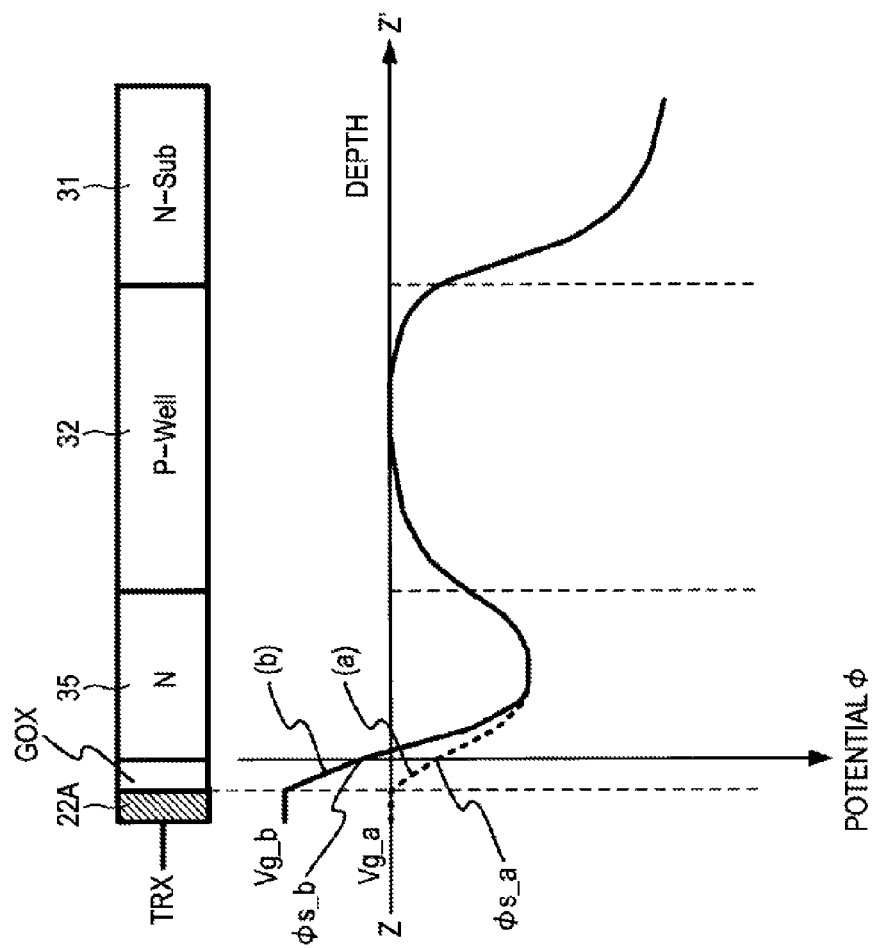
FIG. 5 is a potential diagram in the Z-Z' direction shown in FIG. 2.

FIG. 5 is a potential diagram in the Z-Z' direction illustrated in FIG. 5. As shown in FIG. 5, in the event that the transfer pulse TRX as to the gate electrode 22A is Vg_a, 0 V for example, the Si surface potential $\phi s$ is a positive value, and is depleted.

Accordingly, electrons generated due to crystal depletion at the Si surface flow forward toward lower potential, and are accumulated at the memory unit 23 which is an n-type impurity diffusion region. In the event that the transfer pulse TRX to the gate electrode 22A is Vg_b, sufficiently negative potential for example, the surface potential $\phi s\_b$ is a negative value, and holes are accumulated at the Si surface. Thus, electrodes generated at crystal flaws at the Si surface are recombined with accumulated holes, and are not accumulated at the memory unit 23.

Figure 6:
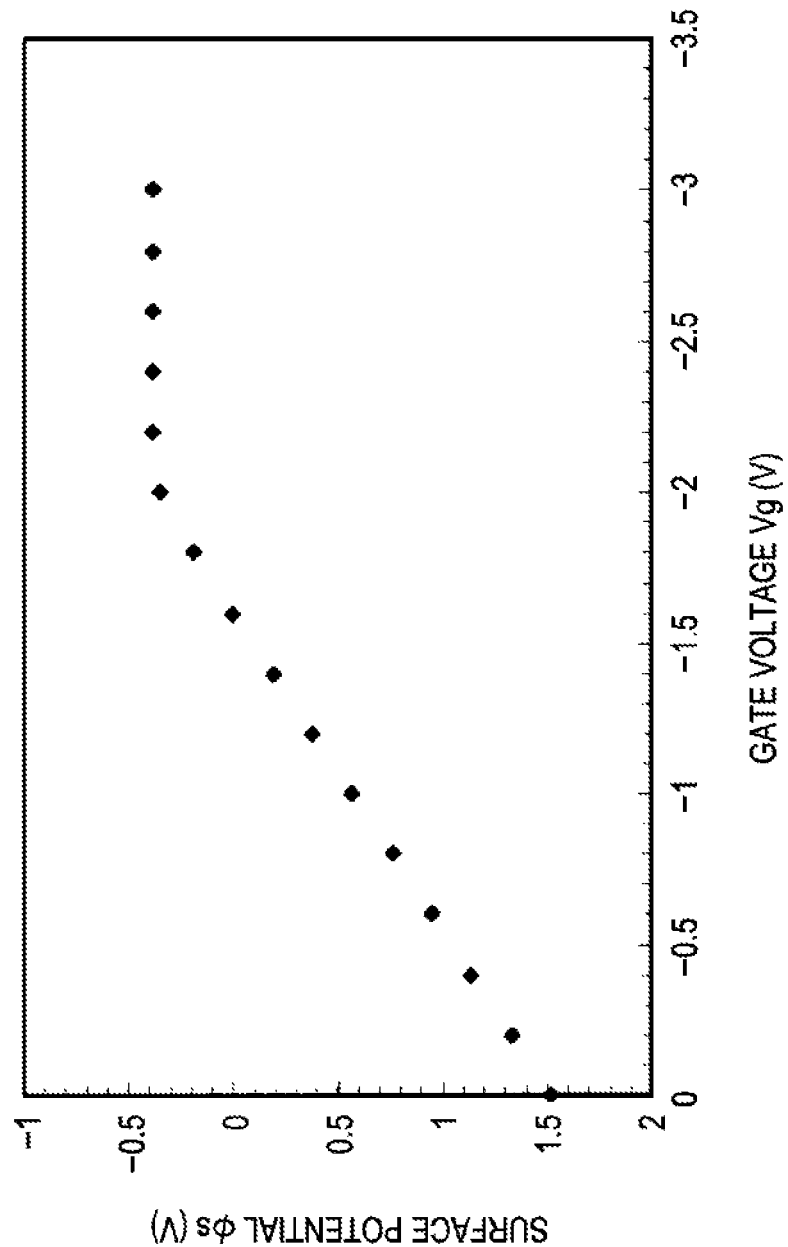
FIG. 6 is a diagram exemplarily illustrating the relation between gate voltage and surface potential.

FIG. 6 is a diagram illustrating an example of the relation between gate voltage Vg and surface potential $\phi s$. In FIG. 6, the horizontal axis represents the gate voltage Vg, and the vertical axis represents the surface potential $\phi s$.

As shown in FIG. 6, applying negative potential to the gate electrode 22A (or 24A) causes the surface potential $\phi s$ to shift in the negative direction, and from a certain value holes are accumulated and gate voltage dependency of the surface potential almost disappears. That is to say, realizing a pinning state allows accumulation of holes at the Si surface, yielding dark current reduction effects. Note that "sufficient negative potential" as used above indicates this pinning state.

Second Structural Example

FIG. 7 is a diagram illustrating the configuration of a unit pixel 20B relating to the second structure example, and components in FIG. 7 which are equivalent to those in FIG. 2 are denoted with the same reference numerals.

The unit pixel 20A according to the first structural example has a structure wherein the gate electrode 22A of the first transfer gate 22 shares the electrode above the memory unit 23. On the other hand, the unit pixel 20B according to the second structural example has a configuration wherein the gate electrode 22A of the first transfer gate 22 is separated from the electrode above the memory unit 23, a dedicated electrode 23A is provided above the memory unit 23, and the electrode 23A is driven with a transfer pulse TRZ which is different from the transfer pulse TRX.

Thus, pixel operations the same as with the case of the unit pixel 20A according to the first structural example can be obtained by separating the gate electrode 22A of the first transfer gate 22 and the electrode 23A of the memory unit 23, and driving the electrodes 22A and 23A with different transfer pulses TRX and TRZ. Particularly, separating the electrode 23A on the memory unit 23 from the gate electrode 22A allows the degree of modulation of the memory unit 23 by the transfer pulse TRZ to be adjusted. Accordingly, the saturation charge amount of the memory unit 23 can be freely set.

In the case of the second structural example as well, a configuration may be made as with the first structural example, where the discharge portion 29 is omitted and the transfer pulses TRX, TRZ, and TRS, and reset pulse RST, are all in an active state. Due to this configuration, advantages equivalent to those of the discharge portion 29 can be obtained, i.e., to enable the charge of the embedded photodiode 21 to be discharged and also overflowing charge of the embedded photodiode 21 during the readout period to be shunted to the substrate side.

With the second structural example, the potential of the gate electrode 23A of the memory unit 23 serving as a charge holding region is set to a potential realizing a pining state, during the period in which the first transfer gate 22 and second transfer gate 24 are in a non-conductive state.

Note that with the second structural example shown in FIG. 7, the gate electrode 22A of the first transfer gate 22 and the gate electrode 24A of the second transfer gate 24 exist at the edge of the memory unit 23, so setting these gate electrodes 22A and 24A to negative potential enables dark current occurring at the edge of the memory unit 23 to be suppressed, as with the above-described first structural example.

Third Structural Example

FIG. 8 is a diagram illustrating the configuration of a unit pixel 20C relating to the third structural example, and components in FIG. 6 which are equivalent to those in FIG. 2 are denoted with the same reference numerals.

The unit pixel 20A shown in the first structural example has a configuration wherein the memory unit 23 is formed of the embedded channel 35. On the other hand, the unit pixel 20C according to the third structural example has the memory unit 23 formed not of the embedded channel 35 but of an embedded diffusion region 37.

A case wherein the memory unit 23 is formed of the embedded diffusion region 37 can yield the same advantages as with a case where the memory unit 23 is formed of the embedded channel 35. Specifically, an n-type diffusion region 37 is formed within the p-type well layer 32, and a p-type layer 38 is formed on the substrate face side, whereby dark current occurring at the Si—SiO2 interface can be prevented from being accumulated in the embedded diffusion region 37 of the memory unit 23, which can contribute to improved image quality.

In the case of employing the third structure example, the impurity concentration of the diffusion region 37 of the memory unit 23 is preferably lower than the impurity concentration of the diffusion region of the floating diffusion region 25. Setting the impurity concentration thus raises the transfer efficient of charges from the memory unit 23 to the floating diffusion region 25 by the second transfer gate 24.

Note that with the third structure example, the memory unit 23 is formed of the embedded diffusion region 37, but a structure may be employed where the memory unit 23 is not embedded, even through the dark current occurring at the memory unit 23 may increase.

In the case of the third structural example as well, a configuration may be made as with the first structural example, where the discharge portion 29 is omitted and the transfer pulses TRX, TRZ, and TRS, and reset pulse RST, are all in an active state. Due to this configuration, advantages equivalent to those of the discharge portion 29 can be obtained, i.e., to enable the charge of the embedded photodiode 21 to be discharged and also overflowing charge of the embedded photodiode 21 during the readout period to be shunted to the substrate side.

Figure 9:
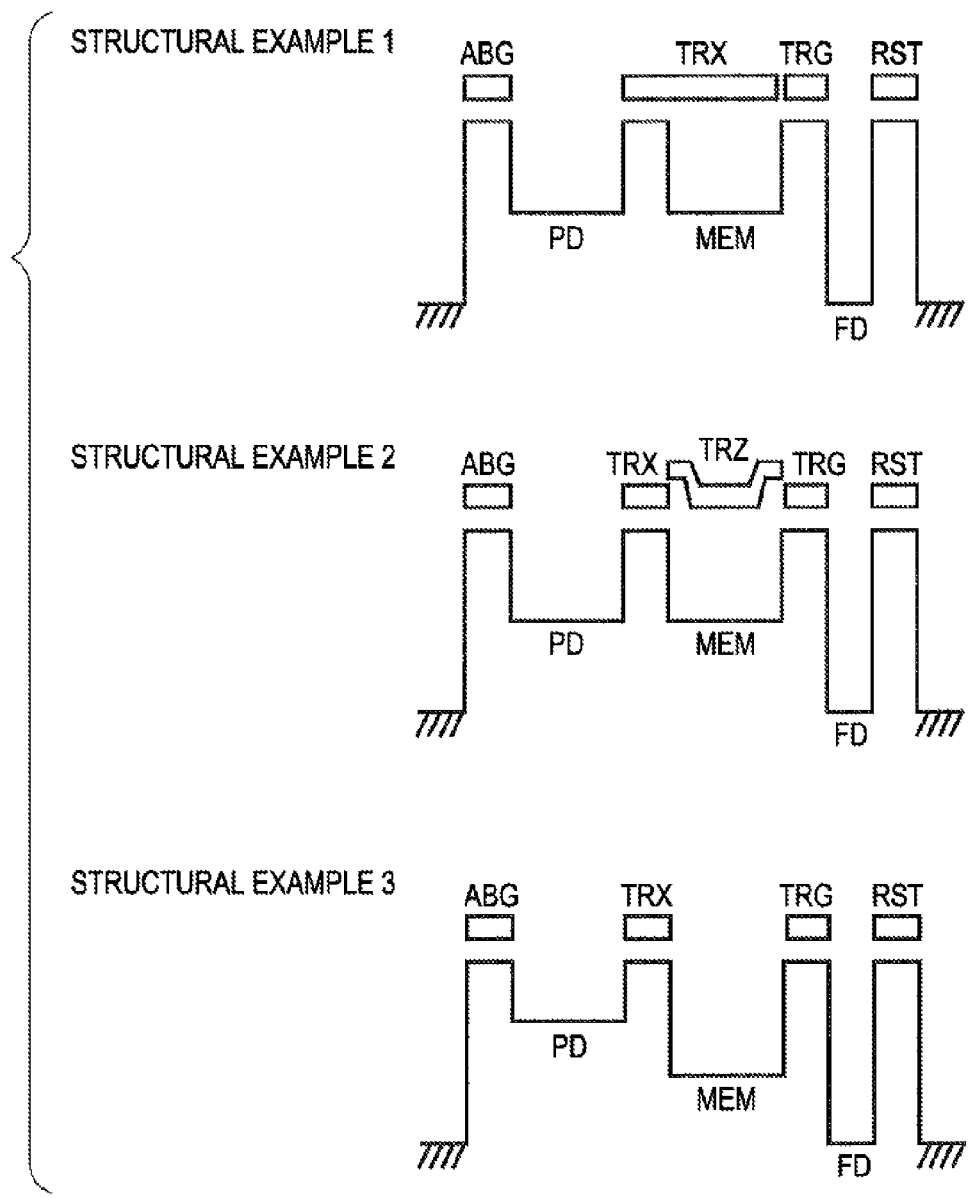
FIG. 9 is a potential diagram illustrating the potential at each portion of the unit pixels according to the first through third structural examples.

FIG. 9 illustrates the potential of each of the unit pixels 20A through 20C according to the first through third structure examples. As can be clearly understood from the potential diagram of FIG. 9, the potential is the same for each portion with the case of the first structure example and second structure example, and particularly, the potential of the photodiode (PD) 21 and the potential of the memory unit (MEM) 23 is the same. On the other hand, with the case of the third structure example, the potential of the memory unit 23 is deeper than the potential of the photodiode 21.

It should be noted that the conductivity types of the device structures in the unit pixels 20A through 20C according to the first through third structure examples are only an example, and the n-type and p-type may be inverted. Further, the conductivity type of the substrate 31 may also be either n-type or p-type.

As described above, the unit pixel 20 (20A through 20C) according to the present embodiment have a memory unit 23 for holding (accumulating) photo-generated charge transferred from the photodiode 21, separately from the floating diffusion region 25, and further, have the first transfer gate 22 and second transfer gate 24. The first transfer gate 22 transfers charge from the photodiode 21 to the memory unit 23. The second transfer gate 24 transfers charge from the memory unit 23 to the floating diffusion region 25.

The following description will be made with reference to an example of a case of using the unit pixel 20A according to the first structural example as the unit pixel 20 according to the present embodiment. For sake of simplification, in the following description, the unit pixel 20A will be referred to simply as "unit pixel 20".

Feature Portion of Embodiment

With the CMOS image sensor 10 according to the present embodiment, all pixels start exposure at the same time, all pixels end exposure at the same time, and the charge accumulated at the photodiode 21 is transferred to the shielded memory unit 23 and floating diffusion region 25, thereby realizing global exposure. This global exposure realizes imaging with no distortion, from an exposure period matching for all pixels.

To realize this global exposure, with the unit pixel 20 according to the present embodiment, the first transfer gate 22 is driven as appropriate by a first voltage value which effects a conducting (on) state, a second voltage value which effects a non-conducting (off) state, and a third voltage value which is between the first voltage value and the second voltage value, i.e., these three values. In the following description, the third voltage value will be referred to as "intermediate voltage Vmid".

Feature 1

Figure 10A:
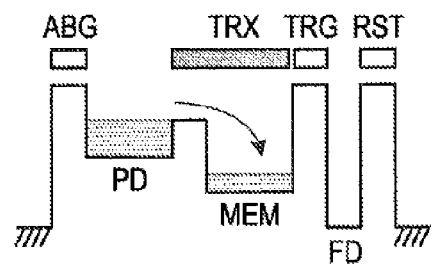
FIGS. 10A through 10E are operation explanatory diagrams of first through fifth features of the embodiment.
Figure 10B:
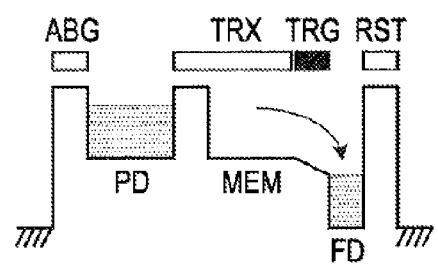
Figure 10C:
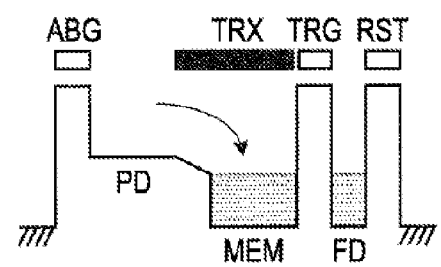
Figure 10D:
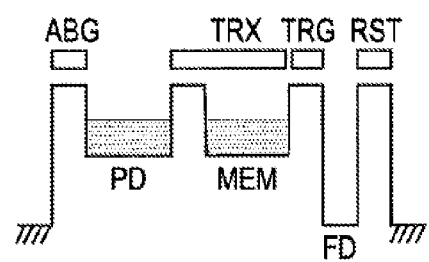
Figure 10E:
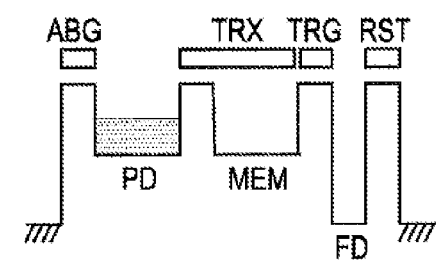

With the present embodiment, the first transfer gate 22 is driven at the intermediate voltage Vmid one or more times during the imaging period from starting exposure for all pixels to ending exposure thereof at the same time (global exposure period), in a state with the second transfer gate 24 off, as shown in FIG. 10A. This driving of the first transfer gate 22 one or more times with the intermediate voltage Vmid is the first feature (feature 1).

Providing the memory unit 23 within the pixel means that the area of the photodiode 21 decreases and accordingly the saturation charge Qs_pd of the photodiode 21 is smaller, but the reduction in saturation charge Qs_pd can be compensated for by the driving according to the feature 1. Specifically, by driving the first transfer gate 22 with the intermediate voltage Vmid before saturation of the photodiode 21, a photo-generated charge which has occurred exceeding a certain level (predetermined charge) is transferred to the memory unit 23 as a signal charge 1, and held in the memory unit 23. The saturation level of the photodiode 21 is the level in a state wherein the second voltage value is applied to the second transfer gate 24 and the second transfer gate 24 is in an off state.

Applying the intermediate voltage Vmid means that the first transfer gate 22, which transfers the photo-generated charge which has been generated exceeding a certain level to the memory unit 23 as the signal charge 1, functions as an intermediate charge transfer unit. That is to say, the first transfer gate 22 serving as the intermediate charge transfer unit transfers charge which is generated by photoelectric conversion at the photodiode 21 and exceeds the predetermined charge determined by the voltage value of the intermediate voltage Vmid, to the memory unit 23 as the signal charge 1.

Feature 2

As a result of the driving of the feature 1, the photo-generated charge Q generated by the photoelectric conversion during the exposure period is accumulated in just the photodiode 21, or both the photodiode 21 and the memory unit 23. Specifically, with a pixel wherein the incident light luminosity is luminosity of or greater than a predetermined luminosity, i.e., a pixel where the light is strong, the charge is accumulated in both the photodiode 21 and memory unit 23 as shown in FIG. 8B. Also, with a pixel wherein the incident light luminosity is smaller than the predetermined luminosity, i.e., a pixel where the light is weak, the charge is accumulated in only the photodiode 21 as shown in FIG. 8C. This accumulating of the photo-generated charge Q in just the photodiode 21, or both the photodiode 21 and the memory unit 23, is the second feature (feature 2).

Now, we will refer to the accumulated charge at the photodiode 21 as Qpd, and the accumulated charge at the memory unit 23 (signal charge 1) as Qmem. With a pixel where the light is strong, the photo-generated charge Q is accumulated and held in both the photodiode 21 and the memory unit 23, so the saturation charge can be expanded to Qpd+Qmem. Also, with a pixel where the light is weak, the accumulated charge is small and there is no charge transfer due to the first transfer gate 22 driven at the intermediate voltage Vmid, so the generated charge is all held in the photodiode 21 as the accumulated charge Qpd.

Feature 3

At the time of ending exposure, the second transfer gate 24 is turned on, and the charge in the memory unit 23 is transferred to the floating diffusion region 25 (FIG. 8D). Subsequently, the first transfer gate 22 is turned on, and the charge of the photodiode 21 (signal charge 2) is transferred to the memory unit 23 (FIG. 8E). As a result of executing this operation for all pixels at the same time, the accumulated charge is held by both the photodiode 21 and memory unit 23 during the readout period. This holding of the accumulated charge by both the photodiode 21 and memory unit 23 during the readout period is the third feature (feature 3).

Feature 4

In the readout operation, first, the signal level Vmem, which is the output signal 1 according to the charge amount of the accumulated charge Qmem held in the floating diffusion region 25, is read out. The readout period for this signal level Vmem will be called a first D period. Next, the reset operation is performed by the reset transistor 26, and the reset level Vrst of the floating diffusion region 25 is read out. The readout period for this reset level Vrst will be called a P period.

Next, the charge Qpd is transferred from the memory unit 23 to the floating diffusion region 25, and the signal level Vpd is read out as the output signal 2 corresponding to the charge amount of the charge Qpd. The readout period for this signal level Vpd will be called a second D period. This readout out of the signal levels Vmem and Vpd, which are the two output signals 1 and 2, and the reset level Vrst, is the fourth feature (feature 4).

Feature 5

The signal Vmem and signal Vpd which have been read out in two times are each subjected to noise reduction processing at the column processing unit 13 (see FIG. 1) for example, using the reset level Vrst. Subsequently, in the event that the signal level Vpd has exceeded the predetermined threshold value, processing for adding the signal level Vmem and the signal level Vpd is performed at the downstream signal processing unit 18 (see FIG. 1). This adding of the post-noise-removal signal level Vmem and signal level Vpd is the fifth feature (feature 5).

As can be seen from the features 3 through 5, a charge is held at both the photodiode 21 and memory unit 23 during the readout period, and the two signals Vmem and Vpd and the reset level Vrst are read and added, whereby a broad dynamic range can be secured. Also, the sum of the signal level Vpd and signal level Vmem is equivalent to the sum of the accumulated charge Qpd and accumulated charge Qmem, and since Qpd+Qmem is the charge amount generated proportionately to the incident light intensity E, linear input/output properties can be obtained.

The noise removal using the reset level Vrst is processing where kTC noise is not removed with regard to the signal level Vmem read out in the first D period, but is processing where kTC noise is removed with regard to the signal level Vpd read out in the second D period.

With pixels which have a small signal level and are affected by kTC noise (i.e., pixels where the light is weak), all generated charge is accumulated to the photodiode 21, and holding is performed at the memory unit 23 formed of the embedded channel, whereby high S/N ratio can be realized due to removal of kTC noise. Not adding the noise component of the signal level Vmem at the time of lower output due to executing addition processing following the noise removal processing only in cases wherein the signal level Vpd has exceeded the predetermined threshold value also contributes to this high S/N ratio.

Also, irregularities in threshold values of the first transfer gate 22 affect the luminosity level used for accumulation at the memory unit 23, but do not affect final input/output properties. For example, we will say that the total charge amount Qall of a certain pixel was divided into the charge Qpd and charge Qmem and accumulated, while at another pixel, the amount transferred to the charge Qmem was smaller by ΔQth due to threshold value irregularities. However, even in such a case, the accumulation at the photodiode 21 is Qpd+ΔQth, while the accumulation at the memory unit 23 is Qmem−ΔQth. Accordingly, executing the addition processing of feature 5 allows the total charge Qall to be ultimately obtained, since the accumulated charge deviation ΔQth of the photodiode 21 is cancelled out.

Circuit Operations

Next, specific circuit operations of the CMOS image sensor 10 having the unit pixel 20 according to the present embodiment will be described.

Normal Global Exposure

Figure 11:
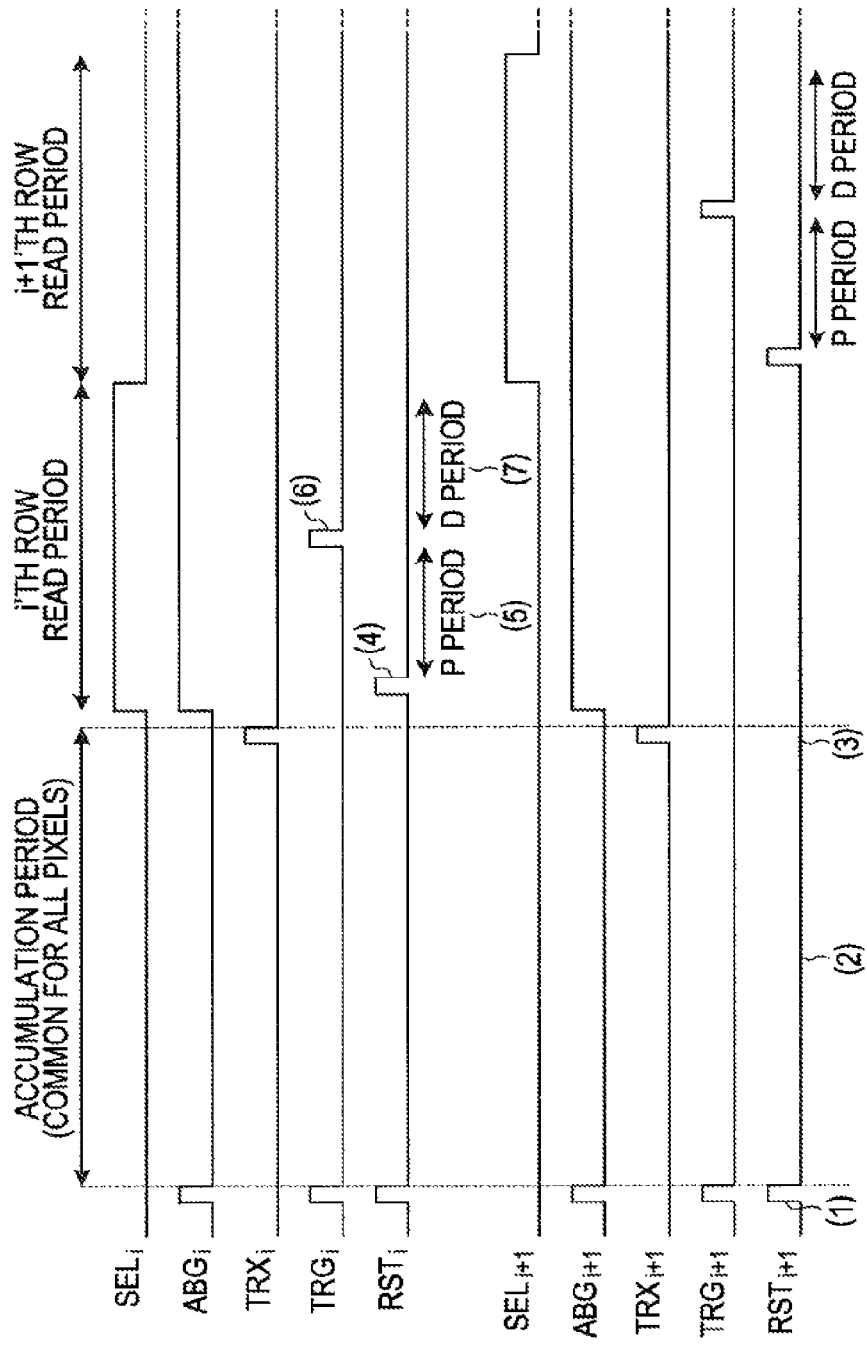
FIG. 11 is a timing chart for explanation of operations performed in normal global exposure operations.
Figure 12:
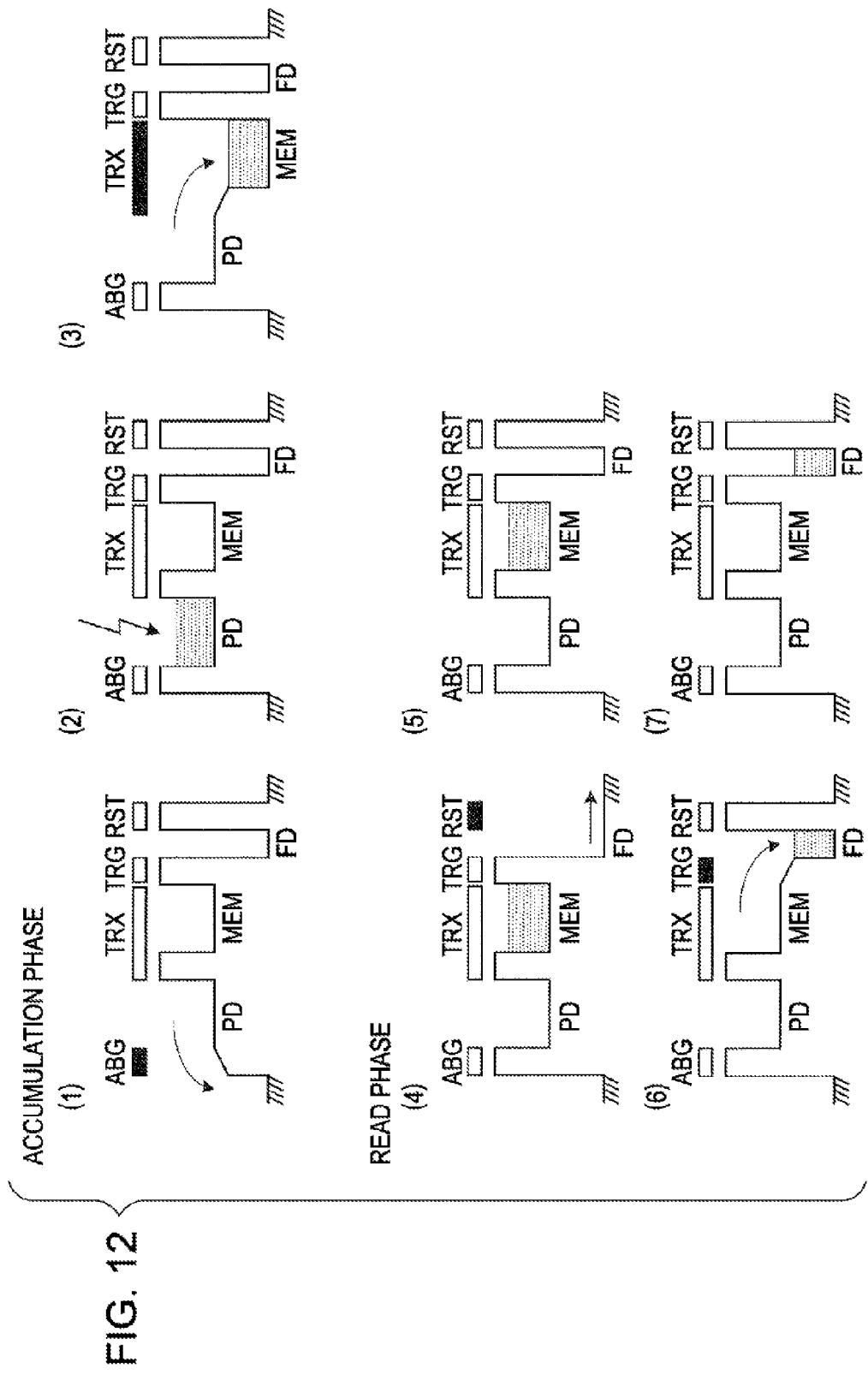
FIG. 12 is an operation explanatory diagram of normal global exposure operations.

To facilitate understanding, first, global exposure operations according to the related art (hereinafter referred to as "normal global exposure operations") will be described with reference to FIGS. 11 and 12. Note that as described earlier, with normal global exposure operations, the saturation charge Qs_pd is around half as compared to a pixel not having a memory unit (MEM) if the pixel size is the same.

In the timing chart in FIG. 11 and the operation explanatory diagram in FIG. 12, (1) through (7) correspond to the (1) through (7) in the following operational description.

Accumulation Phase

All pixels are exposed at the same time by the driving of (1) through (3).

(1) The discharge portion 29 of all pixels goes on at the same time, and the charge in the photodiode 21 is discharged, thereby starting exposure.

(2) The photo-generated charge generated at the photodiode 21 in accordance with the incident light luminosity is accumulated at the photodiode 21.

(3) The first transfer gate 22 goes on for all pixels at the same time, the photo-generated charge Qpd accumulated in the photodiode 21 is transferred to the memory unit 23, and held therein.

Readout Phase

A signal readout operation of individual pixels or increments of multiple pixels is performed by the driving of (4) through (7). In the case of this example, pixels are driven in increments of rows.

(4) The reset transistor 26 goes on, and the charge of the floating diffusion region 25 is discharged.

(5) The reset level Vrst of the floating diffusion region 25 is read out via the amplifying transistor 27 (P period).

(6) The second transfer gate 24 goes on, and the charge Qpd held in the memory unit 23 is transferred to the floating diffusion region 25.

(7) The signal level Vpd corresponding to the charge Qpd of the floating diffusion region 25 is read out via the amplifying transistor 27 (D period).

Here, the signal level Vpd is the result of charge-to-voltage conversion obtained from the parasitic capacitance Cfd by the computation expression $$Vpd=Qpd/Cfd.$$

Also, noise included in the signal level Vpd can be removed by Correlated Double Sampling (CDS) which obtains the difference between the reset level Vrst and signal level Vpd. However, it should be noted that the maximum charge Qpd_ sat which can be handled is around half or even less as compared with a pixel not having a memory unit 23 if the pixel size is the same.

Global Exposure According to Present Embodiment

Figure 13:
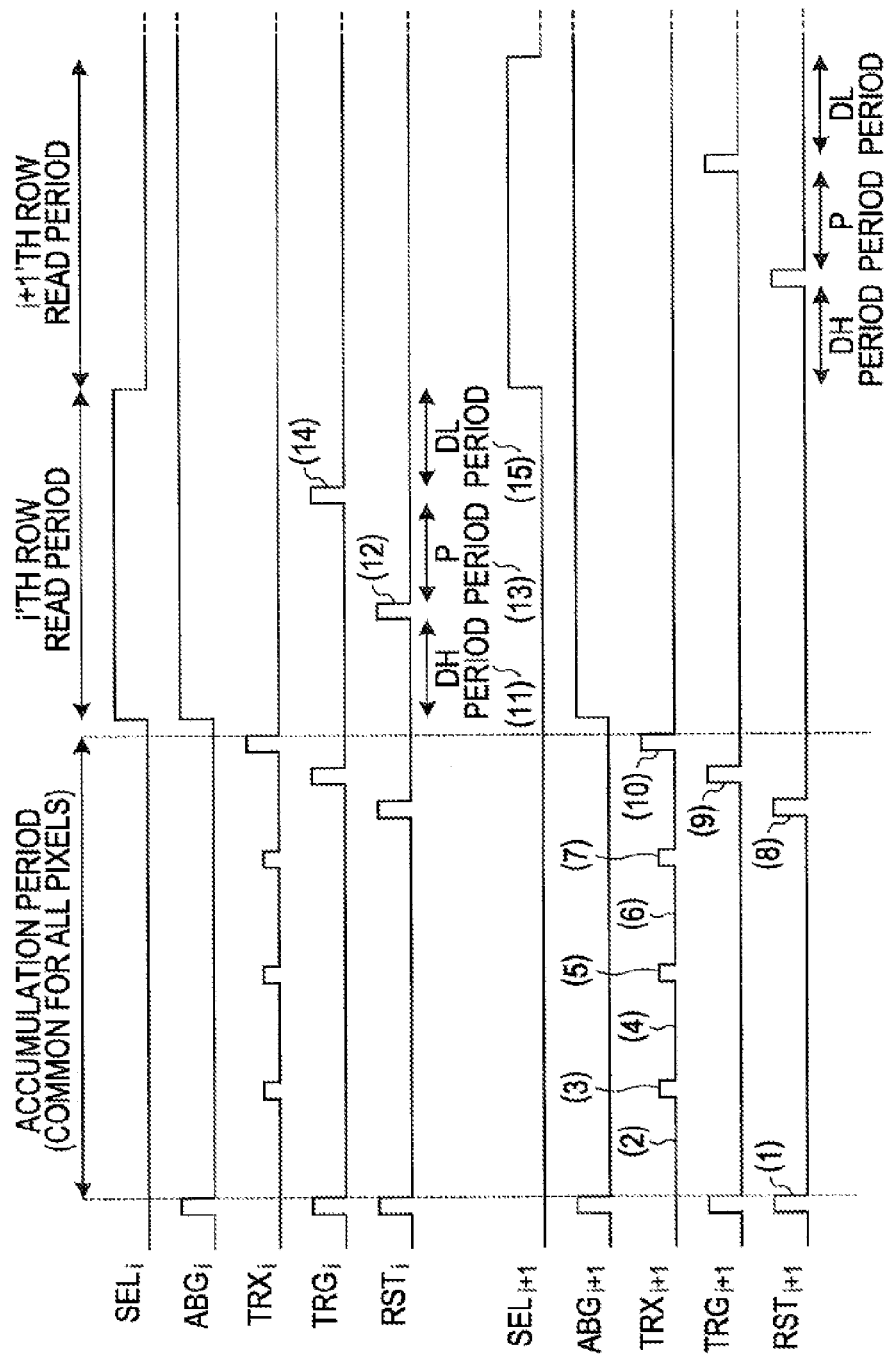
FIG. 13 is a timing chart illustrating the driving timing in a case of using the unit pixel according to the first structural example.

Next, the circuit operations of the CMOS image sensor 10 according to the present embodiment will be described. It is to be understood that the circuit operations described next are executed under driving performed by the vertical driving unit 12 which serves as a pixel driving unit. FIG. 13 shows the driving timing of the present embodiment.

A first point is that the first transfer gate 22 is driven at the intermediate voltage Vmid one or more times during the same imaging period for all pixels, in a state with the second transfer gate 24 off. Note that the intermediate voltage Vmid is a voltage between the voltage at which the first transfer gate 22 is on and the voltage at which the first transfer gate 22 is off.

A second point is that turning the second transfer gate 24 on at the time of ending exposure transfers the accumulated charge Qmem in the memory unit 23 to the floating diffusion region 25, and turning the first transfer gate 22 on transfers the accumulated charge Qpd of the photodiode 21 to the memory unit 23.

A third point is that during the readout period, signal readout of the charge Qmem holed at the floating diffusion region 25, and signal readout of the charge Qpd held at the memory unit 23, and readout of the reset level Vrst, are performed, with the accumulated charge being read out in two times.

In the timing chart in FIG. 13, the DH period is the signal readout period of the charge Qmem, the DL period is the signal readout period of the charge Qpd, and the P period is the readout period of the reset level Vrst.

Accumulation Period

Figure 14:
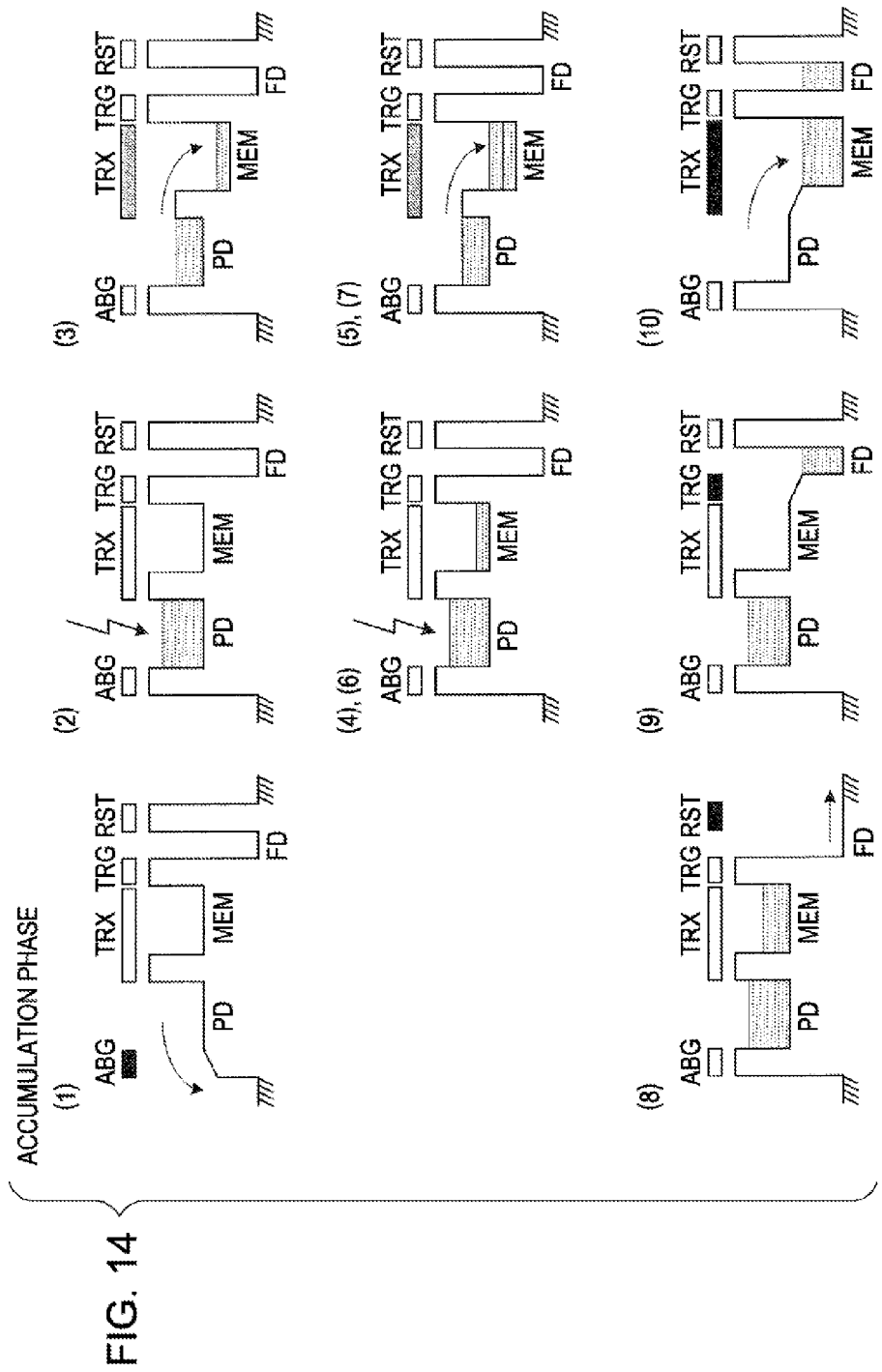
FIG. 14 is an operation explanatory diagram illustrating transfer of photo-generated charge in a case where the incident light in the accumulation period is strong.
Figure 15:
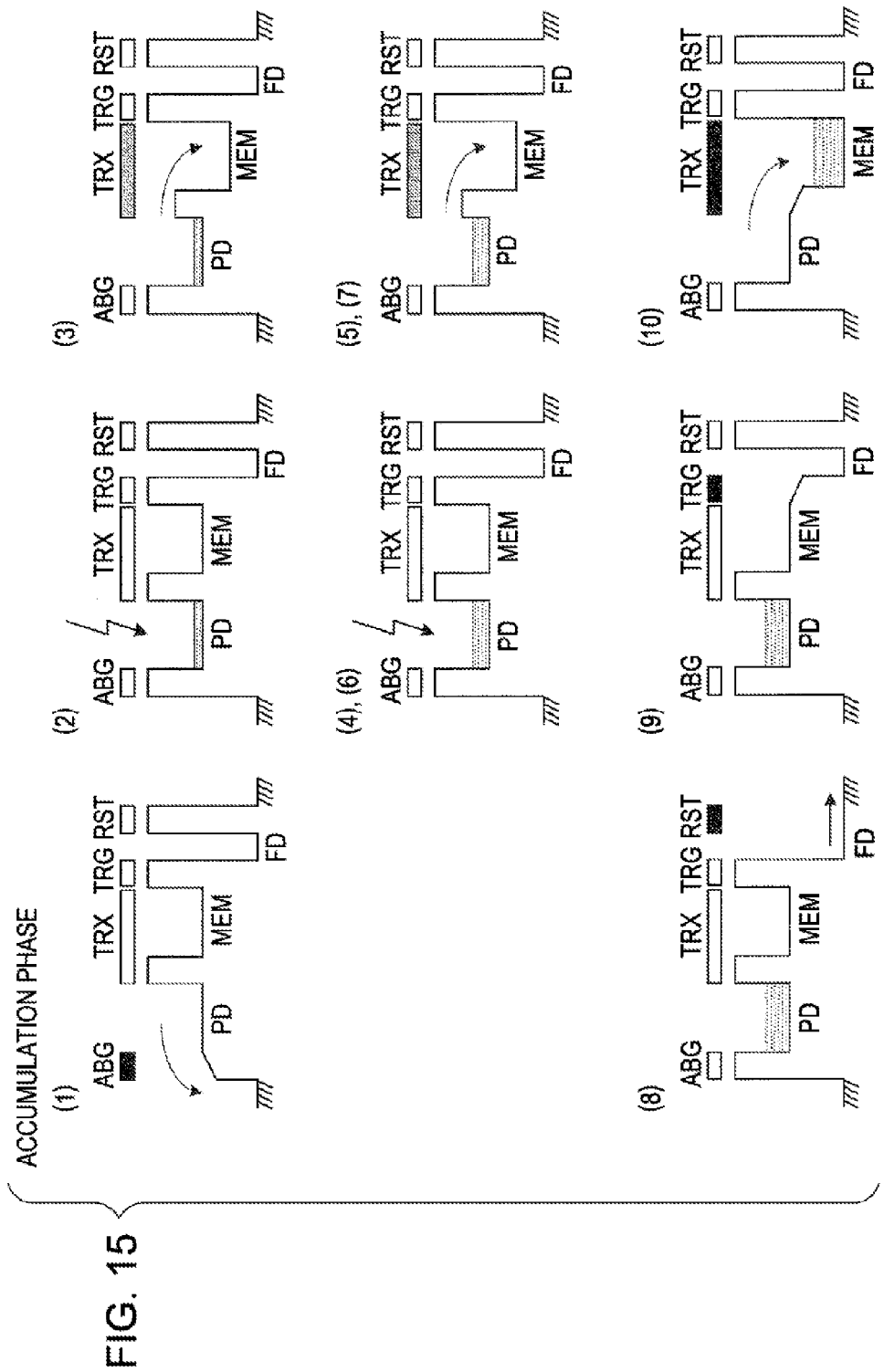
FIG. 15 is an operation explanatory diagram illustrating transfer of photo-generated charge in a case where the incident light in the accumulation period is weak.

FIGS. 14 and 15 illustrate the operations from starting of exposure (start of accumulation) to end of exposure (end of accumulation). FIG. 14 illustrates the way in which a photo-generated charge is transferred in a case wherein the incident light luminosity is of a luminosity equal to or greater than a predetermined luminosity (i.e., the incident light is strong). FIG. 15 illustrates the way in which a photo-generated charge is transferred in a case wherein the incident light luminosity is of smaller than a predetermined luminosity (i.e., the incident light is weak).

In the timing chart in FIG. 13 and the operation explanatory diagrams in FIGS. 14 and 15, (1) through (10) correspond to the (1) through (10) in the following operational description. The driving of (1) through (10) is performed for all pixels at the same time, though driving time difference among pixels is permissible within a range in which imaging distortion is tolerable. For example, an arrangement might be conceived where the driving timing is intentionally shifted slightly for each, so as to suppress peak current and avoid voltage drop and the like, and so forth.

(1) The discharge portion 29 goes on, and the charge in the photodiode 21 is discharged, thereby starting exposure.

(2) The photo-generated charge generated at the photodiode 21 in accordance with the incident light luminosity is accumulated at the photodiode 21.

(3) The first transfer gate 22 is driven at the intermediate voltage Vmid, thereby transferring charge exceeding a certain accumulation amount at the photodiode 21 to the memory unit 23. That is to say, in a case wherein the accumulation amount in FIG. 15 is small, the entire charge remains in the photodiode 21 and no charge transfer takes place.

The driving of (2)-(3) may be repeated as with (4)-(5) and (6)-(7).

(4), (6) Exposure and accumulation is continued.

(5), (7) The first transfer gate 22 is driven at the intermediate voltage Vmid, and a charge exceeding the certain accumulation amount at the photodiode 21 is transferred to the memory unit 23.

The following operations are executed when exposure is ended.

(8) The reset transistor 26 goes on, and the charge in the floating diffusion region 25 is discharged (reset operation).

(9) The second transfer gate 24 goes on, and the accumulated charge Qmem in the memory unit 23 is transferred to the floating diffusion region 25. At this time, there is no accumulation at the memory unit 23 with dark pixels, so Qmem=0 with such pixels.

(10) The first transfer gate 22 goes on, and the accumulated charge Qpd at the photodiode 21 is transferred to the memory unit 23.

The operations of the readout period are shown in FIG. 16. In the timing chart in FIG. 13 and the operation explanatory diagram in FIG. 16, (11) through (15) correspond to the (11) through (15) in the following operational description.

(11) The transfer operation at the time of ending exposure causes the charge Qmem to be held at the floating diffusion region 25, and the charge Qpd is held at the memory unit 23. As described above, Qmem=0 with dark pixels.

The charge Qmem accumulated at the floating diffusion region 25 is read out via the amplifying transistor 27 as signal level Vmem. Charge-to-voltage conversion in accordance with Vpd=Qpd/Cfd is performed with the parasitic capacitance Cfd at the floating diffusion region 25 (DH period).

(12) The reset transistor 26 goes on, and the charge at the floating diffusion region 25 is discharged.

(13) The reset level Vrst of the floating diffusion region 25 is read out (P period).

(14) The second transfer gate 24 goes on, and the charge Qpd of the memory unit 23 is transferred to the floating diffusion region 25.

(15) The charge Qpd at the floating diffusion region 25 is read out as signal level Vpd. Vpd=Qpd/Cfd holds (DL period).

In contrast to the normal global exposure timing as shown in FIG. 17A, the global exposure according to the present embodiment performs readout of the signal Vpd of a certain pixel twice, in the DH period and the DL period, as shown in FIG. 17B. Also, there is the reset level Vrst readout period (P period) between the DH period and the DL period.

Example Of Driving Order

Generally, the floating diffusion region 25 has a greater dark current as compared to a memory unit 23 formed of an embedded channel 35 (structural examples 1 and 2) or embedded diffusion region 37 (structural example 3). The charge Qmem, which is a part of the accumulated charge, is held in the floating diffusion region 25 during the readout period, and accordingly is affected by dark current more than in the holding period.

As shown in FIG. 17B, from ending of the accumulation period up to the DH period is the period of charge holding at the floating diffusion region 25, so at the final readout row, the DH period, P period, and DL period has to be kept held for each row.

Figure 18:
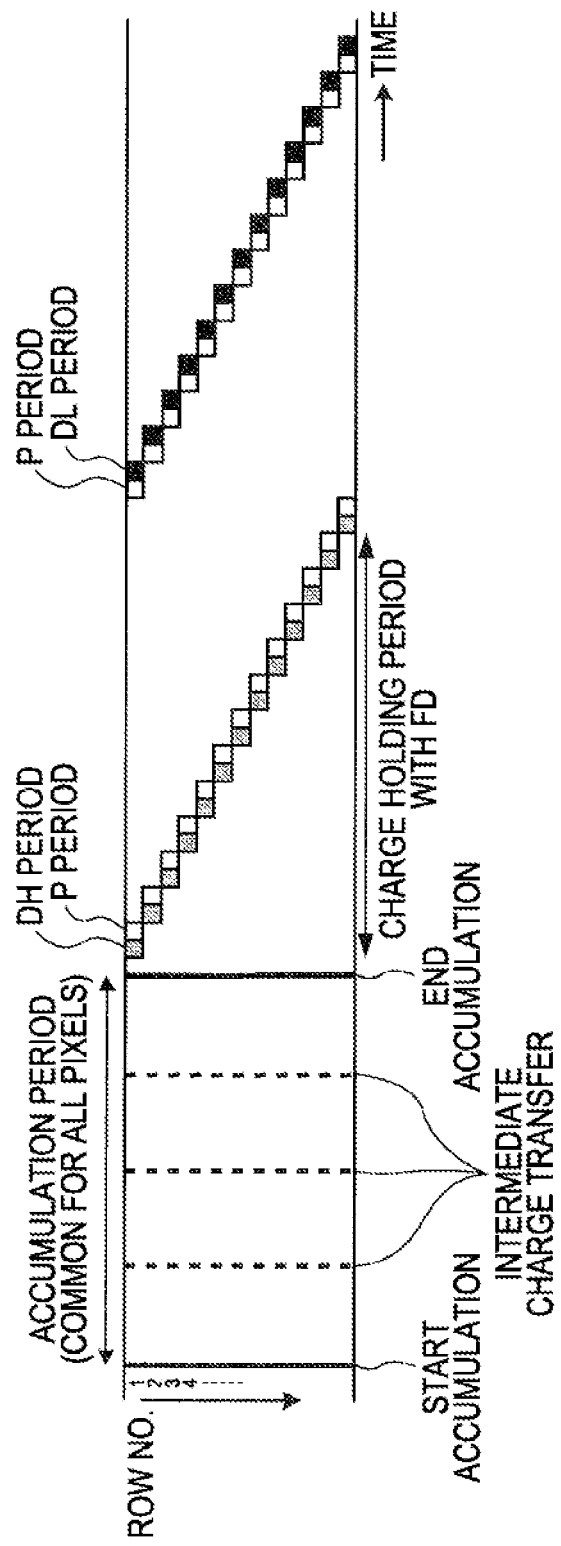
FIG. 18 is a diagram illustrating another driving timing for global exposure according to the embodiment.

On the other hand, as shown in FIG. 18, an arrangement may be made wherein readout of the signal level Vmem in the DH period is all performed first, with the signal level Vpd being read out later. According to this method, the charge holding period at the floating diffusion region 25 can be shortened, and effects of dark current alleviated. It should be noted however, that with this case, one frame worth of data storage region (memory) has to be used to hold signals read out in the DH period, so as to add the results read out in two times and obtain a final image.

Thus, with another driving example, the accumulated charge (signal charge 1) Qmem is read out as signal level (output signal 1) Vmem, in increments of single pixels or multiple pixels, following ending of the exposure period. Subsequently, the floating diffusion region 25 is reset and the reset level of the floating diffusion region 25 is read out as a reset signal 1. This operation is sequentially performed on all of the unit pixels 20.

Subsequently, in increments of single pixels or multiple pixels, the floating diffusion region 25 is reset and the reset level of the floating diffusion region 25 is read out as a reset signal 2. Next, the second transfer gate 24 is placed in an on state and the accumulated charge (signal charge 2) Qpd is transferred to the floating diffusion region 25, following which an operation is performed to read out the accumulated charge Qpd as signal level (output signal 2) Vpd.

The noise removal processing at the column processing unit 13 in the case of using this driving example is as follows. That is to say, the column processing unit 13 performs noise removal processing of the signal level Vmem which is the output signal 1, using the reset signal 1. Next, the column processing unit 13 performs noise removal processing of the signal level Vpd which is the output signal 2, using the reset signal 2.

Other Structure of Unit Pixel

Next, another configuration example of the unit pixel 20 will be described as a fourth structural example.

Fourth Structural Example 4

Figure 19:
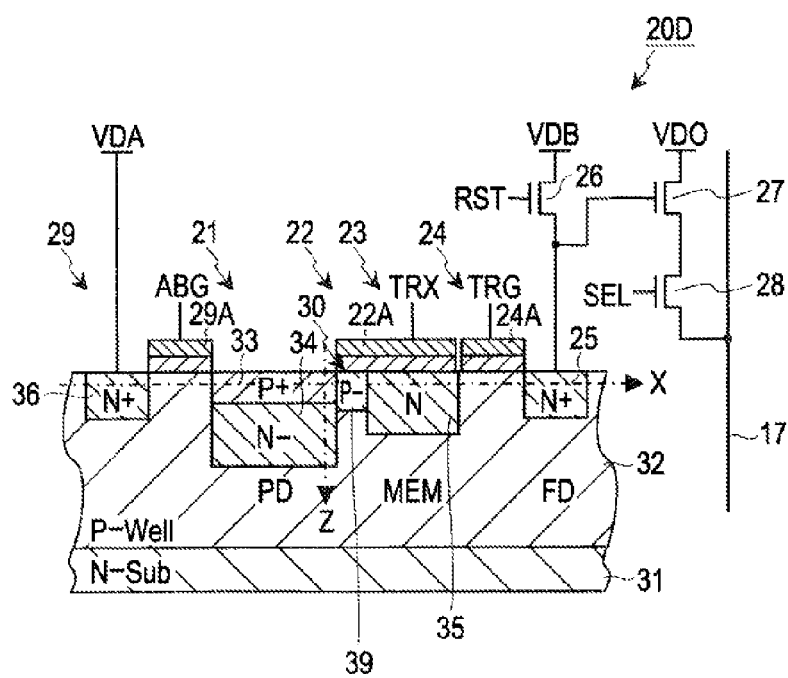
FIG. 19 is a diagram illustrating the configuration of the unit pixel according to the fourth structural example.

FIG. 19 is a diagram illustrating the configuration of a unit pixel 20D according to the fourth structural example, with components in FIG. 17 which are the same as those in FIG. 2 being denoted with the same reference numerals.

The unit pixel 20D according to structural example 4 has a structure wherein an overflow path 30 has been formed by providing an n-type impurity diffusion region 39 has been provided at the boundary portion between the photodiode 21 below the gate electrode 22A and the memory unit 23.

In order to lower the potential of the impurity diffusion region 39 so as to form an overflow path 30, the impurity diffusion region 39 is lightly doped with an n-type impurity to lower the p-type impurity concentration, thereby forming a p- impurity diffusion region 39. Alternatively, in the case of doping the impurity diffusion region 39 with a p-type impurity at the time of forming the potential barrier, a p- impurity diffusion region 39 can be formed by lowering the concentration of doping.

Here, the unit pixel 20A according to the first structural example is used as a basis, but the unit pixel 20A according to a modification thereof may be used as a basis instead.

As described above, with the unit pixel 20A according to the first structural example (or modifications thereof in the same way), a feature is that the first transfer gate 22 is driven at the intermediate voltage Vmid. Specifically, charge generated under low illuminance is accumulated at the photodiode 21 with priority, a charge regarding which saturation occurs is accumulated in the memory unit 23 by driving of the first transfer gate 22 with the intermediate voltage Vmid. At the time of ending exposure, transfer is performed from the memory unit 23 to the floating diffusion region 25 and from the photodiode 21 to the memory unit 23 for all pixels at the same time, and held, such that readout is performed over two times.

Figure 20A:
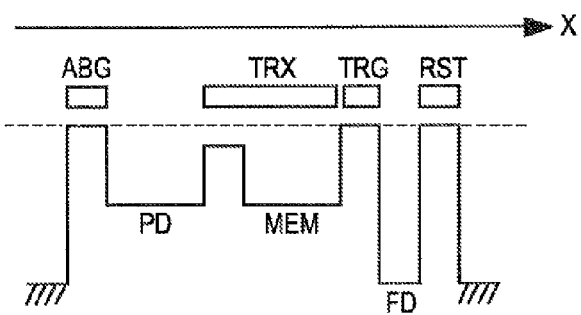
FIG. 20A is a potential diagram illustrating X-direction potential in FIG. 19.

On the other hand, with the unit pixel 20D according to the fourth structural example, the overflow path 30, which has been formed at the boundary portion between the photodiode 21 and the memory unit 23, is used as the way for accumulating a charge generated under low illuminance at the photodiode 21 with priority. FIG. 20A illustrates X-direction potential in FIG. 19, and FIG. 20B illustrates Z-direction potential in FIG. 19.

As can be clearly seen from the X-direction potential diagram of FIG. 20A, providing the n-type impurity diffusion region 39 at the boundary portion between the photodiode 21 and the memory unit 23 lowers the potential at this boundary portion. The portion where the potential has been lowered becomes the overflow path 30. Charge generated at the photodiode 21 and exceeded the potential of the overflow path 30 is automatically leaked to the memory unit 23 and is accumulated at the memory unit 23. In other words, any charge generated within the potential of the overflow path 30 is accumulated at the photodiode 21.

Figure 20B:
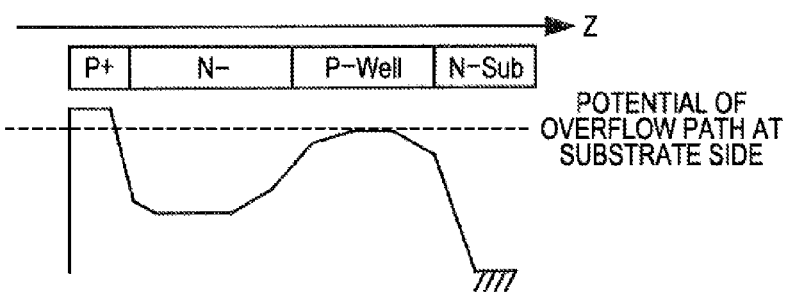
FIG. 20B is a potential diagram illustrating Z-direction potential in FIG. 19.

Now, the potential of the overflow path 30 has to be set lower than the potential of the overflow path at the substrate side, as shown in the Z-direction potential diagram of FIG. 20B. The potential of the overflow path 30 at this time is the potential which determines the charge amount transferred to the memory unit 23 from the photodiode 21 as the signal charge 1 upon the above-described intermediate voltage Vmid being applied to the gate electrode 22A.

Now, the overflow path 30 functions as an intermediate charge transfer unit. That is to say, the overflow path 30 which serves as the intermediate charge transfer unit transfers a charge, which has been generated by photoelectric conversion at the photodiode 21 in the exposure period where all of multiple unit pixels perform imaging operations, and exceeds the predetermined charge amount determined by the potential of the overflow path 30, to the memory unit 23 as the signal charge 1.

Note that in the example shown in FIG. 19, a structure is adopted wherein the overflow path 30 has been formed by providing the p- impurity diffusion region 39. It should be noted, however, that as shown in FIG. 21, a structure may be used wherein the overflow path 30 is formed by providing an n- impurity diffusion region 39 instead of the p- impurity diffusion region 39.

Figure 21:
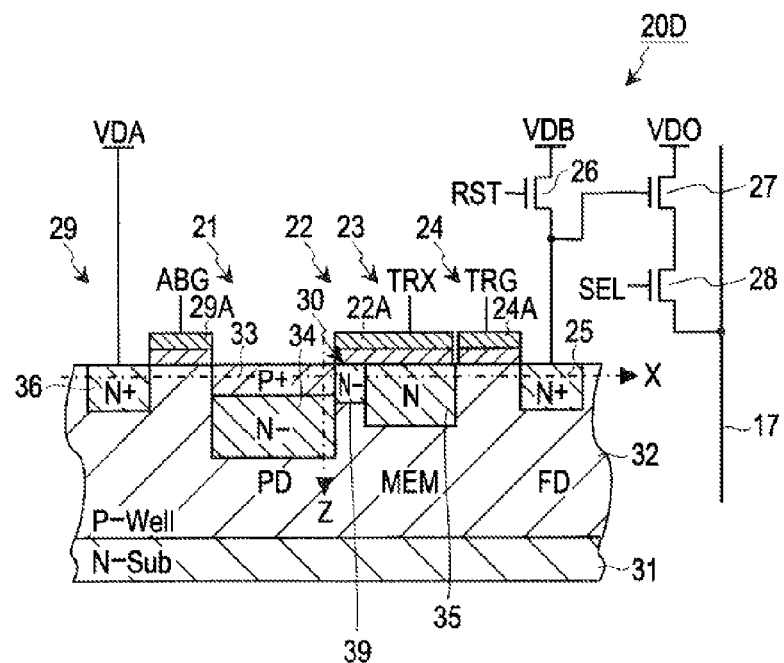
FIG. 21 is a diagram illustrating another configuration of a unit pixel according to the fourth structural example.

As can be seen from FIGS. 19 and 21, with a structure wherein the impurity concentration at the boundary between the photodiode (PD) 21 serving as a photoreceptor and the memory is adjusted, and the overflow path 30 has been provided between the photodiode (PD) 21 and memory unit 23, the following advantages can be obtained other than occurrence of dark current due to pinning.

Figure 22:
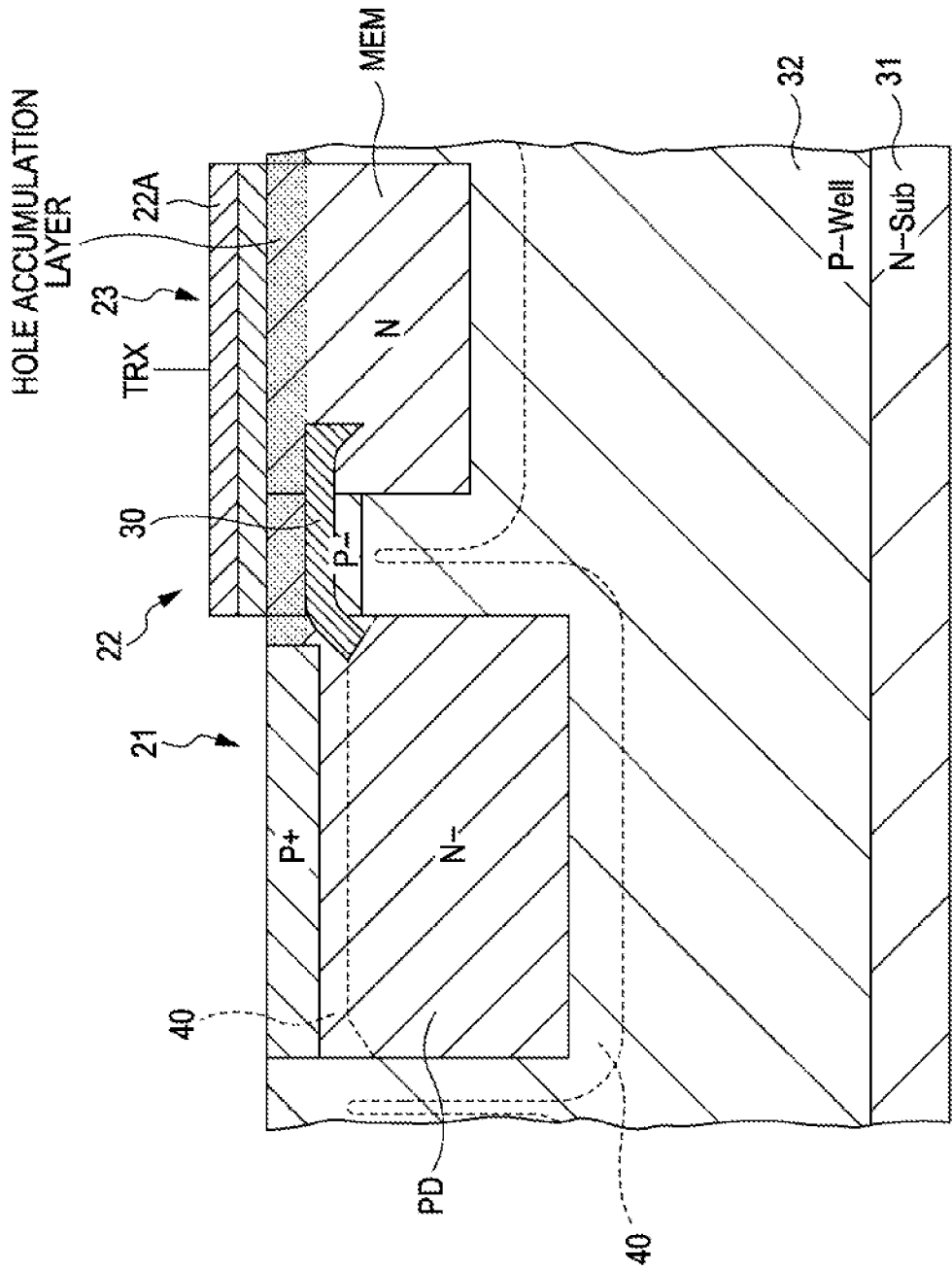
FIG. 22 is a diagram illustrating an overflow path portion shown in FIG. 19.

FIG. 22 is a diagram illustrating the overflow path portion in FIG. 19 in detail. A depletion layer 40 due to a p-n junction is formed nearby the photodiode (PD) 21 and memory unit 23, with the depletion layer 40 formed at the boundary of the photodiode (PD) 21 below the gate electrode 22A of the first transfer gate 22 and the memory unit 23 reaching to the Si surface.

Generally, if the depletion layer 40 is formed reaching to the Si surface, the dark current due to crystal flaws at the Si surface is accumulated at the photodiode (PD) 21 ort the memory unit, so in order to avoid this, the gate electrode 22A is set to a negative potential to realize a pinning state, and a hole accumulation layer is formed at the Si surface.

In FIG. 19, the overflow path 30 with low potential is formed within the depletion layer 40 between the photodiode (PD) 21 and the memory unit 23, with a p- impurity diffusion region. In a state with no pinning, the overflow path 30 also comes into contact with the Si surface, so at the time that the charge overflows and is transferred to the memory unit 23, a phenomenon occurs wherein carriers disappear due to being trapped and recombined at flaws at the Si surface.

Applying sufficient negative potential to the gate electrode 22A forms a hole accumulation layer at the Si surface side of the overflow path 30 which raises the potential, so the overflow path 30 which has low potential shifts to a deeper position within the Si. Accordingly, carrier recombination due to crystal flaws can be prevented in charge transfer to the memory 23 using overflow.

Figure 23A:
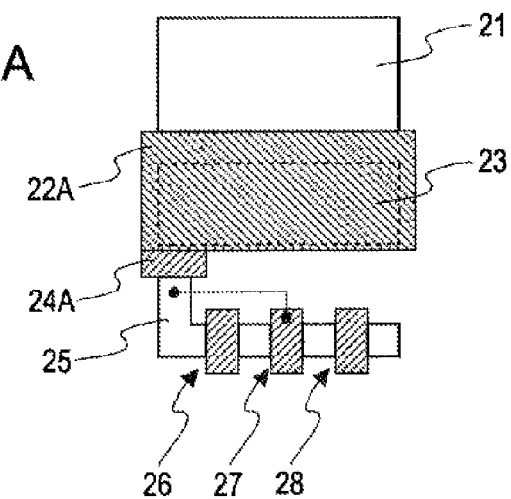
FIGS. 23A through 23C are plan views illustrating the planar structure of a unit pixel.
Figure 23B:
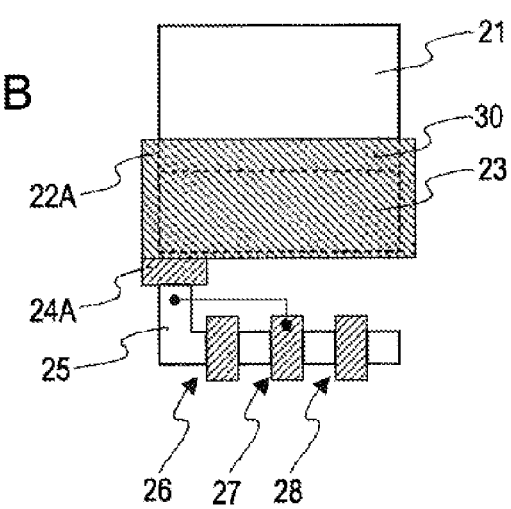
Figure 23C:
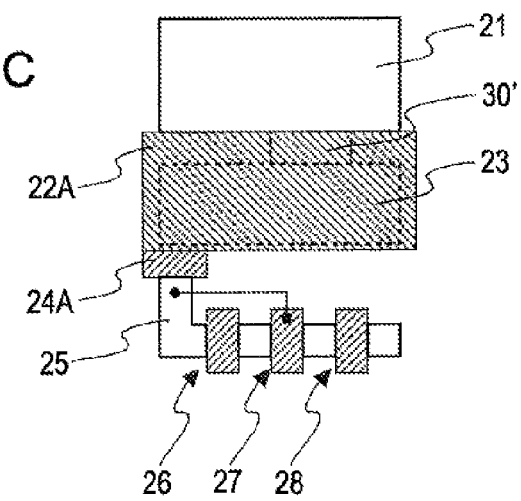

FIGS. 23A through 23C are plan views illustrating the planar structure of a unit pixel. FIG. 23A is a plan view of the unit pixel 20A according to the first structural example, and FIG. 23B is a plan view of the unit pixel 20D according to the fourth structural example. Here, the overflow path 30 is formed over the entire region of the boundary portion between the photodiode 21 and the memory unit 23. However, it should be noted that this is only one example, and that an arrangement may be made with an overflow path 30' at part of the boundary portion between the photodiode 21 and the memory unit 23 as shown in FIG. 23C.

Figure 24:
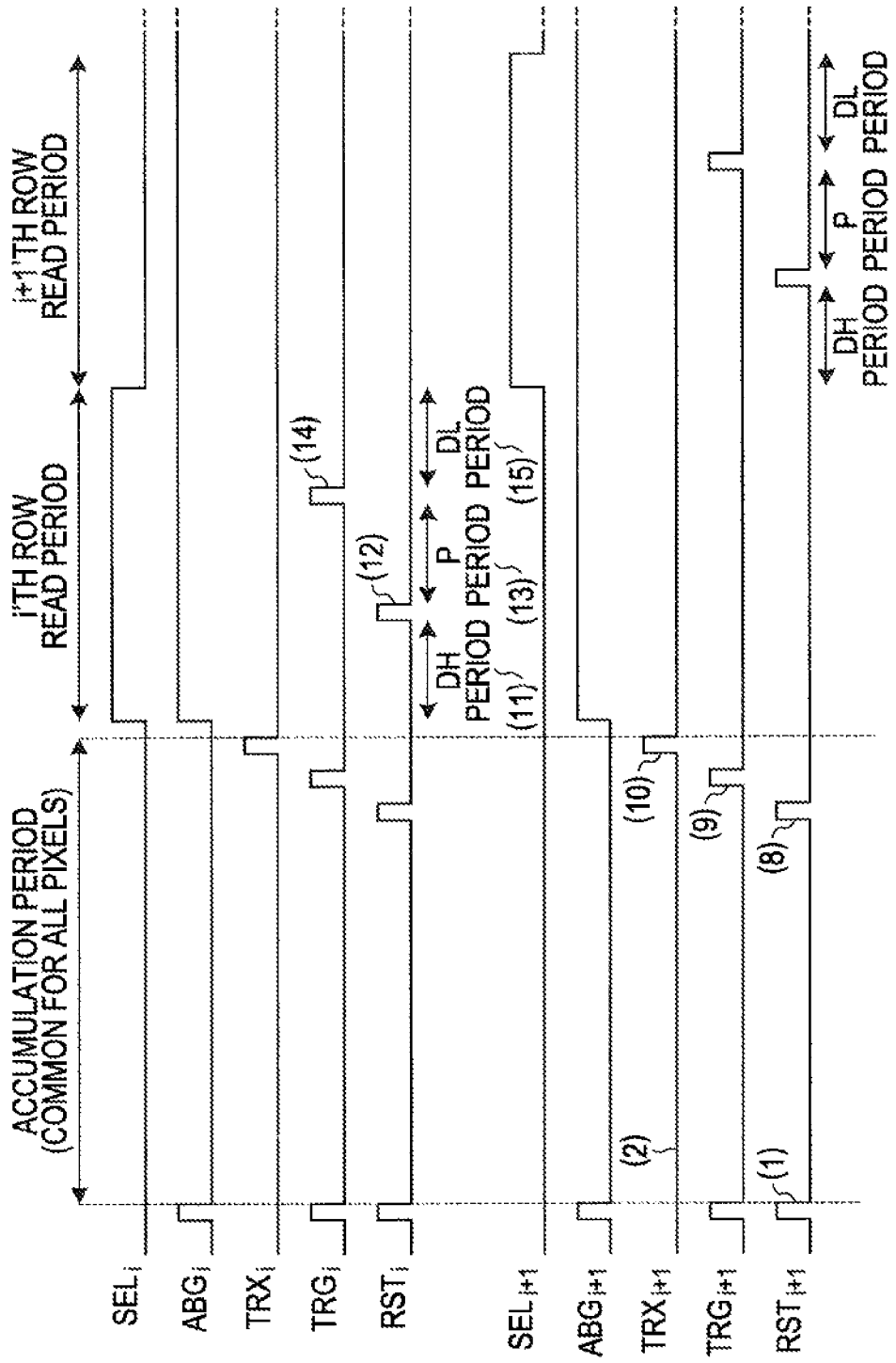
FIG. 24 is a timing chart illustrating the driving timing in a case of using the unit pixel according to the fourth structural example.

FIG. 24 is a timing chart illustrating the driving timing in the case of using the unit pixel 20D according to the fourth structural example, corresponding to FIG. 13. As can be clearly understood by comparing FIG. 24 with FIG. 13, in the case of using the unit pixel 20D according to the fourth structural example, the driving (3), (5), and (7) with the intermediate voltage Vmid in the accumulation period is done away with. The same two-time readout is performed following ending of exposure, as in FIG. 13.

Note that as described above, at the timing of driving the gate electrode of the memory unit 23 at negative potential (pinning voltage), driving through a different voltage (e.g., 0V) in a transient manner can be performed.

Figure 25:
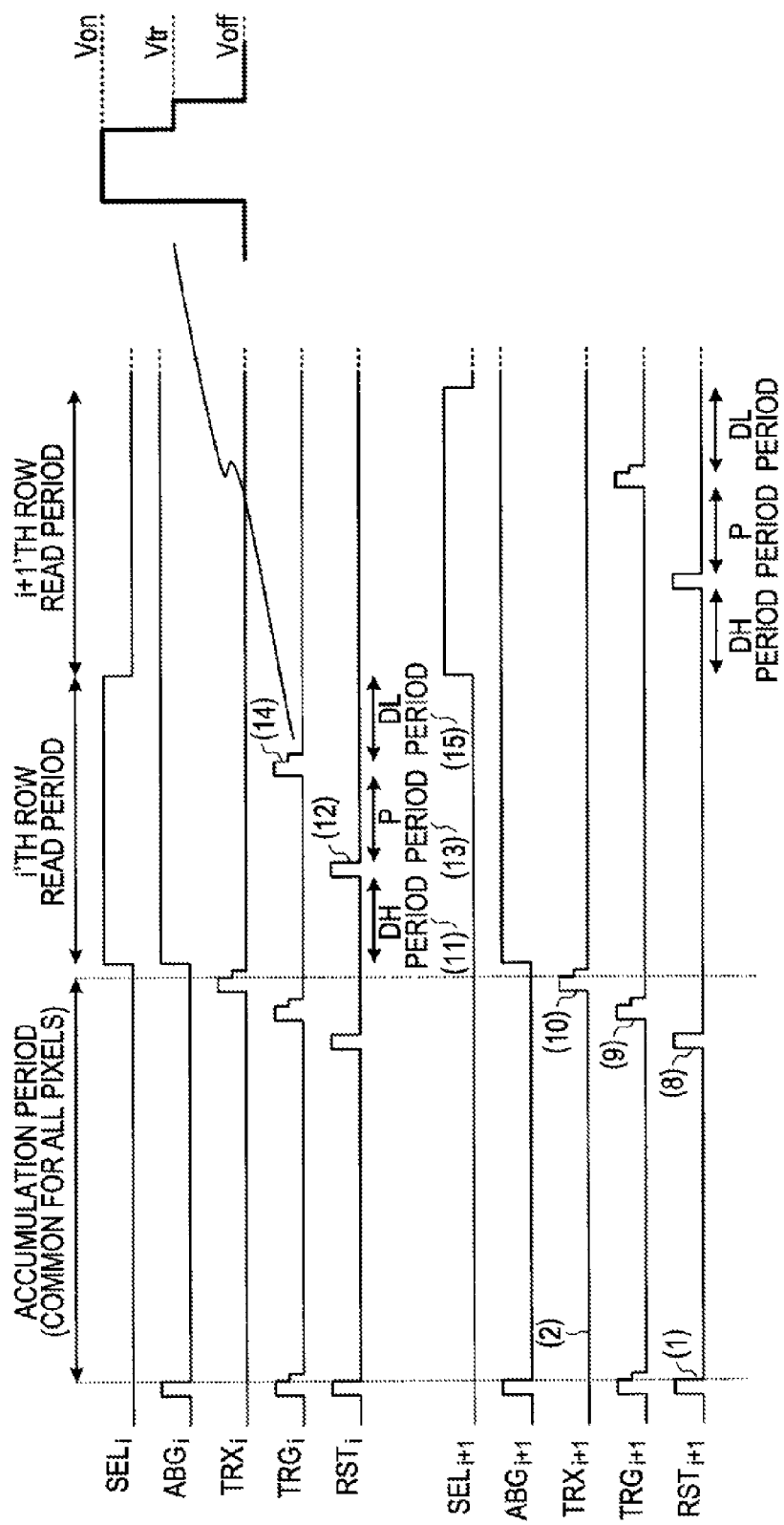
FIG. 25 is a timing chart illustrating an example of driving through a different voltage (e.g., 0V) in a transient manner, at the time of driving at negative potential (pinning voltage)

FIG. 25 is a timing chart illustrating an example of driving through a different voltage (e.g., 0V) in a transient manner at the time of driving at negative potential (pinning voltage), unlike that in FIG. 24.

In a case of setting a gate electrode, which is to be placed in a non-conducting state, to a voltage which realizes a pinning state (e.g., negative potential), in the process of driving from the voltage Von in the conducting state to the voltage Voff in the non-conducting state, a voltage Vtr between Von and Voff may be transiently passed through.

For example, in a case of setting the gate electrodes 22A and 24A of the first transfer gate 22 and second transfer gate 24 to a voltage wherein a pinning state is realized when in a non-conducting state, driving such as shown in FIG. 25 is performed. The transfer pulses TRX and TRG are temporarily driven at Vtr at the time of driving from the voltage Von in the conducting state to the voltage Voff in the non-conducting state, and then driven at Voff.

Voltage realizing a pinning state such as negative potential is generally generated by booster circuits or step-down circuits in many cases, and often has higher impedance as compared with normal power sources and grounds and accordingly tends to have inferior current supplying capabilities. Accordingly, driving from the voltage Von to the voltage Voff directly places a great load on the booster circuit or step-down circuit, and voltage convergence may lag.

To deal with this, the intermediate voltage Vtr is passed through to driving at the voltage Voff, thereby alleviating the load. The voltage Vtr can be effectively obtained if a voltage between the voltages Von and Voff, with the ground voltage (0 V) being used, for example.

Note that while the transfer pulses TRX and TRG have been exemplarily illustrated in FIG. 25, this may be applied to any signal where the non-conducting state is to be set to a pinning voltage.

Figure 26:
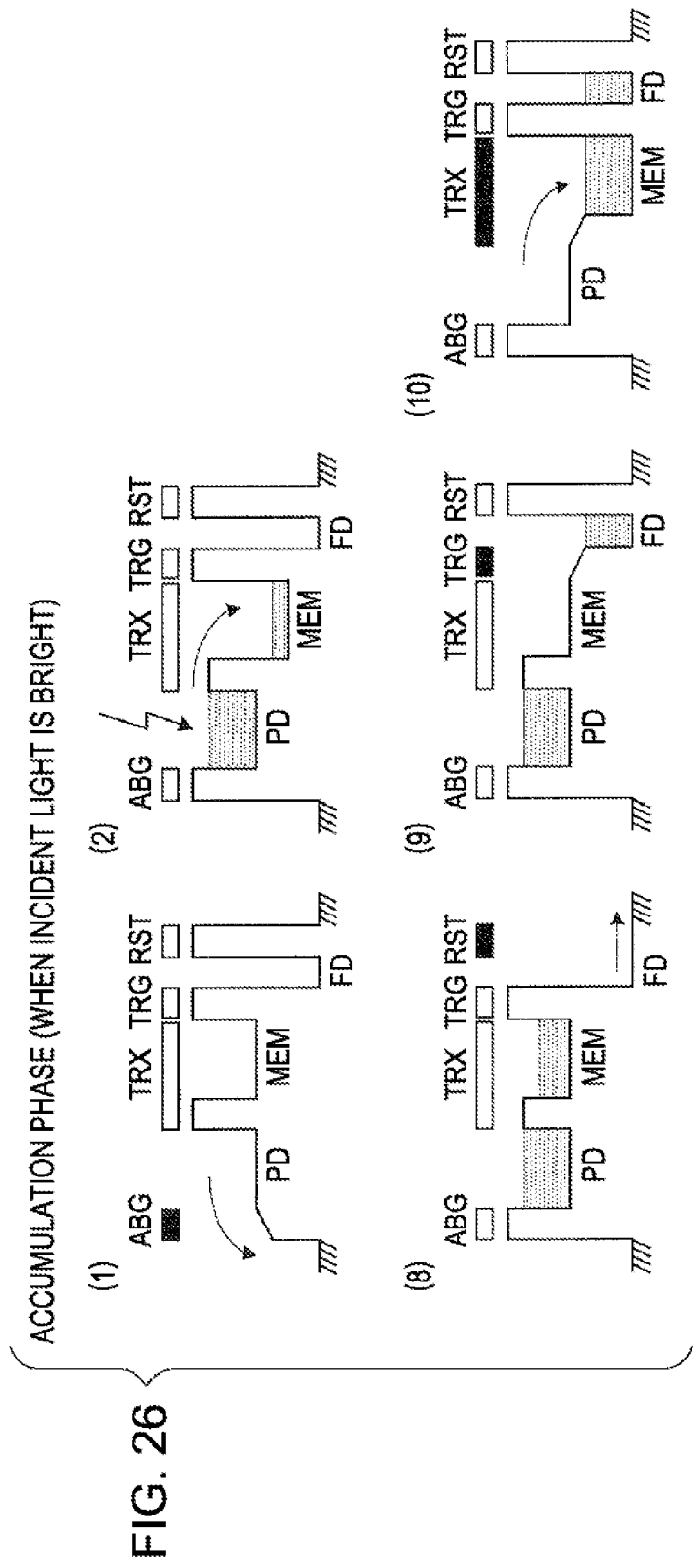
FIG. 26 is an operation explanatory diagram of exposure in a case of using the unit pixel according to the fourth structural example when the incident light is strong.
Figure 27:
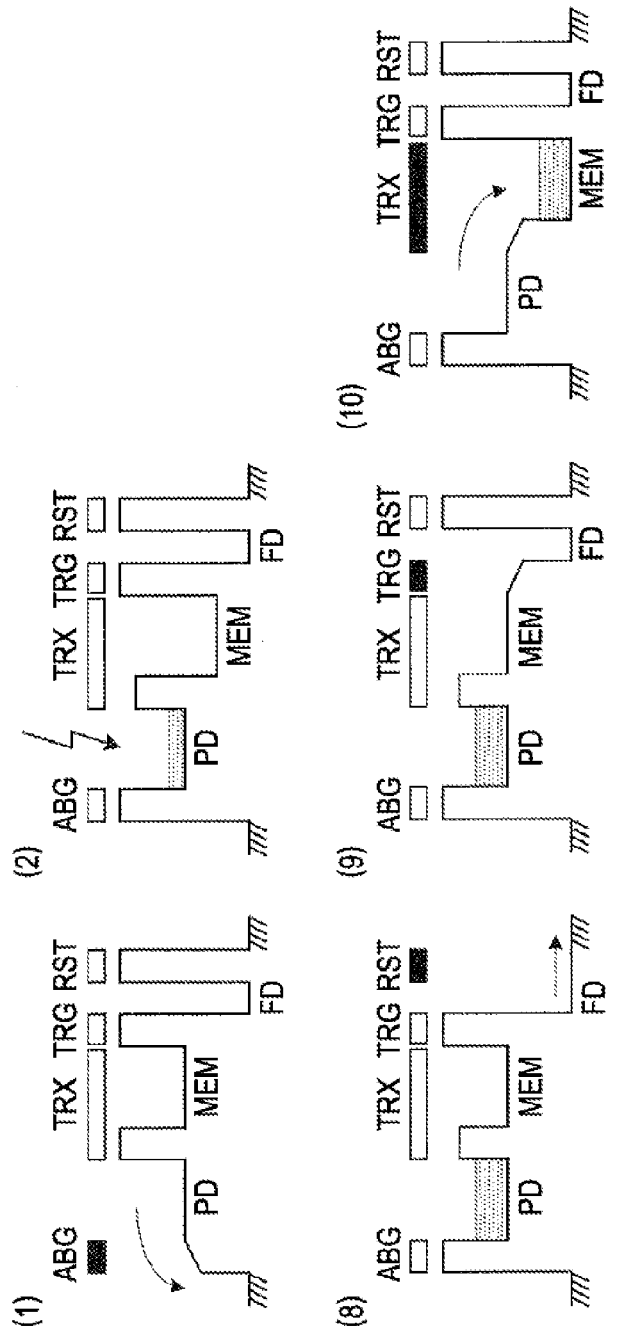
FIG. 27 is an operation explanatory diagram of exposure in a case of using the unit pixel according to the fourth structural example when the incident light is weak.

FIGS. 26 and 27 are operation explanatory diagrams of during exposure in the case of using the unit pixel 20D according to the fourth structural example, and correspond to FIGS. 14 and 15. FIG. 26 is an operation explanatory diagram of during exposure in the case that the incident light is strong, and FIG. 27 is an operation explanatory diagram of during exposure in the case that the incident light is weak. As can be clearly from FIGS. 26 and 27, in the case of using the unit pixel 20D according to the fourth structural example, the driving of the first transfer gate 22 with the intermediate voltage Vmid is done away with. Instead, in the event that the charge generated at the photodiode 21 exceeds the potential of the overflow path 30, this is transferred to the memory unit 23.

Figure 28A:
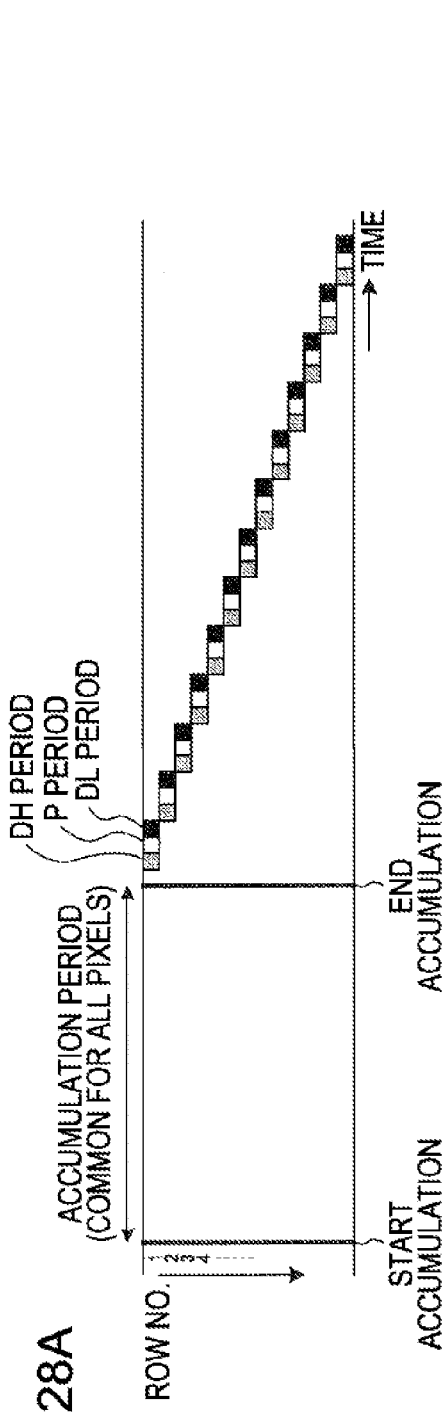
FIGS. 28A and 28B are diagrams illustrating other driving timings for global exposure in a case of using the unit pixel according to the fourth structural example.
Figure 28B:
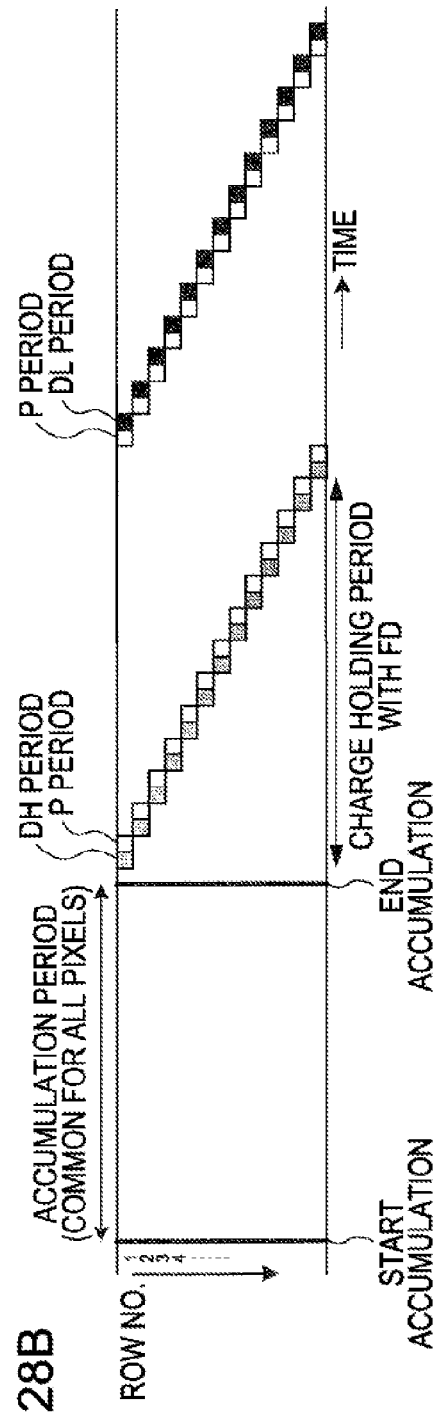

FIGS. 28A and 28B are diagrams illustrating other driving timing of global exposure in the case of using the unit pixel 20D according to the fourth structural example, and correspond to FIGS. 17B and 18. As can be clearly understood by comparing FIGS. 28A and 28B with FIGS. 17B and 18, in the case of using the unit pixel 20D according to the fourth structural example, the driving with the intermediate voltage Vmid in the accumulation period is done away with. The readout period of P-phase/D-phase is the same as in FIGS. 17B and 18.

Now, while description has been made here that, in the case of using the unit pixel 20D according to the fourth structural example, driving with the intermediate voltage Vmid is not applied and charge exceeding the potential of the overflow path 30 (predetermined charge amount) is transferred to the memory unit 23 as the signal charge 1, but is not restricted to this arrangement. That is to say, an arrangement may be made wherein driving with the intermediate voltage Vmid is used conjunctively, such that a charge which exceeds a predetermined charge amount determined with the intermediate voltage Vmid and the potential of the overflow path 30 is transferred to the memory unit 23 as the signal charge 1.

Charge Accumulation

Next, charge accumulation at the photodiode 21 and the memory unit 23 will be described, with comparison between a case of normal global exposure and a case of global exposure according to the present embodiment.

Normal Global Exposure

Figure 29A:
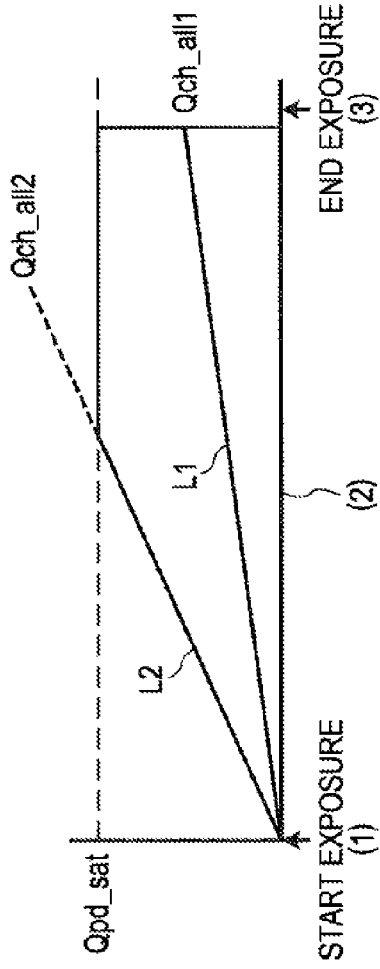
FIGS. 29A through 29C are diagrams illustrating charge accumulation in normal global exposure operations.
Figure 29B:
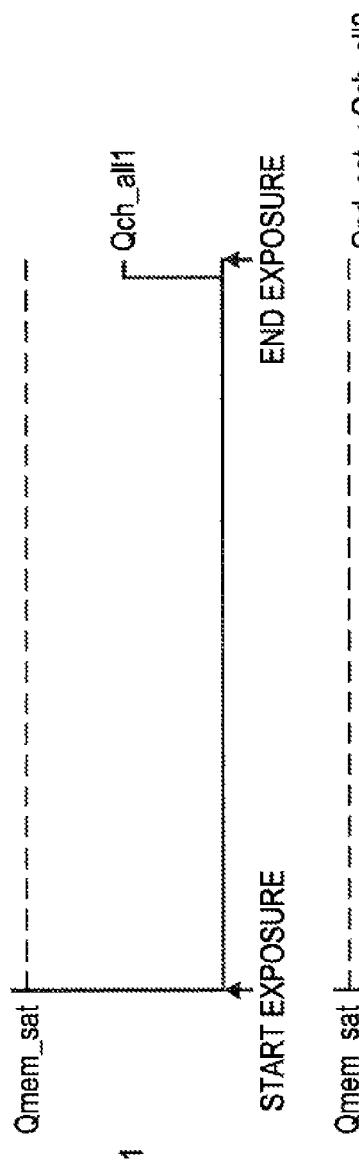
Figure 29C:
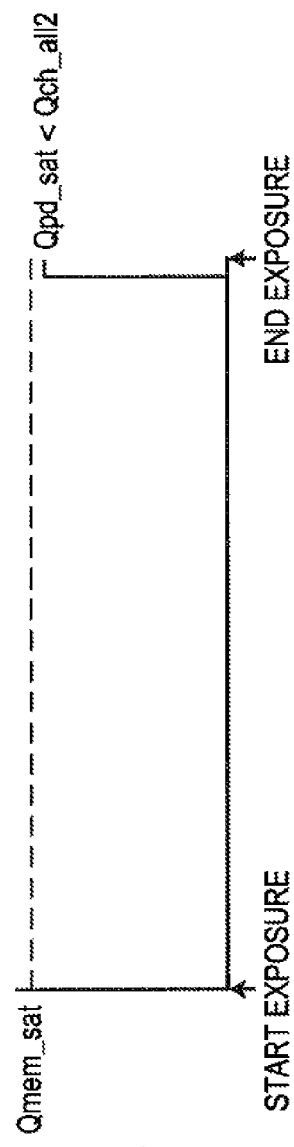

FIGS. 29A through 29C illustrate charge accumulation with normal global exposure. The horizontal axis represent the amount of time from starting of exposure to ending of exposure, and the vertical axis is the accumulated charge.

FIG. 29A illustrates charge accumulation at the photodiode 21. L1 represents a case wherein the incident light is weak, and a charge Qch_all1 is generated during the exposure period. L2 represents a case wherein the incident light is strong, and a charge Qch_all2 which exceeds the saturation charge amount Qpd_sat is generated at the photodiode 21 during the exposure period.

FIG. 29B illustrates the accumulated charge at the memory unit 23 for L1 which is the case that the incident light is weak. The accumulated charge Qpd of the photodiode 21 at the time of ending exposure is Qch_all1, so the total charge Qch_all1 is transferred by charge transfer by the first transfer gate 22. On the other hand, the accumulate charge at the photodiode 21 is Qch_all1=0.

FIG. 29C illustrates the accumulated charge at the memory unit 23 for L2 which is the case that the incident light is strong. The accumulated charge reaches the maximum charge amount (saturation charge amount) Qpd_sat of the photodiode 21 during exposure and saturates. Accordingly, the charge Qpd_sat is accumulated at the photodiode 21 at the time of ending exposure, so this charge Qpd_sat is transferred to the memory unit 23 by the first transfer gate 22. The generated charge Qch_all2 is unobtainable due to saturation.

As can be clearly understood from the description of charge accumulation with normal global exposure, with normal operations, the maximum charge amount which can be obtained by photoelectric conversion at the unit pixel 20 is Qpd_sat which is the saturation charge amount of the photodiode 21.

Global Exposure According to the Present Embodiment

FIGS. 30A through 30C illustrate charge accumulation with global exposure according to the present embodiment. The horizontal axis represent the amount of time from starting of exposure to ending of exposure, and the vertical axis is the accumulated charge.

FIG. 30A illustrates charge accumulation at the photodiode 21 for L1 which represents a case wherein the incident light is weak, and L2 which represents a case wherein the incident light is strong. FIGS. 30B and 30C illustrate the accumulated charge at the memory unit 23 for L1 and L2, respectively. Also, (1) through (10) correspond to the driving timing (1) through (10) shown in the timing chart in FIG. 13.

Upon the first transfer gate 22 being driven with the intermediate voltage Vmid at driving timings (3), (5), and (7), charge exceeding the charge Qmid corresponding to the intermediate voltage Vmid is transferred to the memory unit 23. In the event that the accumulated charge at the photodiode 21 does not exceed the charge Qmid, the charge remains in the photodiode 21.

With the example of L1, the incident light is weak and the accumulated charge is small, so the charge Qmid is not exceeded at the driving timings (3), (5), and (7), and there is no transfer by the first transfer gate 22. The total charge Qch_all1 is accumulated at the photodiode 21, transferred to the memory unit 23 at the time of end of exposure, and is as follows.

$$Qpd=Qch\_all1 \quad (1)$$

$$Qmem=0 \quad (2)$$

With the example of L2, the incident light is strong and the accumulated charge is great, so the charge Qmid is exceeded at the driving timings (3), (5), and (7). Here, an example is given where the charge Qmid is not exceeded at the driving timing (3) but at the driving timings (5) and (7).

If we say that Qch_all2 represents the total charge to be generated in accordance with the incident light during the exposure period, and charges generated in each of four exposure periods divided by the driving timings (3), (5), and (7) are represented by Qch1, Qch2, Qch3, and Qch4, $$Qch\_all2=Qch1+Qch2+Qch3+Qch4 \quad (3)$$

holds.

At the driving timing (3), the accumulated charge Qpd2_1 at the photodiode 21 is $$Qpd2\_1=Qch1 \quad (4)$$

and in the event of being lower than the charge Qmid, there is no charge transfer to the memory unit 23. In the event of exceeding the charge Qmid, the charge Qtx1 is zero. At this time, $$Qpd2\_1+Qtx1=Qch1 \quad (5)$$

holds.

At the driving timing (5), the accumulated charge Qpd2_2 at the photodiode 21 is $$Qpd2\_2=(Qpd2\_1-Qtx1)+Qch2 \quad (6)$$

and in the case of exceeding the charge Qmid, charge transfer to the memory unit 23 occurs. The charge Qtx2 to be transferred to the memory unit 23 is $$Qtx2=Qpd2\_2-Qmid \quad (7)$$

at this time.

At the driving timing (7), the accumulated charge Qpd2_3 at the photodiode 21 is $$Qpd2\_3=(Qpd2\_2-Qtx2)+Qch3 \quad (8)$$

and in the case of exceeding the charge Qmid, charge transfer to the memory unit 23 occurs. The charge Qtx3 to be transferred to the memory unit 23 is $$Qtx3=Qpd2\_3-Qmid \quad (9)$$

at this time.

Exposure further continues, and the accumulated charge Qpd2_4 at the photodiode 21 at the time of ending exposure is $$Qpd2\_4=(Qpd2\_3-Qtx3)+Qch4 \quad (10).$$

Also, the charge Qmem accumulated at the memory unit 23 by charge transfer under driving by the intermediate voltage Vmid is $$Qmem=Qtx1+Qtx2+Qtx3 \quad (11)$$

and is transferred to the floating diffusion region 25 immediately prior to ending of the exposure, and is held.

With the accumulated charge at the photodiode 21 at the time of ending exposure as Qpd, $$Qpd=Qpd2\_4 \quad (12)$$

holds. The accumulated charge at the photodiode 21 Qpd (Qpd2_4) is transferred to the memory unit 23 by the first transfer gate 22 and is held at the memory unit 23.

The charge Qmem held in the floating diffusion region 25 and the Qpd hold in the memory unit 23 due to the exposure ending and charge transfer being performed are each read out and subjected to adding processing at the downstream signal processing unit 18 (see FIG. 1), thereby obtaining a signal level corresponding to the total generated charge Qch_all2 Expression (11) and (12) yield $$Qpd+Qmem=Qpd2\_4+(Qtx1+Qtx2+Qtx3)$$

Expression (10) yields $$=Qpd2\_3+Qch4+Qtx1+Qtx2$$

Expression (8) yields $$=Qpd2\_2+Qch3+Qch4+Qtx1$$

Expression (6) yields $$=Qpd2\_1+Qch2+Qch3+Qch4$$

Expression (4) yields $$=Qch1+Qch2+Qch3+Qch4$$

and Expression (3) yields $$=Qch\_all2 \quad (13).$$

It can be understood from the above that the total generated charge Qch_all2 generated by photoelectric conversion at the unit pixel 20 can be held and read out by reading out and adding each of the charges Qmem and Qpd.

The charge amount of the total generated charge Qch_all2 is linearly proportionate to the intensity of the incident light, so it can be understood that image acquisition can be performed with linear response properties.

The adding processing at this time is performed at the signal processing unit 18 shown in FIG. 1. That is to say, the signal processing unit 18 performs adding processing of the signal levels Vmem and Vpd corresponding to the charges Qmem and Qpd read out divided in the DH period and DL period. At the time of this adding processing, the data storage unit 19 shown in FIG. 1 temporarily stores the signal level Vmem corresponding to the charge Qmem read out in the DH period.

Note that the adding processing at the signal processing unit 18 is not restricted to adding processing of the signal levels Vmem and Vpd following noise removal at the column processing unit 13. That is to say, in a case of a configuration wherein the signal levels Vmem and Vpd are not to be subjected to the noise removal processing, adding processing is performed on the signal levels Vmem and Vpd output from the unit pixel 20.

A point to take note of in Expression (14) is that there is no effect of the holding charge Qmid of the photodiode 21 at the time of driving with the intermediate voltage Vmid over the entire process up to obtaining the total generated charge Qch_all2 from the charge Qmem and charge Qpd. This means that Qch_all2 can be obtained from Qmem+Qpd even in the event that the holding charge of the photodiode 21 is Qmid+ΔQmid due to irregularities in transistor threshold values among the pixels.

Let us consider a case, for example, wherein the holding charge Qmid of the photodiode 21 is Qmid+ΔQmid in Expressions (9) and (10). Here, the charge Qtx3 in Expression (9) is $$Qtx3 = Qpd2\_3 - (Qmid + \Delta Qmid) \quad (14)$$

and the value transferred to the memory unit 23 is reduced by ΔQmid.

On the other hand, the accumulated charge Qpd2_4 in Expression (10) is $$Qpd2\_4 = (Qpd2\_3 - Qtx3) + Qch4 \quad (15)$$
$$= (Qmid + \Delta Qmid) + Qch4$$

so the accumulated charge at the photodiode 21 increases by ΔQmid.

The accumulated charge of the photodiode 21 and the accumulated charge of the memory unit 23 are added to obtain the total generated charge Qch_all2.

Accordingly, the increase/decrease in accumulated charge at the photodiode 21 is offset, meaning that irregularities in Qmid due to threshold value irregularities do not affect the total photo-generated charge Qch_all2. Also, no effect of irregularities in Qmid means that, in other words, the intermediate voltage Vmid supplied to the first transfer gate 22 multiple times may be of different voltages each time.

Figure 31A:
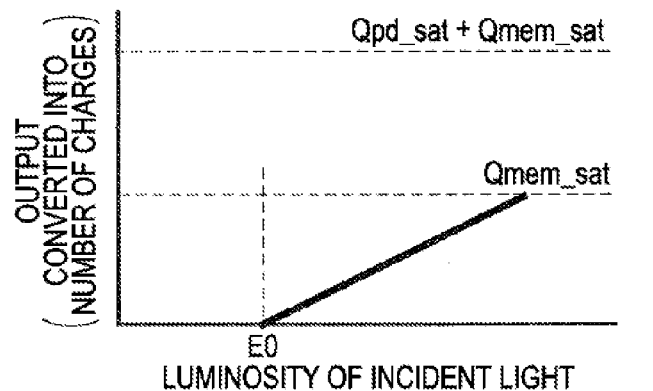
FIGS. 31A through 31D are diagrams illustrating input/output properties of a unit pixel.

FIGS. 31A through 31D illustrate input/output properties of the unit pixel 20. FIG. 31A illustrates the relation between the incident light luminosity and the output from readout of the accumulated charge Qmem at the DH period. Charge transfer from the photodiode 21 to the memory unit 23 due to driving with the intermediate voltage Vmid is not output until a certain luminosity level E0, since this charge transfer occurs due to the luminosity level E0 being exceeded and the accumulated charge in the photodiode 21 exceeding Qmid.

Figure 31B:
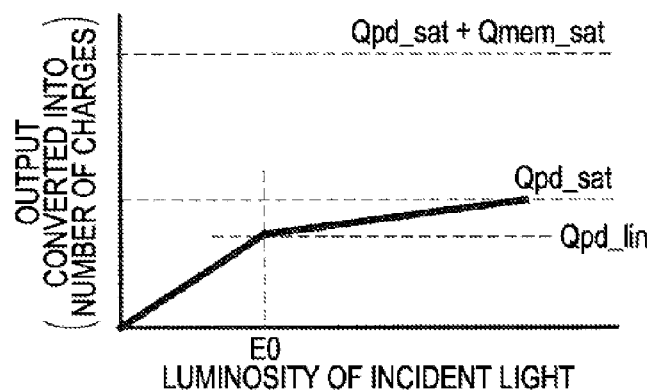

FIG. 31B illustrates the relation between incident light luminosity and the output from readout of the accumulated charge Qpd at the DH period. The luminosity level E0 is the luminosity level at which charge transfer due to transfer at the intermediate voltage Vmid begins to occur, and the generated photo-generated charge at the luminosity level E0 is Qpd_lin.

Figure 31C:
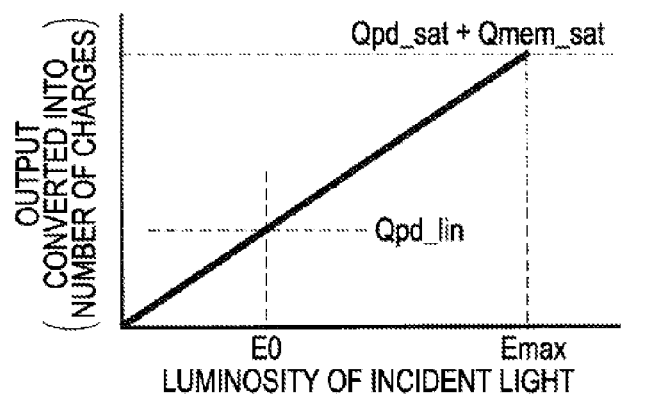

FIG. 31C illustrates the output of the added properties of FIGS. 31A and 31B, i.e., the input/output properties of Qpd+ Qmem. Charge can be accumulated and held up to the sum of the maximum charge amounts Qpd_sat and Qmem_sat of the photodiode 21 and memory unit 23. Imaging can be performed up to the incident luminosity Emax which is equivalent to Qpd_sat+Qmem_sat.

Figure 31D:
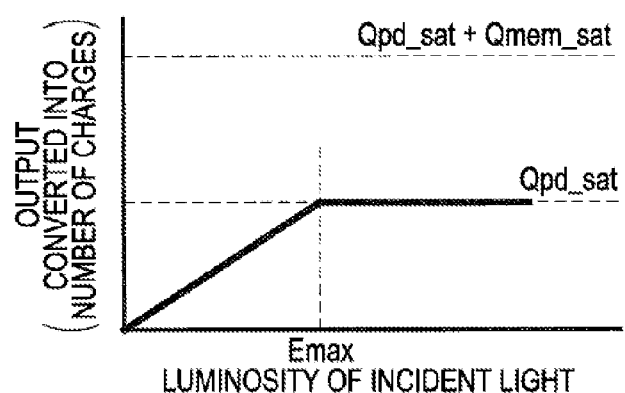

FIG. 31D illustrates input/output properties with normal global exposure not using driving with the intermediate voltage Vmid. The maximum charge amount Qpd_sat of the photodiode 21 is the maximum of accumulation and holding, so the dynamic range is low.

An arrangement is preferred wherein addition of the accumulated charge Qpd and the accumulated charge Qmem are not simplistically added, but rather where these are added only in the event that the accumulated charge Qpd exceeds the predetermined threshold value Qpd_th, and otherwise just the accumulated charge Qpd is output.

$$Q\text{out} = Qpd \, (Qpd \geq Qpd\_th)$$

$$Q\text{out} = Qpd + Qmem \, (Qpd < Qpd\_th)$$

Now, the threshold value Qpd_th is a value smaller than the generated photo-generated charge Qpd_lin at the incident light luminosity E0, which is shown in FIGS. 31B and 31C. That is to say, the threshold value Qpd_th use for performing adding processing is a value below the signal level Vpd serving as the output signal 2 which is equivalent to the minimum incident light luminosity E0 at which the signal level Vmem serving as the output signal 1 generates a significant output level.

In the event that the accumulated charge Qpd is smaller than the generated photo-generated charge Qpd_lin at incident light luminosity E0, the accumulated charge Qmem is signal output 0, so addition is unnecessary. This avoids needless noise component from being added when reading out, and accordingly a high S/N ratio can be obtained a low-illuminance regions.

Removal of Reset Noise

The accumulated charge Qpd and the accumulated charge Qmem are subjected to charge-to-voltage conversion into the signal level Vpd and signal level Vmem at the floating diffusion region 25, and are read out via the amplifying transistor 27. At this time, signal actually being read out is a level where the signal level Vpd and signal level Vmem have been added as offset to the reset level Vrst.

The signal level Vsig_dh read out in the DH period is the reset level Vrst1 and signal level Vmem at the time of discharging the charge of the photodiode 21 at the time of ending exposure.

$$Vsig\_dh = V\text{mem} + Vrst1$$

Here, the reset level Vrst1 includes a fixed component Vrst_fpn such as offset value, and a random component Vrst1_rn. The fixed component Vrst_fpn is threshold irregularities at the amplifying transistor 27 and load transistor (not shown) and so forth. The random component Vrst1_rn is kTC noise at the time of reset operation and so forth.

$$Vrst1 = Vrst\_fpn + Vrst1\_rn$$

In the P period, a reset operation of the floating diffusion region 25 is performed after the DH period, so the reset level Vrst becomes Vrst2, and this reset level Vrst2 is read out. This Vrst2 also includes a fixed component and a random component. The fixed component is Vrst_fpn, the same as with the reset level Vrst1, and the random component is Vrst2_rn.

$$Vrst2 = Vrst\_fpn + Vrst2\_rn$$

The signal level Vsig_dl read out at the DL period is $$Vsig\_dl = Vpd + Vrst2.$$

The reset level Vrst2 read out in the P period by the noise removal processing at the column processing unit 13 (see FIG. 1) for example is removed, so the DH period output Vout_dh and the DL period output Vout_dl are as follows.

$$Vout\_dh = Vout\_dh - Vrst2$$
$$= Vmen + (Vrst1\_rn - Vrst2\_rn)$$
$$Vout\_dl = Vsig\_dl - Vrst2$$
$$= Vpd$$

The charge Qpd accumulated in the photodiode 21 can be read out with the reset noise removed in a precise manner. The charge Qmem accumulated at the memory unit 23 has the fixed component of the reset noise removed, but the random component (kTC noise, etc.) remains.

However, in the event that the incident light luminosity is high and great charges are generated, random noise generally is dominated by optical shot noise, and the effects of reset noise and the like are extremely small. This is due to a physical phenomenon wherein random noise proportionate to the square root of the generated charge occurs. For example, if 10,000e– charges have been generated, 100e–rms of random noise will join as optical shot noise. On the other hand, random noise originating in circuits is often around several e-rms, and hardly affects the image quality at all.

On the other hand, in the event that the incident light luminosity is low and few charges are generated, the optical shot noise itself is small, so the effects of reset noise and the like are dominant, leading to deterioration in image quality.

With the present embodiment, in the event that the incident light luminosity is lower than a predetermined luminosity and few charges are generated, the charge is accumulated only in the photodiode 21, so removal of reset noise can be performed in a precise manner, and deterioration of image quality does not occur. Only in the event that the incident light luminosity is the predetermined luminosity or higher and great charges are generated, does accumulation of charge occur at the memory unit 23, which is read out as accumulated charge Qmem, so there is almost no deterioration of the image due to the above reason, and excellent imaging can be performed.

Advantages of the Present Embodiment

With the CMOS image sensor 10 according to the present embodiment described above, imaging with no distortion can be realized even in cases wherein the subject is moving and so forth, by arranging for all pixels to have the same exposure period (global exposure). In addition, a structure is employed wherein the unit pixel 20A has, in addition to the floating diffusion region 25, a memory unit 23 capable of accumulating and holding signal charges, whereby the following advantages can be obtained.

In the event that the incident light luminosity is low illuminance below a predetermined luminosity, there are few charges from photoelectric conversion, so the charge is stored only in the photodiode 21, and kTC noise can be removed in the noise removal processing performed on the signal level read out from the charge. Accordingly, a high S/N ratio can be ensured since noise reduction processing including kTC noise as well can be realized.

In the event that the incident light luminosity is high illuminance at or above the predetermined luminosity, the charge generated by photoelectric conversion is accumulated and held at both the photodiode 21 and memory unit 23, so the saturation charge can be raised. The charge held in the photodiode 21 and memory unit 23 is read out and signal levels Vpd and Vmem corresponding to the charge amounts thereof are added, whereby a wide dynamic range can be ensured.

While irregularities of the threshold value of the first transfer gate 22 which is one of the pixel transistors affects the luminosity level using accumulation at the memory unit 23, this does not affect the final input/output properties, as described above. Accordingly, noise due to irregularities in threshold values of pixel transistors among the pixels can be reduced, whereby the image quality of the taken image can be improved.

The sum of the two signal levels Vpd and Vmem, corresponding to the accumulated charges Qpd and Qmem of the photodiode 21 and memory unit 23 are equivalent to the accumulated charge Qpd and accumulated charge Qmem, and the sum Qpd+Qmem is a charge generated proportionate to the incident light intensity E. Accordingly, linear response input/output properties are exhibited, so there is no problem with signal processing such as with color images.

Incidentally, in the event that the input/output properties are not linear response, such as logarithmic response for example, this is unsuitable for signal processing such as with color images. For example, in the event that the RGB ratio of the illumination is 1:2:1, white balance is adjusted by acquiring the RGB ratio or all or part of the imaging face, and R and B are doubled. However, with logarithmic response, even of the RGB ratio of the illumination is constant, the RGB ratio charges depending on the luminosity, so acquisition of RGB ratio is difficult. Further, even if this can be acquired, nonlinear adjustment has to be employed. Different input/output properties for each pixel due to threshold irregularities makes the signal processing even more difficult.

Even Higher Dynamic Range

With the operation description so far, the maximum charge amount is enlarged to Qpd_sat+Qmem_sat, whereby all generated charges are acquired as signals, and a dynamic range is secured up to an incident light luminosity equivalent to Qpd_sat+Qmem_sat.

Described below is a driving example wherein a part of the generated charge is discarded, and signals obtained by two types of exposure times are output, to further expand the dynamic range. The basic principle of dynamic range widening described here are applications of a principle described in Japanese Patent Application Nos. 2006-280959 and 2006-124699, filed by the Present Assignee, to the structure of an embodiment of the present invention for realizing global exposure.

Figure 32:
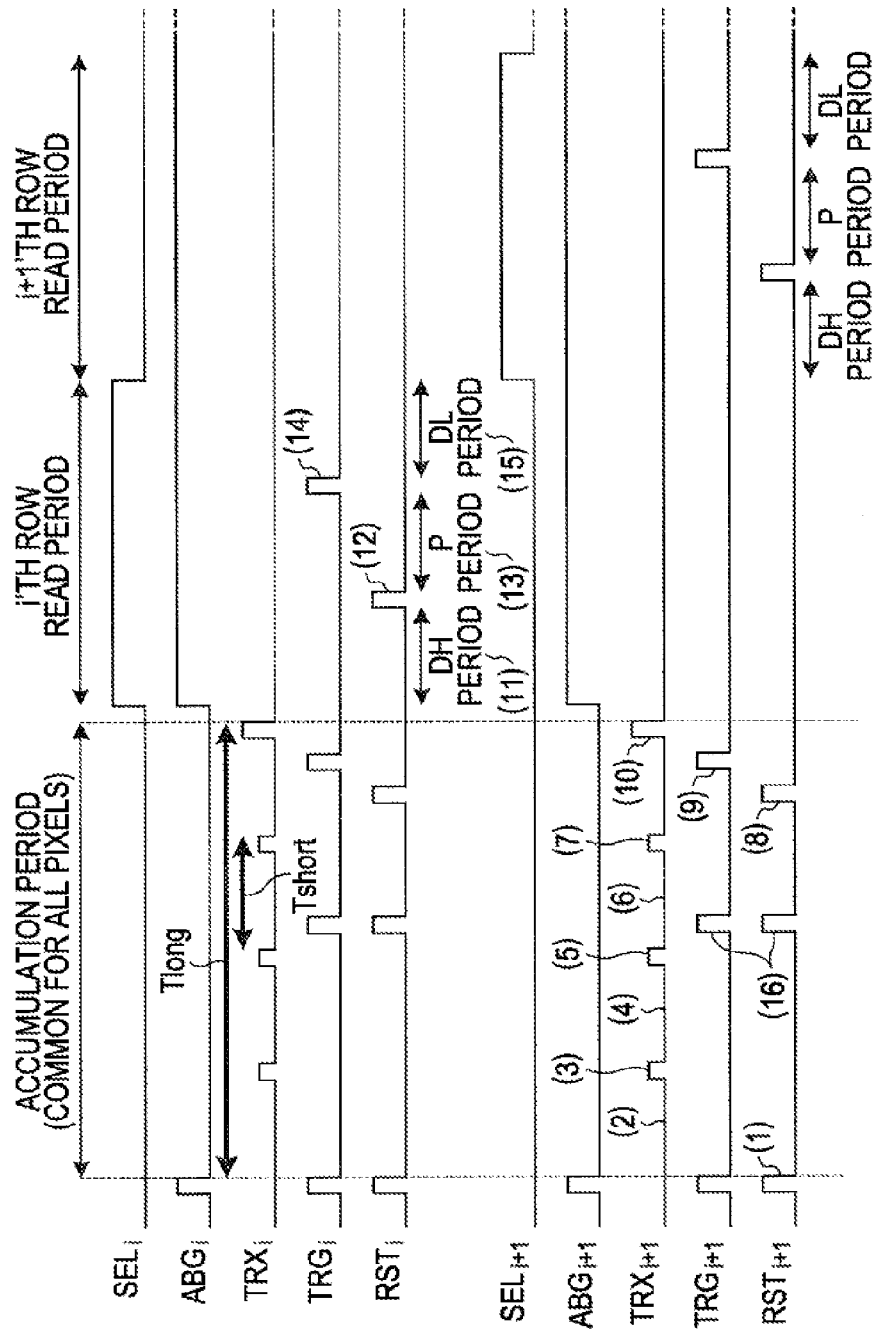
FIG. 32 is a timing chart illustrating a driving example with an expanded dynamic range.

FIG. 32 illustrates a driving example for dynamic range widening. The arrangement shown here is that shown in FIG. 13 according to an earlier-described diving example according to the present embodiment, but with discharge driving (16) of the memory unit 23 having been added.

With this driving example, driving with the intermediate voltage Vmid is performed to the first transfer gate 22 twice or more during the exposure period which is common for all pixels. The second transfer gate 24 is turned on at a period between the final intermediate voltage driving (first intermediate voltage driving) and the intermediate voltage driving preceding that intermediate voltage driving (second intermediate voltage driving). The reset transistor 26 may or may not be go on at the same time. Also, each intermediate voltage Vmid in the intermediate voltage driving performed two times or more is preferably of the same voltage value.

Figure 33:
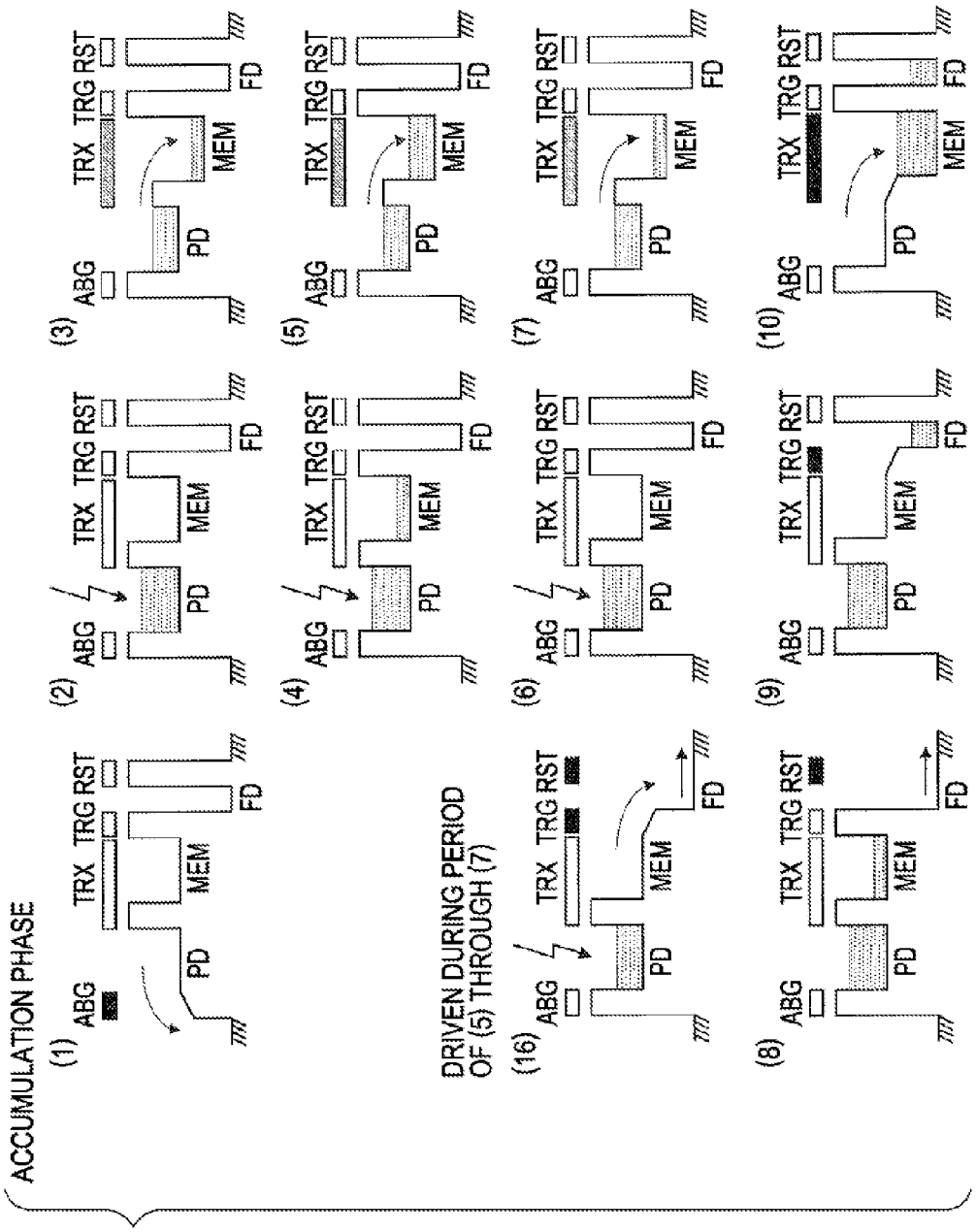
FIG. 33 is an operation explanatory diagram of operations for an expanded dynamic range.

FIG. 33 illustrates the operations of dynamic range widening. Adding the discharge driving (16) of the memory unit 23 discharges the charge accumulated in the memory unit 23 so far, and accordingly only the charge transferred at the final intermediate voltage driving (first intermediate voltage driving) becomes the accumulated charge Qmem. This accumulated charge Qmem is such that in the event that the intermediate voltages driving the first transfer gate 22 are equal, the charge amounts remaining at the photodiode 21 at the first intermediate voltage driving (7) and the previous second intermediate voltage driving (5) are each equal at Qmid. Even in the event that the value of Qmid may differ due to threshold irregularities among pixels, the residual charge amount of the driving (5) and driving (7) will still be equal at Qmid.

The charge accumulated at the photodiode 21 immediately prior to the first intermediate voltage driving (7) is a value which can be obtained by adding the charge Qshort accumulated from the second intermediate voltage driving (5) to the first intermediate voltage driving (7), which is a second exposure period, being added to the residual charge Qmid of the second intermediate voltage driving (5). That is to say, the charge Qmid remains in the photodiode 21 due to the first intermediate voltage driving (7), so the accumulated charge Qmem is $$Qmem = (Qmid + Qshort) - Qmid.$$

With the total charge generated in the total exposure period Tlong, which is a first exposure period, as Qlong, the charge Qshort is $$Qshort = (Tshort/Tlong) \times Qlong.$$

That is to say, a value which is small by the exposure ratio which is the ratio between the intermediate voltage driving period Tshort and the total exposure period Tlong is output as the charge Qshort.

Accordingly, the charge Qshort can acquire signals even for incident light luminosity exceeding the maximum charge amount Qmem_sat, so dynamic range widening of a multiple of the exposure ratio can be realized. That is to say, imaging can be performed for up to an incident light luminosity equivalent to (Tlong/Tshort)×Qmem_sat.

Figure 34A:
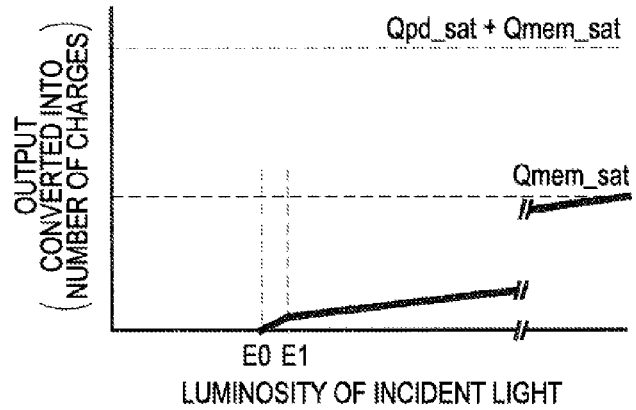
FIGS. 34A through 34C are diagrams illustrating input/output properties when operating with an expanded dynamic range.
Figure 34B:
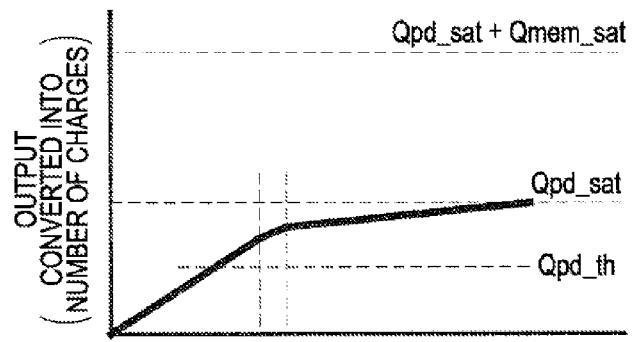
Figure 34C:
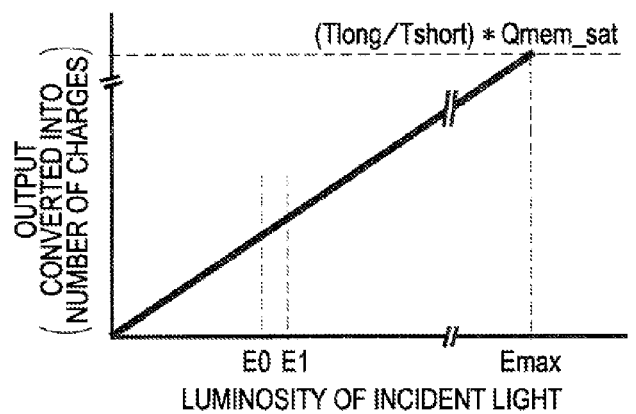

FIGS. 34A through 34C illustrate input/output properties for the dynamic range widening operation. In FIGS. 34A through 34C, E0 is a luminosity level where transfer at the first intermediate voltage driving starts, i.e., the luminosity where the total generated charge up to the first intermediate voltage driving is Qmid. E1 is a luminosity level where transfer at the second intermediate voltage driving starts, i.e., the luminosity where the total generated charge up to the second intermediate voltage driving is Qmid.

At a luminosity level of E0 or lower, the generated charge is all accumulated at the photodiode 21, and output as accumulated charge Qpd. At this time, Qmem=0.

$$Qout = Qpd \ (E < E0)$$
$$= Qlong$$

At luminosity levels from E0 to E1, there is no transfer at the second intermediate voltage driving, and at the first intermediate voltage driving the accumulation in the second exposure period Tshort is added and the portion which has exceeded Qmid is transferred to become Qmem. In this case, at the point of the discharging operation (16) of the memory unit 23, Qmem=0, so the entirety of the generated charge is accumulated as charge Qpd and Qmem, and the total generated charge can be obtained as output Qout from Qpd+Qmem.

$$Qout = Qpd + Qmem \ (E0 \le E < E1)$$
$$= Qlong$$

At a luminosity level exceeding E1, transfer occurs in the second intermediate voltage driving, and the charge transferred thereto is discarded in the discharging driving (16). Accordingly, the total generated charge is not obtained with Qpd+Qmem. However, as described above, due to transfer occurring in the second intermediate voltage driving, the residual charge in the photodiode 21 is Qmid. Further, due to the residual charge being Qmid the same as with the first intermediate voltage driving, the charge Qshort accumulated in the second exposure period Tshort is transferred to and held in the memory unit 23.

In this case, the gain of the exposure ratio Tlong/Tshort is multiplied for the output Qout, a signal equivalent to the total charge Qlong can be obtained.

That is, $$Qout = (Tlong/Tshort) \times Qmem \ (E \ge E1)$$
$$= (Tlong/Tshort) \times Qshort$$
$$= Qlong$$

which is to say $$Qout = Qpd \ (E < E0) \quad (16)$$
$$= Qpd + Qmem \ (E0 \le E < E1)$$
$$= (Tlong/Tshort) \times Qmem$$

whereby the linear properties such as shown in FIG. 34C can be obtained. The dynamic range at this time can be expanded to an incident light luminosity Emax which is equivalent to (Tlong/Tshort)×Qmem_sat.

Also, the same advantages can be obtained by actually executing the above processing as follows.

$$Qout = Qpd \ (Qpd < Qpd\_th)$$
$$Qout = MAX(Qpd + Qmem(Tlong/Tshort) \times Qmem) \ (Qpd \ge Qpd\_th)$$

Now, Qpd_th is an accumulated charge amount equivalent to an incident light luminosity smaller than E0. In E<E0, Qmem=0 holds, and may be added, but noise included in the charge Qmem might be added to the output in regions where signals are particularly small, and to this end the Qpd_th has been provided.

MAX (A, B) is a function where the greater of A and B is selected. In E0≤E<E1, the obtained charge Qmem is smaller than the charge Qshort accumulated in the second exposure period, so Qpd+Qmem is selected. Also, in E≥E1, the charge is discharged by the second transfer driving, so Qpd+Qmem is smaller than Qlong. Accordingly, (Tlong/Tshort)×Qmem is selected, and is equivalent to Expression (16).

The above calculation expression does not have to have points E0 and E1 set which strictly switch over at each pixels, to set a threshold value Qpd_th equivalent to a luminosity level sufficiently smaller than E0 is sufficient, and accordingly practical processing can be executed.

Modification

Figure 35:
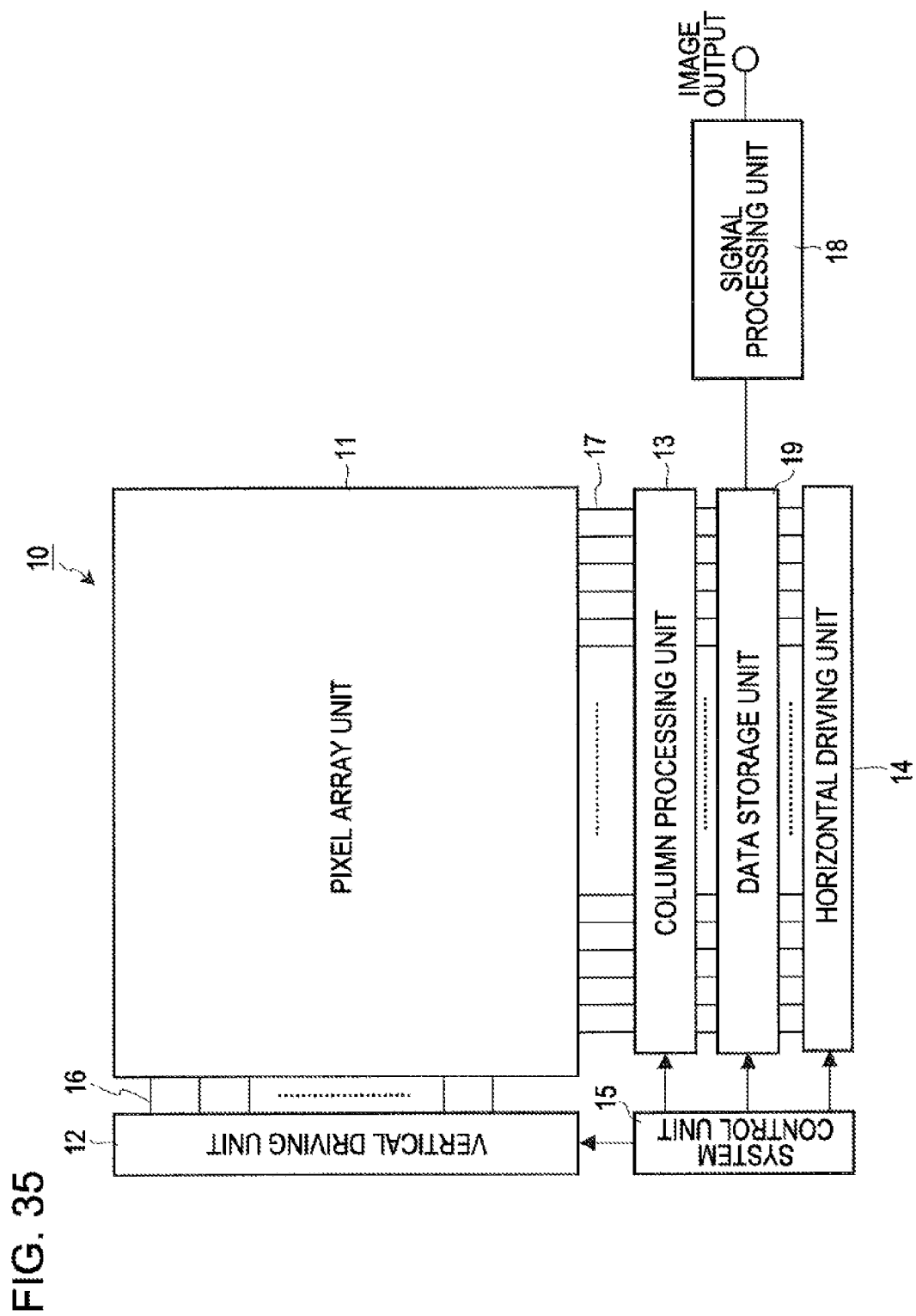
FIG. 35 is a system configuration diagram schematically illustrating the configuration of a CMOS image sensor according to a modification of the embodiment.

While a configuration has been described in the above embodiment wherein the data storage unit 19 is provided downstream from the column processing unit 13 parallel to the signal processing unit 18, the embodiment is not restricted to this arrangement. For example, an arrangement may be made such as shown in FIG. 35, wherein the data storage unit 19 is provided in parallel with the column processing unit 13, and the data Ddh of the DH period and the data Ddl of the DL period are read out at the same time by horizontal scanning by the horizontal driving unit 14, with signal processing being performed at the downstream signal processing unit 18.

Figure 36:
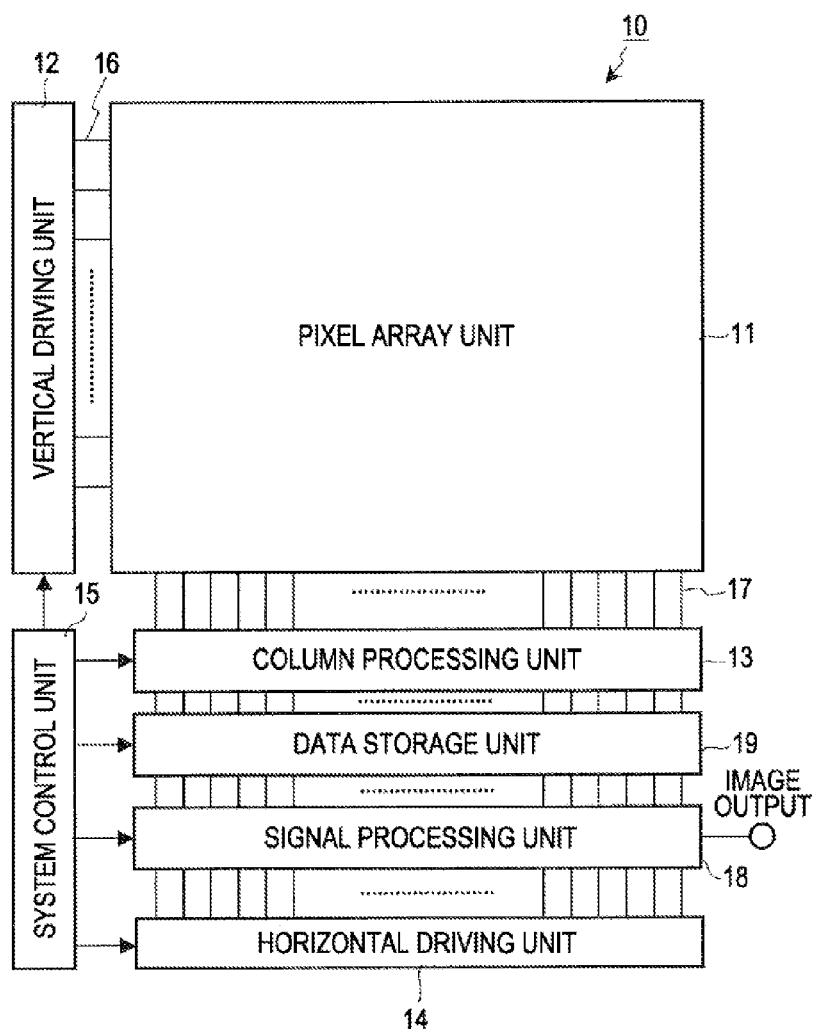
FIG. 36 is a system configuration diagram schematically illustrating the configuration of a CMOS image sensor according to another modification of the embodiment.

Further, an arrangement may be made such as shown in FIG. 36, wherein the column processing unit 13 is provided with an AD conversion function for AD conversion for each column or increments of multiple columns of the pixel array unit 11, and also the data storage unit 19 and signal processing unit 18 are provided in parallel as to the column processing unit 13, so that following analog or digital noise removal processing at the signal processing unit 18, the processing of the data storage unit 19 and signal processing unit 18 is performed for each column or increments of multiple columns.

Also, while an example has been given in the above embodiment wherein application is made to a CMOS image sensor in which unit pixels, which detect signal charges corresponding to the luminous quantity of visible light as physical amounts, arrayed in a matrix form, but the present invention is not restricted to application to a CMOS image sensor, and is applicable to column type solid state imaging devices in general which a column processing unit is provided for each pixel column of the pixel array unit.

Also, the present invention is applicable to not only solid state imaging devices which detect distribution of incident light quality of visible light and perform imaging thereof as an image, but also to solid state imaging devices which detect distribution of the input quantity of infrared rays, X-rays, particles, etc., and further, to solid state imaging devices (physical quantity detecting devices) in general in a broad sense, such as fingerprint detecting sensors or the like which detect the distribution of pressure, capacitance, and other physical quantities, and perform imaging thereof as an image.

Note that the solid state imaging device may be configured as a single-chip device, or may be in a modular form wherein an imaging unit, signal processing unit, optical system, or the like, are packaged together to have imaging functions.

Further, note that the present invention is not restricted to application to solid state imaging devices, and is also applicable to electronic equipment in general using a solid state imaging device for an image acquisition unit (photoelectric converter), such as imaging apparatuses such as digital still cameras and video cameras and the like, portable terminal devices having imaging functions as with cellular phones, photocopiers using solid state imaging devices for the image pickup unit, and so forth. The present invention may further be applied to imaging apparatuses wherein the above modular state, i.e., a camera module, is provided to electronic equipment.

Application Example

Figure 37:
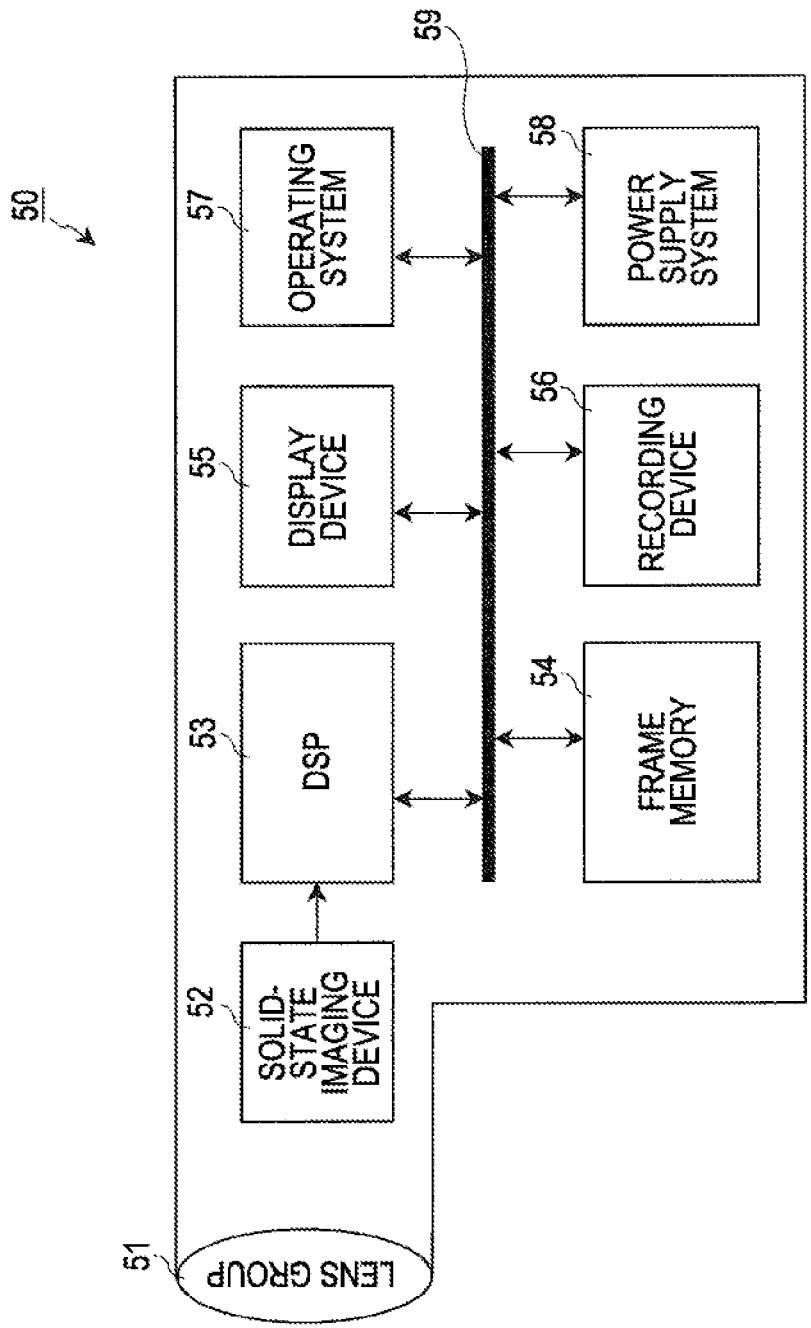
FIG. 37 is a block diagram illustrating an example of the configuration of an imaging apparatus according to an embodiment of the present invention.
Figure 38:
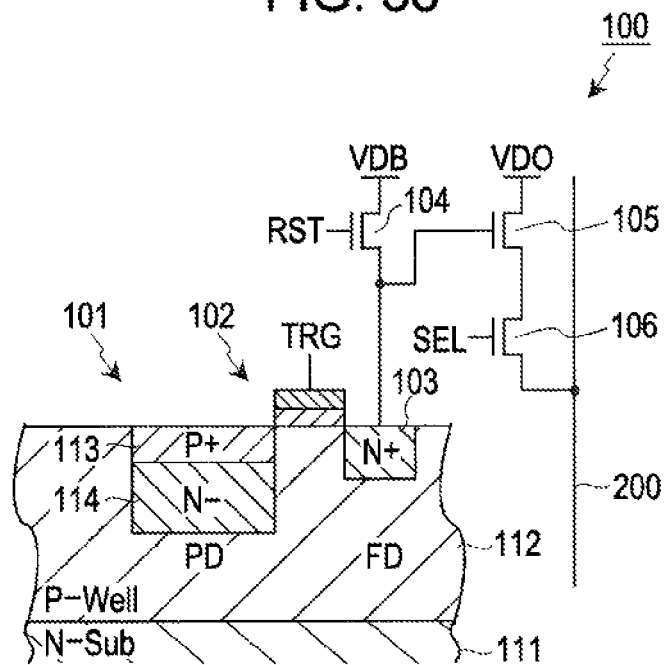
FIG. 38 is a diagram illustrating a structural example of a unit pixel according to the related art.
Figure 41:
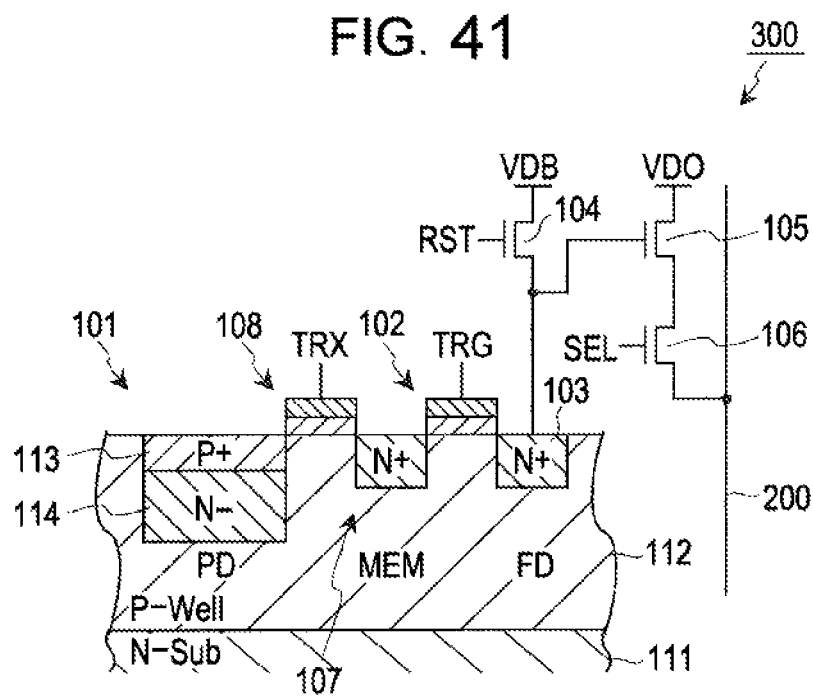
FIG. 41 is a diagram illustrating the configuration of a unit pixel according to the related art having a memory unit.
Figure 39:
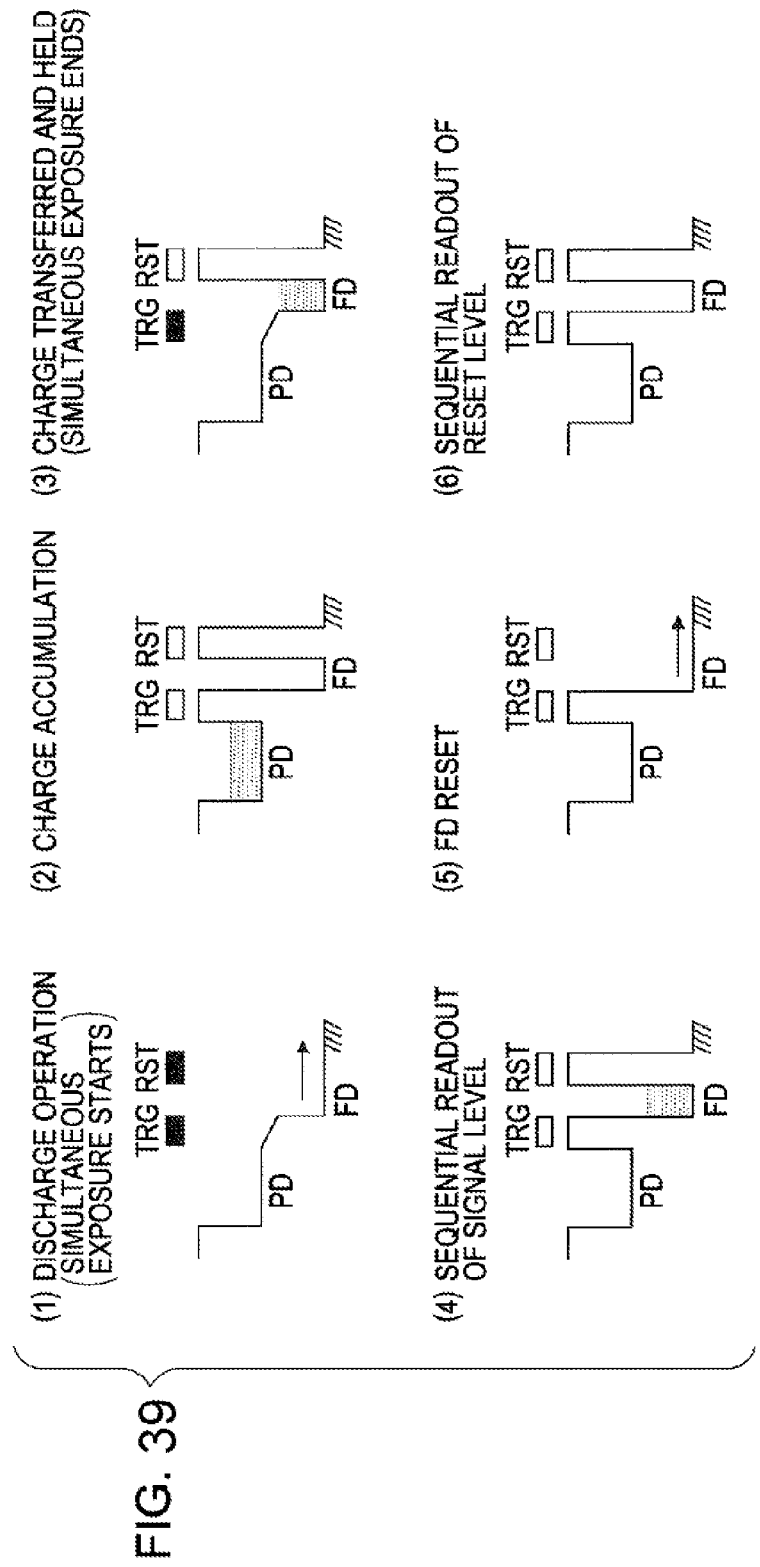
FIG. 39 is an operation explanatory diagram of global exposure with a unit pixel according to the related art.
Figure 40:
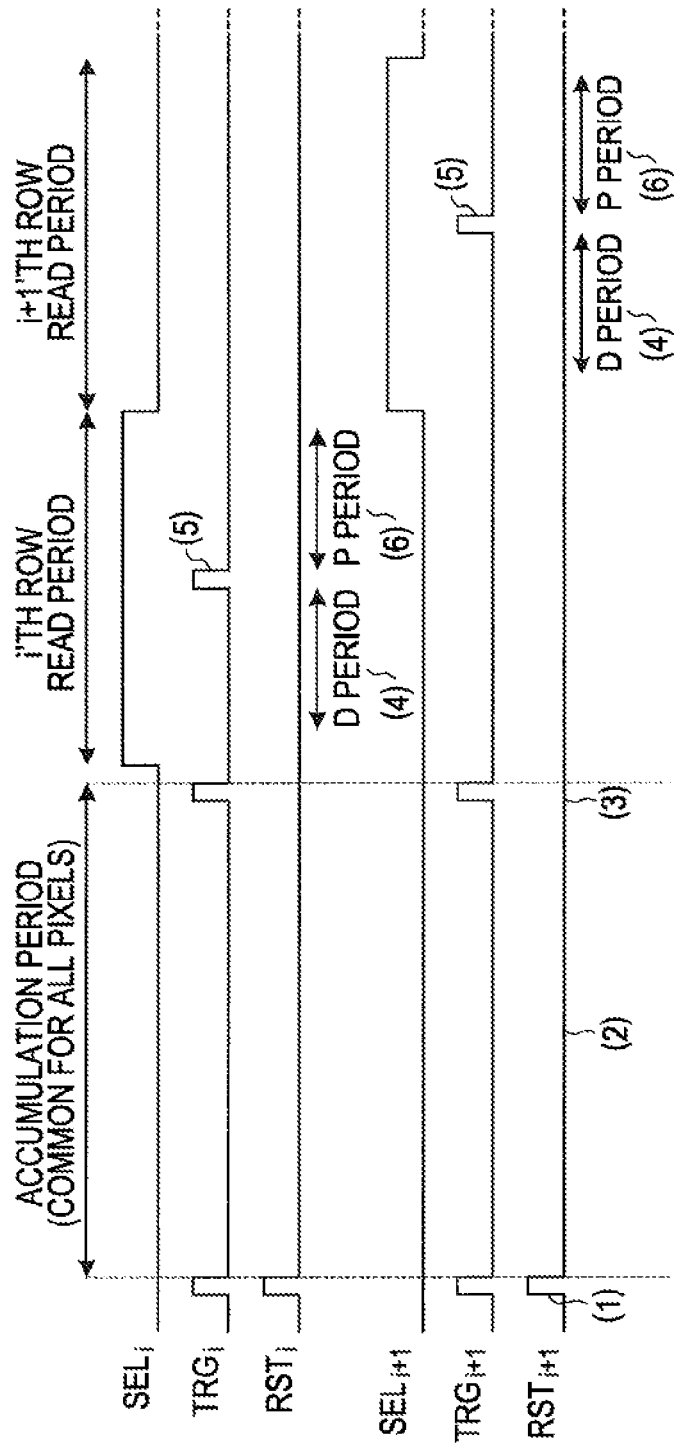
FIG. 40 is a timing chart at the time of performing global exposure with a unit pixel according to the related art.
Figure 42:
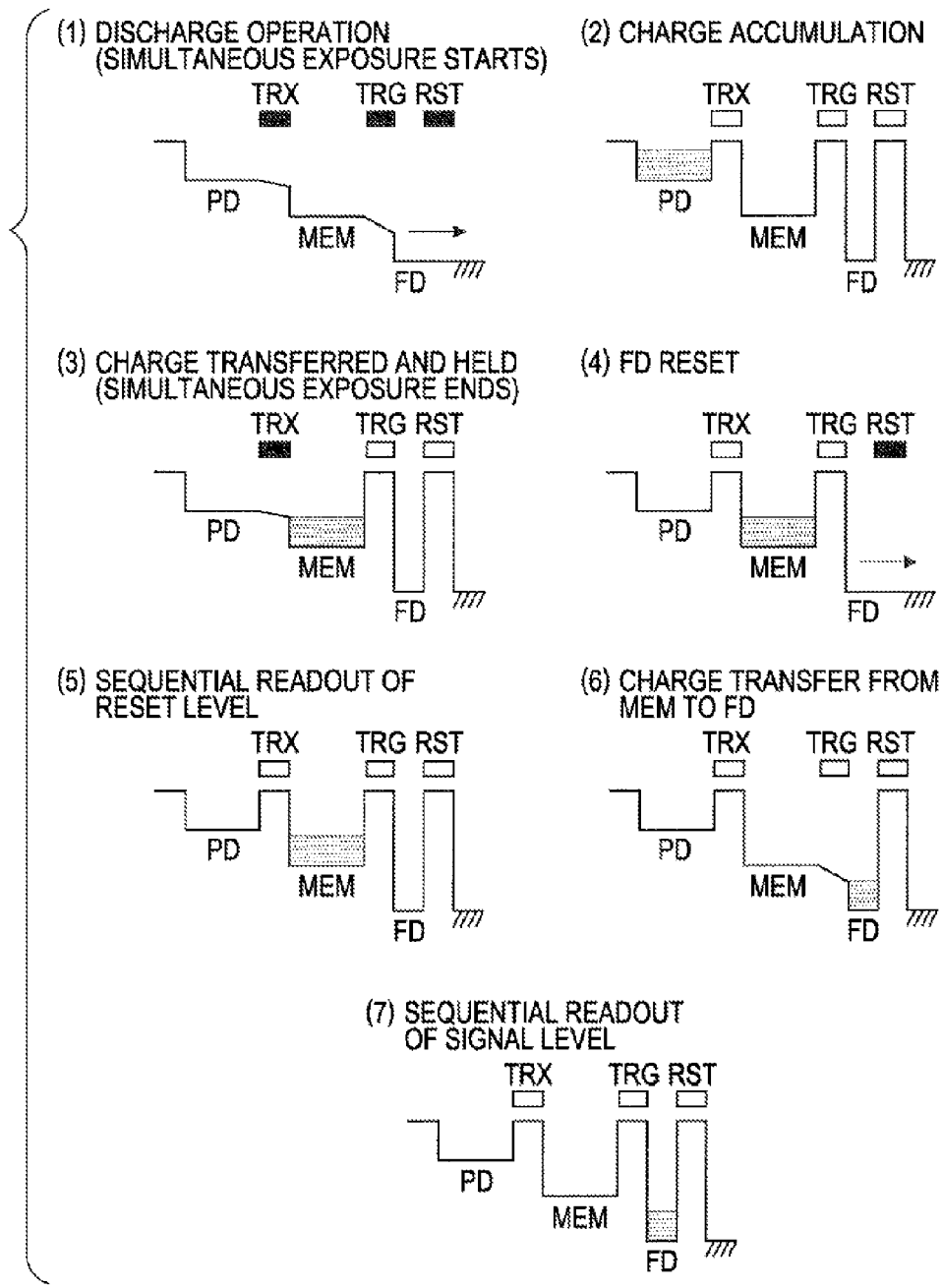
FIG. 42 is an operation explanatory diagram of global exposure with a unit pixel according to the related art having a memory unit.
Figure 43:
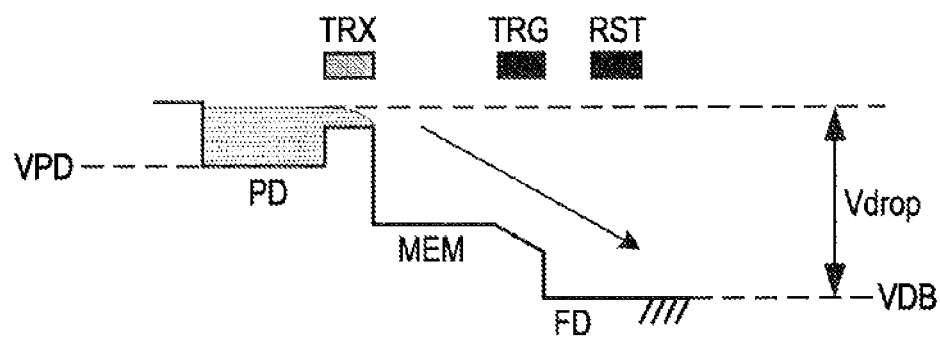
FIG. 43 is an operation explanatory diagram illustrating an operation state of logarithmic response operations.
Figure 44:
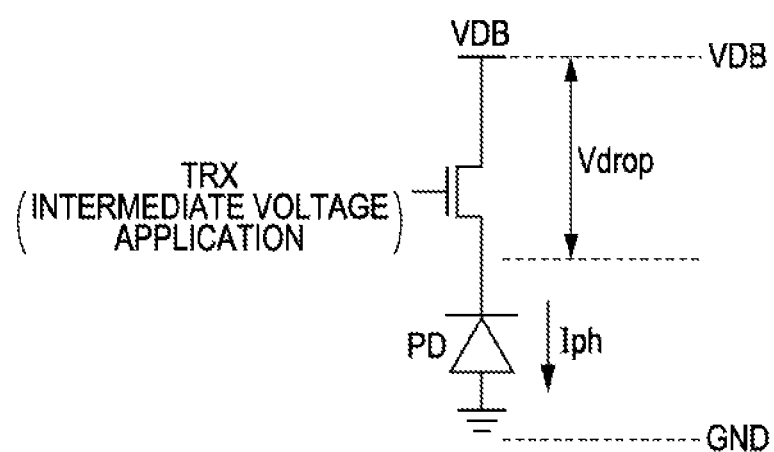
FIG. 44 is a circuit diagram illustrating an equivalent circuit for logarithmic response operations.
Figure 45:
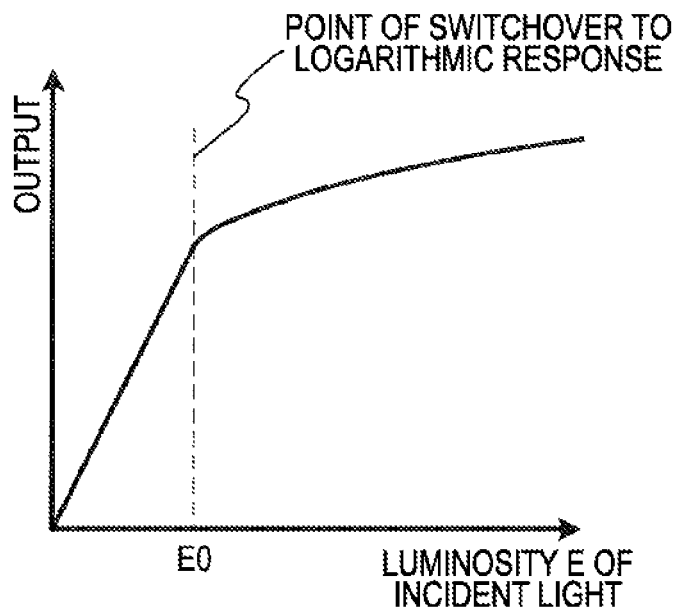
FIG. 45 is a diagram illustrating the relation between incident light luminosity E and pixel output.
Figure 46:
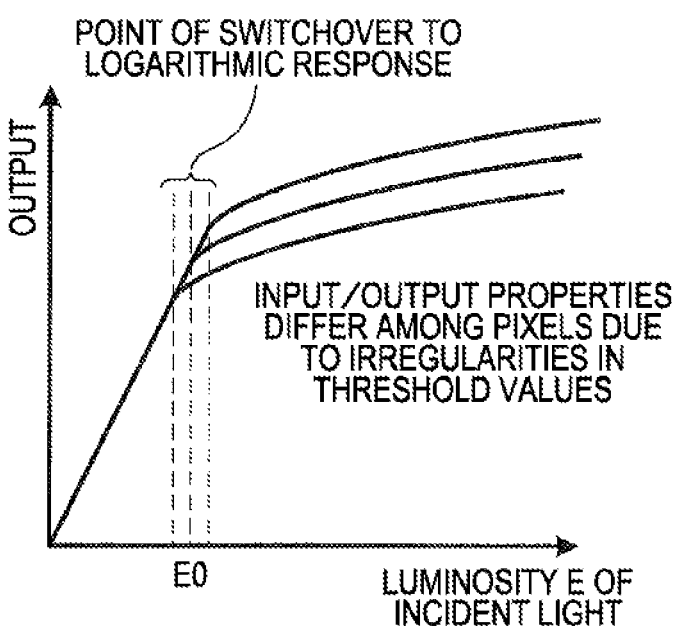
FIG. 46 is a diagram illustrating how input/output properties differ among pixels due to irregularities in the threshold values of transistors among pixels.

FIG. 37 is a block diagram illustrating an example of a configuration of electronic equipment according to an embodiment of the present invention, such as an imaging apparatus for example. As shown in FIG. 37, an imaging apparatus according to an embodiment of the present invention includes an optical system having a lens group 51 and the like, an imaging device 52, a DSP circuit 53 which is a camera signal processing circuit, frame memory 54, a display device 55, a recording device 56, an operating system 57, a power source system 58, and so forth, with the DSP circuit 53, frame memory 54, display device 55, recording device 56, operating system 57, and power supply system 58 being connected mutually by a bus line 59.

The lens group 51 inputs incident light (image light) from a subject and images this on the imaging face of the imaging device 52. The imaging device 52 converts the luminous quantity of the incident light aimed on the imaging face by the lens group 51 into electric signals in increments of pixels, and outputs as pixel signals. A solid state imaging device such as the CMOS image sensor 10 according to the above-described embodiment, i.e., a solid state imaging device which can realize imaging with no distortion by performing global exposure, can be used for the imaging device 52.

The display device 55 is configured of a panel type display device such as a liquid crystal display device, organic EL (electroluminescence) display device, or the like, and displays moving or still images imaged at the imaging device 52. The recording device 56 records the moving or still images imaged at the imaging device 52 on a recording medium such as a video tape, DVD (Digital Versatile Disc), or the like.

The operating system 57 gives operating commands regarding various functions which the imaging apparatus has, under operations performed by the user. The power supply system 58 supplies the DSP circuit 53, frame memory 54, display device 55, recording device 56, and operating system 57, with appropriate power for each, to serve as operating power supply thereof.

As described above, using the CMOS image sensor 10 in the above-described embodiment as the imaging device 52 in an imaging apparatus such as a video camera, digital still camera, camera module for mobile devices such as cellular phones and the like, and so forth, enables high image quality to be obtained for imaged images, since noise due to threshold irregularities of pixel transistors can be reduced and a high S/N ratio can be ensured with the CMOS image sensor 10.

It should be understood by those skilled in the art that various modifications, combinations, sub-combinations and alterations may occur depending on design requirements and other factors insofar as they are within the scope of the appended claims or the equivalents thereof.

What is claimed is:

1. A solid state imaging device comprising:
    (1) a unit pixel including
        (a) a photoelectric converter configured to generate electrical charge in accordance with incident light quantity and accumulate the charge therein,
        (b) a first transfer gate configured to transfer the charge accumulated in the photoelectric converter,
        (c) a charge holding region configured to hold the charge transferred from the photoelectric converter by the first transfer gate,
        (d) a second transfer gate configured to transfer the charge held in the charge holding region, and (e) a floating diffusion region configured to hold the charge, transferred from the charge holding region by the second transfer gate, for being read out as a signal; and (2) a pixel driving unit,
wherein,
(a) during an exposure period, the pixel driving unit is configured to drive the first transfer gate one or more times at an intermediate voltage, the intermediate voltage being between a voltage at which the first transfer gate is in an on state and a voltage at which the first transfer gate is in an off state, to cause a transfer of a charge that is generated at the photoelectric converter and that exceeds a predetermined charge amount to the charge holding region as a first signal charge, and
(b) the pixel driving unit is further configured to
    (i) drive the first transfer gate and the second transfer gate to cause a transfer of the first signal charge from the charge holding region to the floating diffusion region,
    (ii) drive the first transfer gate and the second transfer gate to cause a transfer of the charge accumulated in the photoelectric converter to the charge holding region as a second signal charge,
    (iii) cause a read out of the first signal charge from the floating diffusion region as a first output signal,
    (iv) then cause a reset of the floating diffusion region and a read out of a reset level of the floating diffusion region as a reset signal,
    (v) then drive the second transfer gate to cause a transfer of the second signal charge to the floating diffusion region, and
    (vi) subsequently cause a read out of the second signal charge from the floating diffusion region as a second output signal.

2. An electronic equipment comprising a solid state imaging device, the solid state imaging device including:
(1) a unit pixel including
    (a) a photoelectric converter configured to generate electrical charge in accordance with incident light quantity and accumulate the charge therein,
    (b) a first transfer gate configured to transfer the charge accumulated in the photoelectric converter,
    (c) a charge holding region configured to hold the charge transferred from the photoelectric converter by the first transfer gate,
    (d) a second transfer gate configured to transfer the charge held in the charge holding region, and
    (e) a floating diffusion region configured to hold the charge, transferred from the charge holding region by the second transfer gate, for being read out as a signal; and
(2) a pixel driving unit,
wherein,
(a) during an exposure period, the pixel driving unit is configured to drive the first transfer gate one or more times at an intermediate voltage, the intermediate voltage being between a voltage at which the first transfer gate is in an on state and a voltage at which the first transfer gate is in an off state, to cause a transfer of a charge that is generated at the photoelectric converter and that exceeds a predetermined charge amount to the charge holding region as a first signal charge, and
(b) the pixel driving unit is further configured to
    (i) drive the first transfer gate and the second transfer gate to cause a transfer of the first signal charge from the charge holding region to the floating diffusion region,
    (ii) drive the first transfer gate and the second transfer gate to cause a transfer of the charge accumulated in the photoelectric converter to the charge holding region as a second signal charge,
    (iii) cause a read out of the first signal charge from the floating diffusion region as a first output signal,
    (iv) then cause a reset of the floating diffusion region and a read out of a reset level of the floating diffusion region as a reset signal,
    (v) then drive the second transfer gate to cause a transfer of the second signal charge to the floating diffusion region, and
    (vi) subsequently cause a read out of the second signal charge from the floating diffusion region as a second output signal.

3. A solid state imaging device comprising:
(1) a unit pixel including
    (a) a photoelectric converter configured to generate electrical charge in accordance with incident light quantity and accumulate the charge therein,
    (b) a first transfer gate configured to transfer the charge accumulated in the photoelectric converter,
    (c) a charge holding region configured to hold the charge transferred from the photoelectric converter by the first transfer gate,
    (d) a second transfer gate configured to transfer the charge held in the charge holding region, and
    (e) a floating diffusion region configured to hold the charge, transferred from the charge holding region by the second transfer gate, for being read out as a signal;
(2) a pixel driving unit; and
(3) a processing unit,
wherein,
    the pixel driving unit is configured to (a) cause a readout, from the unit pixel, of a charge that is generated at the photoelectric converter during an exposure period and that exceeds a predetermined charge amount as a first output signal, and (b) cause a readout, from the unit pixel, of the charge accumulated in the photoelectric converter as a second output signal, and
    the processing unit is configured to (a) receive the first and second output signals read out from the unit pixel, and (ii) to add the first output signal and the second output signal to generate a total output signal.

4. The solid state imaging device of claim 3, wherein:
    the pixel driving unit is further configured to cause (a) a reset of the floating diffusion region after the readout of the first output signal and before the readout of the second output signal, and (b) a readout of a reset level of the floating diffusion region as a reset level, and
    the processing unit is further configured to perform noise removal processing using the reset level of the floating diffusion region.

5. The solid state imaging device of claim 4, wherein the noise removal processing includes a Correlated Double Sampling (CDS).

6. The solid state imaging device of claim 3, wherein the processing unit is a column processing unit.

* * * * *